(12) United States Patent
Osaka et al.

(10) Patent No.: US 7,836,567 B2
(45) Date of Patent: Nov. 23, 2010

(54) THIN FILM CAPACITOR, HIGH-DENSITY PACKAGING SUBSTRATE INCORPORATING THIN FILM CAPACITOR, AND METHOD FOR MANUFACTURING THIN-FILM CAPACITOR

(75) Inventors: Tetsuya Osaka, Tokyo (JP); Ichiro Koiwa, Tokyo (JP); Akira Hashimoto, Kanagawa (JP); Yoshimi Sato, Kanagawa (JP)

(73) Assignees: Waseda University, Tokyo (JP); Oki Semiconductor Co., Ltd., Tokyo (JP); Tokyo Ohka Kogyo Co., Ltd., Kanagawa (JP)

( * ) Notice: Subject to any disclaimer, the term of this patent is extended or adjusted under 35 U.S.C. 154(b) by 755 days.

(21) Appl. No.: 11/647,344

(22) Filed: Dec. 29, 2006

(65) Prior Publication Data

US 2007/0139859 A1 Jun. 21, 2007

Related U.S. Application Data

(62) Division of application No. 10/974,789, filed on Oct. 28, 2004, now Pat. No. 7,196,898.

(30) Foreign Application Priority Data

| Oct. 31, 2003 | (JP) | ............... 2003-373495 |
| Feb. 26, 2004 | (JP) | ............... 2004-052400 |

(51) Int. Cl.
H00G 7/00 (2006.01)
(52) U.S. Cl. .................. 29/25.42; 29/25.41; 29/842; 29/846; 29/852; 29/854
(58) Field of Classification Search ............... 29/25.41, 29/25.42, 842, 846, 852, 854
See application file for complete search history.

(56) References Cited

U.S. PATENT DOCUMENTS 5,907,470 A * 5/1999 Kita et al. ............... 361/311
5,973,908 A 10/1999 Saia et al.

(Continued)

FOREIGN PATENT DOCUMENTS

JP 8264721 10/1996

(Continued)

OTHER PUBLICATIONS

Zhilum Gui, et al., "Composite MLCCs with X7R Characteristics," *Proceedings of the 2000 12th IEEE International Symposium Applications of Ferroelectrics*, vol. II, pp. 821-824 (Jul. 21 to Aug. 2, 2000).

(Continued)

*Primary Examiner*—Derris H Banks
*Assistant Examiner*—Azm Parvez
(74) *Attorney, Agent, or Firm*—Wenderoth, Lind & Ponack, L.L.P.

(57) ABSTRACT

A capacitor capable of being incorporated into a packaging substrate, which capacitor includes a high-dielectric-constant layer, and an upper electrode layer and a lower electrode layer sandwiching the high-dielectric-constant layer from the upper side and the lower side. A packaging substrate containing the capacitor, and a method for producing the same are also provided.

11 Claims, 39 Drawing Sheets

U.S. PATENT DOCUMENTS

| | | | |
|---|---|---|---|
| 6,096,592 A | 8/2000 | Cho | |
| 6,339,527 B1 | 1/2002 | Farooq et al. | |
| 6,624,501 B2 * | 9/2003 | Shioga et al. | 257/534 |
| 6,747,334 B2 | 6/2004 | Kitagawa et al. | |
| 6,818,469 B2 | 11/2004 | Mori et al. | |
| 6,853,051 B2 | 2/2005 | Shioga et al. | |
| 7,227,736 B2 * | 6/2007 | Shioga et al. | 361/306.1 |
| 2003/0136997 A1 | 7/2003 | Shioga et al. | |

FOREIGN PATENT DOCUMENTS

| | | |
|---|---|---|
| JP | 9102590 | 4/1997 |
| JP | 10-079471 | 3/1998 |
| JP | 11-163273 | 6/1999 |
| JP | 11-214434 | 8/1999 |
| JP | 11-346061 | 12/1999 |
| JP | 11-354729 | 12/1999 |
| JP | 2000-306767 | 11/2000 |
| JP | 2002-222925 | 8/2002 |
| KR | 1999-0083104 | 11/1999 |
| KR | 2002-0024414 | 3/2002 |

OTHER PUBLICATIONS

Japanese Office Action (Decision to Grant a Patent) dated May 18, 2010 issued in corresponding Japanese Application No. 2004-052400 (including partial English translation).

* cited by examiner

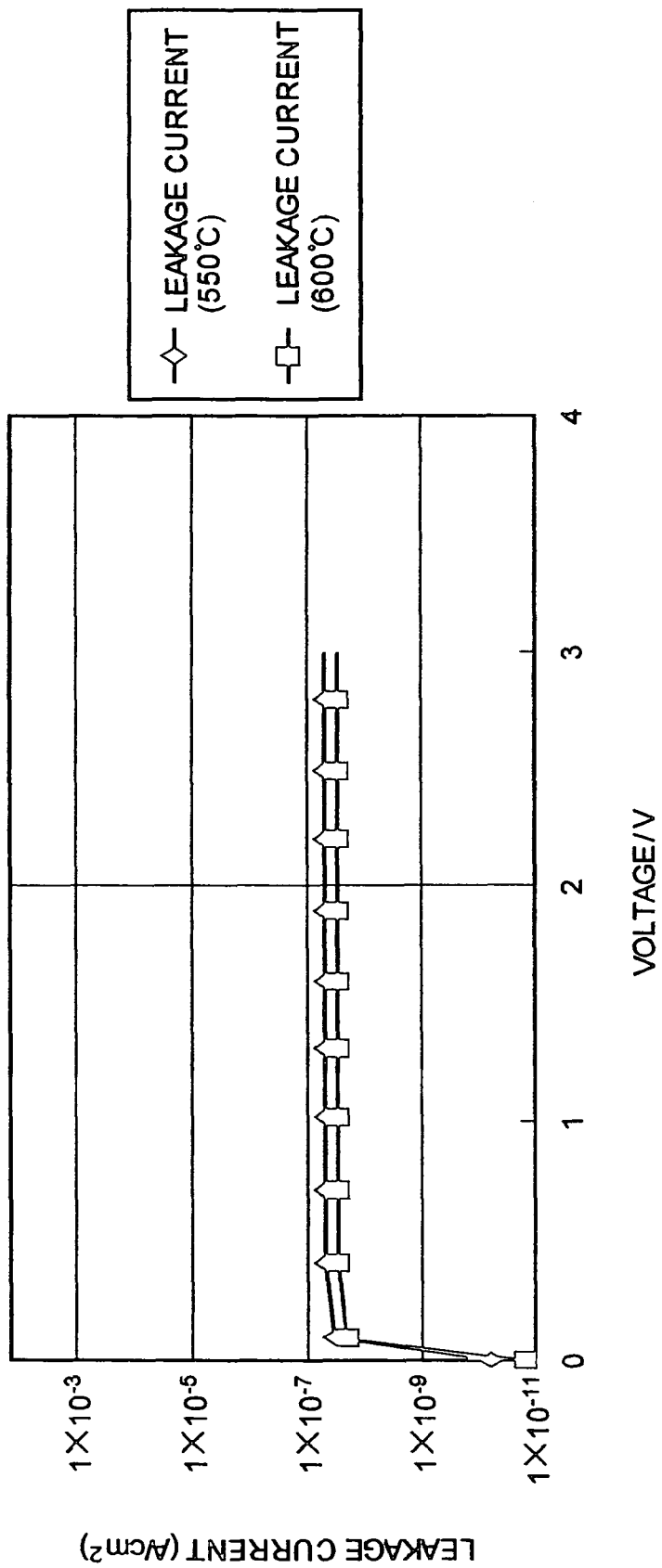

THIN FILM CAPACITOR, HIGH-DENSITY PACKAGING SUBSTRATE INCORPORATING THIN FILM CAPACITOR, AND METHOD FOR MANUFACTURING THIN-FILM CAPACITOR

This is a divisional application of Ser. No. 10/974,789 filed Oct. 28, 2004 now U.S. Pat. No. 7,196,898.

BACKGROUND OF THE INVENTION

1) Field of the Invention

The present invention relates to a thin-film capacitor, a high-density packaging substrate incorporating the thin-film capacitor, and a method for manufacturing the thin-film capacitor, which enable integral incorporation of electronic devices such as passive components L (inductors and coils), C (condenser or capacitor), and R (resistor), and active components IC (semiconductor) whereby a printed board may be downsized and the degree of density thereof may be intensified, and therefore suitable for realizing a high density packaging substrate which incorporates electronic components.

2) Description of the Related Art

As well known, circuits for multi-layer printed wiring boards have recently been miniaturized and multi-layered, for downsizing and increasing density of the printed boards. In such a multi-layer printed wiring board, requisite components such as active components such as IC, and passive components such as capacitors and resistors are mounted on the surface of the printed wiring board, which are connected, to constitute a desired printed board (multilayer printed wiring board).

Due to recent needs in downsizing and advanced functions for cellular phones, PDA, digital audio-video equipment, or the like, there are increasing demands for downsizing and high integration of printed boards. Thus there is a need for realizing a system-in-package (SiP) in which the aforementioned active components such as IC and the passive components are embedded in a multi-layer printed wiring board, for further increasing the packaging density in the multi-layer printed wiring board.

Today's technical innovation has begun to provide a product (SiP) in which several active components are mounted on one packaging substrate. Researches for embedding active components and passive components into a printed wiring board, i.e., a packaging substrate are also under progress. It is expected that incorporation of a number of electronic components into a multi-layer printed wiring board to provide a high-density packaging substrate will enable further downsizing and increasing in density of the printed boards. Demands for higher density packaging of SiP are thus increasing.

Examples of a passive component to be incorporated include various types of capacitors such as a bypass capacitor and a decoupling capacitor. Incorporation of such capacitors to a packaging substrate will be highly beneficial since capacitors are essential elements, as well as resistors, in an electronic circuit and a number of capacitors are employed in the circuit. A bypass capacitor is employed for eliminating the noise generated at the electric power supply of a digital IC, and thus has to be disposed near the power supply pin of the IC chip. When the bypass capacitor is mounted outside the board, mounting position of the capacitor on the packaging substrate will be limited, which will restrict the freedom of designing a high-density packaging substrate. If the capacitors including such a bypass capacitor are downsized, and specifically made in a form of a thin film to be incorporated into a packaging substrate, the aforementioned problems will be solved, and circuit properties will also be improved. However, a capacitor having a sufficiently thin size available in wiring in the packaging substrate has not yet been obtained so far, and incorporation of the capacitor in the packaging substrate has not thus been achieved.

As a material for a capacitor having a high capacitance, especially for a bypass capacitor, ferroelectric materials are often employed since the ferroelectric material has a high dielectric constant, and dielectric loss thereof does not cause much influences in this case. Generally, a ferroelectric material exhibits a high dielectric loss and may cause problems as to its property for use in high frequency. Therefore, in a frequently employed method, the high-frequency property is improved while dielectric constant is suppressed.

The size of a capacitor will be explained in more detail with an example of the bypass capacitor. Such a capacitor may be produced by laminating a ceramic dielectric substance and a silver-based electrode by screen printing method and sintered (Non-Patent document 1 (IEEE ISAF 2000 ("Proceedings of the 2000 12th IEEE International Symposium on Applications of Ferroelectrics", Honolulu, Hi., U.S.A., 21, Jul. to 2, Aug., 2000) proceedings, Volume II, pp. 821 to 824.)). Since this capacitor is manufactured by use of such a screen printing method, the thickness of each layer becomes several μm. Therefore, in order to obtain a necessary capacitance, a plurality of layers have to be laminated, which makes the entire thickness in millimeter order.

In order to increase the capacitance of a capacitor, either means for reducing the thickness of a dielectric film, or means for enlarging the surface area of the dielectric film must be taken. However, it is difficult to reduce the thickness of a ceramic dielectric (film) in the screen printing method as described above. Therefore, the dielectric layers have to be laminated for ensuring the surface area.

FIG. 1 is a cross sectional structure of a high-density packaging substrate having desired electronic circuits formed therein; on the supposition that, an IC chip 3 serving as an active component and a resistor 4 and a capacitor 5 serving as passive components can be incorporated between an insulating substrate 1 and an interlayer insulating layer 2 of the high-density packaging substrate by setting the electronic components in the wirings. The conventional multi-layer ceramic capacitor can not be employed as the capacitor 5 in such a structure, since the conventional ceramic capacitor has a millimeter order of thickness whereas each of other components has thickness several tens of micrometers, and the conventional capacitor can not be embedded into such a thin multi-layer structure of the packaging substrate. If the conventional capacitor is forcedly embedded, a part of the packaging substrate below the capacitor has to be concaved, and the via has to be vertically extended to expand the gap between an upper wiring layer and a lower wiring layer, which would inhibit thinning of the packaging substrate and result in a unsatisfactory product in terms of technology and cost. Particularly, great restrictions will be imposed on a bypass capacitor which has to be disposed near the power supply pin of an IC chip.

SUMMARY OF THE INVENTION

The present invention has been accomplished in view of the foregoing, and an object thereof is to provide a thin-film capacitor which has a sufficient capacitance and can be incorporated into a packaging substrate without deteriorating the electric properties and the size feature, a high-density packaging substrate incorporating the thin film capacitor, and a method for manufacturing the thin-film capacitor.

To solve the problems, the thin-film capacitor of the present invention is a capacitor capable of being incorporated into a packaging substrate, characterized in that the capacitor comprises a high-dielectric-constant layer, and an upper electrode layer and a lower electrode layer sandwiching the high-dielectric-constant layer from the upper side and the lower side.

The thin-film capacitor according to the present invention is further characterized in that the capacitor has a laminate (i) comprising the lower electrode layer, the high-dielectric-constant layer and the upper electrode layer which are sequentially laminated in this order, and one or more laminates (ii) consisting of the high-dielectric-constant layer and an electrode layer, the laminate (ii) being laminated on the laminate (i).

A high-density packaging substrate incorporating the thin film capacitor according to the present invention is characterized in that at least one wiring layer which is surrounded by an insulating layer is laminated, and a thin-film capacitor is connected to a part of the wiring layer as a passive component, wherein the thin-film capacitor comprises at least the aforementioned high-dielectric-constant capacitor.

The method for manufacturing a thin-film capacitor according to the present invention includes a step in which, after a high-dielectric-constant capacitor is formed on the upper side of a support substrate, the back surface of the support substrate is subjected to any one of chemical polishing and mechanical polishing or both (CMP) to perform thinning. That is, the method is characterized in the step of mechanical and/or chemical polishing to make a thin film.

The support substrate suitable for the purpose is not necessarily limited to a silicon substrate, and a substrate such as of quartz, magnesium oxide, sapphire, or alumina may be employed as long as the material exhibits heat resistance to the temperature in manufacturing steps, and can undergo thinning process such as polishing of the back surface.

The thin-film capacitor according to the present invention can be incorporated into a packaging substrate as described above. However, if necessary, the thin-film capacitor may be connected to the surface of a packaging substrate such as printed board by use of wire bonding techniques or the like, instead of incorporating into a packaging substrate.

In the configuration of the present invention, preferably, the thin-film capacitor is thinned such that it can be incorporated into the high-density packaging substrate, by mechanically polishing the support substrate thereof to perform thinning, and subsequently chemically polishing the substrate according to needs to perform further thinning.

The thickness of the high-dielectric-constant layer is preferably adjusted to about 200 nm to 50 nm since the charge capacitance is increased along with the reduction of film thickness which is preferable, meanwhile, leakage current tends to increase. When the thickness exceeds 200 nm, ensuring the required capacitance is difficult, and when the thickness is reduced to equal to or less than 50 nm, leakage current tends to increase and the property as a high-dielectric-constant substance tends to be instable.

No particular limitation is imposed on the material composing the upper electrode layer and the lower electrode layer, and publicly known electrode materials for high-dielectric-constant substances or ferroelectric capacitors may be employed. Examples of such material may include metals such as Au, Ag, Co, Ni, Cr, Ta, Ti, Pt, Ir, Ru, and Re, alloys thereof, and conductive metal oxides. Among these electrode materials, platinum (Pt) is preferred since platinum increases the capacitance of a capacitor. However, platinum (Pt) has a low reactivity and is readily exfoliated. Therefore, when Pt is employed as the material for forming the lower electrode layer and the layer is laminated on an underlayer (film) such as silica-based insulating film, a film of a metal such as tantalum or titanium or of a metal oxide thereof may preferably be laminated in advance as an adhesion layer.

No particular limitation is imposed on the conductive material for filling the first and the second contact holes formed in the insulating layer, and examples of the material may include aluminum (Al) and copper (Cu). Copper is preferred in terms of the low electric resistance. Depending on the type of the conductive material, a conductive barrier film such as of TiN or TaN may preferably be formed on the inner surface of the contact holes before the conductive material is filled in, to protect the electrode material or to prevent deterioration of the insulating property of the interlayer insulating film. Also, when the conductive material is formed, pads for forming bumps may also preferably be formed.

A conventionally known ferroelectric material or paraelectric material may be employed as a high-dielectric-constant material for forming the high-dielectric-constant layer.

The examples of the ferroelectric material may include titanate-based materials such as $CaTiO_3$, $BaTiO_3$, $SrTiO_3$, $Bi_2TiO_5$, $Bi_4Ti_3O_{12}$, $La_2TiO_5$, $CeTiO_4$, $PbTiO_3$, and $ZrTiO_3$; stannate-based materials such as $BaSnO_3$, $SrSnO_3$, and $PbSnO_3$; zirconate-based materials such as $BaZrO_3$, $CaZrO_3$, and $Bi_4Zr_3O_{12}$; niobate-based materials such as $MgNbO_3$, $CaNbO_3$, $SrNbO_3$, $BaNbO_3$, and $PbNbO_3$; tantalate-based materials such as $LiTaO_3$, $BaTaO_3$, $SrTaO_3$, $CaTaO_3$, $MgTaO_3$, and $SrBi_2Ta_2O_9$; and layer-structured-bismuth-based materials such as $Bi_3TiNbO_9$, $PbBi_2Nb_2O_9$, $Bi_4Ti_3O_{12}$, $Bi_2SrTa_2O_9$, $Bi_2SrNb_2O_9$, $Sr_2Bi_4Ti_5O_{18}$, and $Ba_2Bi_4Ti_5O_{18}$.

The examples of the paraelectric materials may include BST-based materials represented by $Ba_xSr_{1-x}TiO_3$ ($0 \leq x \leq 1$), an STO-based material represented by $SrTiO_3$, and materials further suitably containing other metal elements in addition to the aforementioned materials. If necessary, a part of the metals in the basic composition may be substituted by other metal elements, for example, $Pb(Zr, Ti)O_3$, and $(Bi, La)TiO_5$, which may also be employed. Materials additionally including a shifter, depressor, or a reduction preventing material for shifting the Curie point may also be employed.

Particularly, a capacitor must have high insulation property as an important property. Therefore, actually employed composition may have composition ratio proportioned differently from the stoichiometric composition, and may contain much more sorts of metal oxides in combinations.

Among the aforementioned dielectric materials, SBT ($SrBi_2Ta_2O_9$) has been studied for application in, for example, a ferroelectric material for ferroelectric memory devices. The Bi-layered structure exhibiting ferroelectric property is amorphous when it is formed by sol-gel process, and in a subsequent heat treatment, the structure undergoes the state of aggregate of crystallites having a fluorite structure to attain a bismuth-layered structure.

The crystallites having the fluorite structure may be employed as the high-dielectric-constant material for the present invention. The crystallites having the fluorite structure are paraelectric, and serve as a dielectric material having a relative dielectric constant of 70 to 100. Since the material is an aggregate of crystallites, it can advantageously suppress the leakage current at a low level.

Among the examples of the dielectric material, high-dielectric-constant materials having a relative dielectric constant of 100 or more are preferred. With a relative dielectric constant of 100 or more, a large capacitance can be obtained even with a small surface area. Therefore, a thin-film capacitor having a high capacitance can be remarkably downsized for suitably incorporating into a high-density packaging substrate.

In order to be compatible with high-frequency ICs such as digital ICs or chips having a high clock frequency, it is preferable that the high-dielectric-constant materials have excellent high-frequency properties. As used herein, having excellent high-frequency properties means that the dielectric material has a low tendency to decrease the dielectric constant in high-frequency region, causes a low dielectric loss, and has a low frequency dependency.

When the noise in a digital IC power supply line is problematic, the dielectric material is required to be capable of removing the noise effectively. Many ferroelectrics have a high dielectric constant but also have a high dielectric loss, thereby not suitable for use in high frequencies. However, these materials are suitable when a high capacitance is needed. Such materials may be employed for stabilizing a power supply such as of IC. The material is applied for this purpose since the priority herein is a high capacitance.

Examples of the high-dielectric-constant material exhibiting preferred dielectric constant, high-frequency properties, and an excellent noise-removing effect, may include a BST-based material (having a relative dielectric constant of about 600) represented by $Ba_xSr_{1-x}TiO_3$ ($0 \leq x \leq 1$), an STO-based material (having a relative dielectric constant of about 300) represented by $SrTiO_3$, and a material obtained by further adding other suitable metal elements to the aforementioned materials.

No particular limitation is imposed on the technique for forming the high-dielectric-constant material, and any technique may be employed as long as the film having a thickness of about 50 to 200 nm can be formed. For example, various methods such as a coating method, CVD, sputtering, electrophoresis, anodic oxidation, and an ink-jet method, may be employed for forming the film.

The coating method may be performed by applying on a substrate a solution that has been prepared by dissolving in an organic solvent an organic metal compound such as metal alkoxide, metal carboxylate, composite metal alkoxide, and a hydrolysis product of metal alkoxide; any of a variety of stabilizers such as β-diketone and glycol, if necessary; and other additives. This method is preferable since this method is very simple and the compositional ratio of metals for forming composite metal oxides may be readily controlled.

The CVD is a method in which a directly-vapored organic metal compound or a vapored solution of the organic metal compound in an organic solvent is generated, which is then deposited on a substrate. This method is suitable for forming a conformal coat film and effective for forming a crystallized film under a low temperature baking condition.

The sputtering is a method for physically depositing a material (target) that is metal or metal oxide onto a substrate, and is practical when a sputtering apparatus and the target are already available.

The electrophoresis and the anodic oxidation enable coat film formation with simple operations. The ink-jet method is preferred as a coating method in terms of the effect for reducing the consuming amount of the coating liquid.

With the thin-film capacitor according to the present invention, a high-dielectric-constant capacitor may be formed on a support substrate such as of silicon by means of a capacitor forming methods disclosed in, for example, Japanese Patent Application Laid-Open Publication No. 1999-163273 and other publicly known documents. Then, preferably, an ordinary insulating layer forming method, a contact hole forming method employing a photoresist, a conductive material forming method, and a bump forming method may be performed onto the upper side of the formed high-dielectric-constant capacitor, and subsequently the back surface of the support substrate may be subjected to mechanical and/or chemical polishing to thin the substrate to 150 μm or less, preferably 100 μm or less, more preferably 50 μm or less.

In practice, it is desirable to further form a passivation film before thinning the support substrate, for improving environment resistance. Formation of the passivation film may be carried out by a method in which, for example, about 150 nm of a Ta oxidized film as an adhesion layer of the PV (passivation) film, is formed by sputtering on the capacitor structure having pads formed thereon, about 850 nm of an SiN film serving as the PV film is then formed thereon by CVD, and then a part of the PV film on and around the pads is removed by etching to expose the pads.

Therefore, the PV film such as an SiN film is formed on the upper most layer except the part of the pads and periphery thereof. By forming the PV film, penetration of moisture or the like may be suppressed and moisture resistance may be enhanced, therefore a capacitor having a high environment resistance may be obtained.

The mechanical polishing method may be, for example, a polishing method employing diamond abrasive. The chemical polishing method may be a method employing, for example, an acid solution such as hydrofluoric acid, a hydrofluoric acid-nitric acid mixture, or an alkaline solution such as KOH or a KOH—$K_3Fe(CN)_6$ mixture. After the mechanical polishing is performed, the polished surface may have received mechanical damages. Therefore, after the mechanical polishing, the damaged portion may be removed by chemical polishing, which is a preferred method.

When the support substrate is thinned, particularly when the support substrate is thinned by chemical polishing, a coat film (layer) having a high resistance to etching is preferably provided on the upper surface (the other side of the polish surface) of the support substrate. By providing the coat film (layer), the support substrate can be completely removed and further thinning of a capacitor may be achieved. Such a coat film (layer) may be appropriately selected according to the polishing method. For example, the coat film (layer) may be the one which exhibits acid resistance when the polishing is performed with the acid solution, or may be the one which exhibits alkali resistance when the polishing is performed by the alkaline solution.

Examples of such coat film (layer) may include silicide. For example, a silicon substrate may be employed as a support substrate as shown in FIG. 2. Silicon and a metal layer (for example, Ni or Co) which can form silicide may be provided in advance on the upper side (the other side of the polish surface) of the silicon substrate. Then necessary treatment (for example, heat treatment) for conversion into silicide may be performed. As a result, a silicide layer (for example, $NiSi_2$ or $CoSi_2$) may be formed between the silicon substrate (support substrate) and the metal layer.

Then, a capacitor may be formed on the substrate on which the silicide layer has been formed as shown in FIG. 3 (the capacitor forming method is as same as the above description). Subsequently, the silicon substrate (support substrate) may be polished and completely removed to obtain a thin film capacitor having a silicide layer as its lowest layer.

When a conductive material is selected for the coat film (layer) having high resistance to etching, the coat film (layer) may be used as a part of the lower electrode layer. For example, a silicide layer may be formed on the upper side of the silicon substrate (support substrate) as described above. A lower electrode layer or a conductive barrier film such as of TiN (when the barrier film is formed, the lower electrode layer is formed on the barrier layer) may be formed on the silicide layer. Then a high-dielectric-constant layer and an upper electrode layer, etc. may be sequentially formed as described above to form a capacitor. Subsequently, the silicon substrate (support substrate) may be completely removed as described above. As a result, the lowest layer which is the coat film (for example, a conductive layer of silicide) may be exposed which may serve as a lower electrode as it is. Therefore, a thin-film capacitor having an upper electrode and a lower electrode formed on each side thereof may be provided.

After the silicon substrate (support substrate) is completely removed, a material such as copper or nickel may be formed on the surface of the exposed coat film (layer) having a high resistance to etching. By forming a metal material such as copper or nickel, adhesiveness between the wirings formed in a high-density packaging substrate and the thin-film capacitor may be enhanced.

No particular limitation is imposed on the method for forming the metal material such as copper or nickel. For example, electrolysis plating or electroless plating may be employed.

Another method for completely removing the support substrate may be additional provision of a function film as a lower layer of the lower electrode which is employed as an exfoliation layer or a stopper layer by utilizing the property thereof.

In this method, in addition to provide such layer directly beneath the lower electrode, a mechanical strength enhancing layer or an adhesion layer may also be provided between the electrode and the function film. For example, a phospho-silicate glass (PSG) layer to which about 5 wt % of P (phosphorus) is added, or a boro-phospho-silicate glass (BPSG) layer is provided between the substrate and the lower electrode, whereby the thinning can be performed by immersing the substrate in hydrofluoric acid to dissolve and remove this layer and separate the substrate from the upper capacitor part. Also, when a layer of $WO_3$ or $MoO_3$ is employed in the same manner as described above, the layer may be dissolved by immersing in alkali. With metals such as W or Mo, dissolution and exfoliation may be carried out by an alkaline substance including an oxidizing agent.

Examples of the stopper layer may include an etching stopper layer which is used in removal of a silicon support substrate by etching by use of an alkaline substance or an oxidizing agent, wherein only the unnecessary portion may be removed by providing the etching stopper layer. A silicide layer such as of Co, Ni or Pt, or a layer in which a high-concentration B (boron) is diffused in silicon may be provided as such etching stopper layer. Co-use of thinning by mechanical polishing with this method will be more effective.

Examples of the exfoliation layer may include a metal-carbonate compound layer. A step may be employed in which the metal-carbonate compound layer is formed, the substrate is heated without polishing and removing the support substrate after other steps have been carried out as described above, and a reaction such as of metal-carbonate compound, $MCO_3 \rightarrow MO+CO_2$, (an example when M represents divalent metal) is utilized to exfoliate the support substrate by the pressure of the carbon dioxide gas.

In an example of the forming method of the metal-carbonate layer, metal alkoxide or carboxylate is dissolved in a solvent such as alcohol, and coating and drying are performed, then burning is performed in the presence of carbon dioxide gas to form the layer.

The material of the exfoliation film may be selected from among various inorganic carbonate metal compounds depending on the highest temperature throughout all the steps. That is, the material to be selected may have a decomposition temperature which is sufficiently higher than the temperatures employed in the steps, wherein the temperature at which generation and decomposition of the carbon dioxide gas are caused may be in the range that does not break the element itself.

When the dielectric layer is formed by the coating method, for example, $SrCO_3$ (decomposition temperature: 900° C.) or $CaCO_3.MgCO_3$ (decomposition temperature: 700° C.) are preferably employed.

Subsequently, the capacitors formed on the thinned support substrate or capacitors with the substrate completely removed, may be cut out per chip by publicly known slicing technique to obtain separated thin-film capacitors. In another method, the polishing step may be carried out after slicing has been carried out in order to avoid damages to the element.

Thus manufactured thin-film capacitor may be embedded into a required position of a packaging substrate by employing flip-chip technique. Then, formation of wiring and insulating layer may be appropriately repeated such that a high-density packaging substrate may be manufactured.

When the thin-film capacitor is connected onto a packaging substrate, a substrate having the thin-film capacitor packaged on the surface thereof may be manufactured by, for example, connecting with other elements (components) by use of wire bonding technique or the like.

A capacitor having only one high-dielectric-constant layer may have a deficient capacitance. Effective strategies for increasing capacitance would be, as described above, employment of a high-dielectric-constant material having high relative dielectric constant, or thinning the film thickness of the high-dielectric-constant layer. However, it is very difficulty to newly develop a material which has a higher relative dielectric constant than existing high-dielectric-constant materials, and thinning of the thickness indeed has a limit since it increases possibility of leakage of current which deteriorates electrical liability.

In such a case, it is useful to form a capacitor having a structure in which one or more second laminates comprising a high-dielectric-constant layer and an electrode layer are further laminated on a first laminate comprising a lower electrode layer, a high-dielectric-constant layer, and an upper electrode layer. The capacitance of the capacitor may be increased by providing a structure in which one or more high-dielectric-constant layer is laminated.

The capacitor may be formed by, for example, after the high-dielectric-constant layer is formed on the first laminate, an oxidized film is formed to cover the entirety of the capacitor, the oxidized film is subjected to an etch-back treatment until the high-dielectric-constant layer is exposed, then, the electrode layer is formed on the high-dielectric-constant layer, and, if necessary, the steps of the formation of the high-dielectric-constant layer to the formation of the electrode layer are repeated according to needs.

The entire exposed surface of the high-dielectric-constant layer is planarized by employing the etch-back treatment. Therefore, upon the subsequent formation of an electrode layer, the electrode layer may be formed on the high-dielectric-constant layer with high accuracy. The oxidized film may be formed, for example, by CVD employing p-TEOS with a film thickness of about 300 nm. When the planarization by etch-back is not sufficient, it is preferable that about 2000 nm of an oxidized film may be formed by CVD and planarization step is performed by CMP, and then etch-back treatment is performed.

In the etch-back treatment step, when sidewalls are formed at the second high-dielectric-constant layer, the possibility of short circuit between the first layer and the second layer is reduced, thus being preferable.

Meanwhile, when the laminate is formed, each of the electrode layers has to be electrically connected. The method therefore to be proposed may include a method in which ends of the electrode layers are shaped by employing photolithography to protrude alternately over the high-dielectric-constant layer, via holes are formed after all the laminates are formed, a conductive material is embedded into the via holes, and pads are formed on the upper side thereof. An alternative method to be proposed may be, in the same manner, pads are formed on the upper side of the capacitor after all the laminates are formed, then, both side surfaces of the capacitor is subjected to taper etching or dicing such that one end of each of the electrode layers is exposed, and a conductive material is formed on the both side surfaces to electrically conduct the layers with the pads at the upper portions.

When the laminate has many layers and formation of the via holes is difficult, the latter method is advantageous.

Hereinabove, particularly about formation of one capacitor and dicing for taking a chip has been explained. However, if necessary, the capacitor may be divided into two or more parts, and subsequently the divided capacitor may be diced and taken out as one chip.

An example of a capacitor divided into two or more parts will be explained based on FIG. 33 to FIG. 35.

FIG. 33 is a cross section of a typical thin-film capacitor according to the present invention.

FIG. 34 is a cross section of typical divided capacitors. In this diagram, via (via 1) for leading lower electrode is subjected to common use.

FIG. 35 is a layout example of an electrode which is divided into four parts. In FIG. 35, a via (via 2) for leading lower electrodes is provided at the center of the division lines, vias (vias 3) serving as upper electrodes are provided at four corners of the divided body, and common wirings (wirings 4) are formed to connect the four parts.

A large-capacitance capacitor such as a bypass capacitor must have an increased chip area to obtain capacitance.

Heat treatment is performed when a dielectric is formed on a lower electrode by sol-gel process. When performing such a process with the chip having a large area, exfoliation may occur due to, for example, the reduction in volume upon formation of the dielectric film, and the difference in thermal expansion coefficient between thin films of metal and ceramic. Therefore, by dividing a capacitor to alleviate the stress, such phenomenon of exfoliation occurrence may be suppressed.

The divided shape is not limited to that having angled corners but also may be a shape having no angled-corners or may be circular. A shape having no angled-corners or a circular shape is particularly preferable to alleviate the stress and suppress such phenomenon of exfoliation.

In another aspect of the present invention, one or more dielectric capacitors and one or more resistors are formed on one substrate and diced to obtain a single chip.

As shown in FIG. 36, after a dielectric capacitor is formed, a $RuO_2$ resistor film is formed by reactive sputtering, and by performing etching by use of a chlorine-based gas, a resistor is formed. Then, an $SiO_2$ film is formed (also formed on the dielectric capacitor at the same time) by CVD, vias are perforated and Pt is formed therein, and a TiN barrier layer is formed and Al pads are formed thereon.

FIG. 37 is a cross-sectional view. Foregoing is an example in which ruthenium oxide resistors are disposed by the side of dielectric capacitors. The dielectric capacitors and resistors may be laminated via interlayer films. By forming dielectric capacitors and resistors on one substrate in such manner, packaging cost can be reduced. In addition, when the number of capacitors and resistors to be formed on one substrate is increased, further cost reduction may be expected.

According to the present invention, a thin-film capacitor which can be incorporated into a substrate and has a sufficient capacitance without deteriorating the electrical properties and size feature of the packaging substrate, a high-density packaging substrate incorporating such a thin film capacitor, and a method for manufacturing such a thin-film capacitor are provided.

The other objects, features and advantages of the present invention are specifically set forth in or will become apparent from the following detailed descriptions of the invention when read in conjunction with the accompanying drawings.

BRIEF DESCRIPTION OF THE DRAWINGS

FIG. 40 is a graph of the results of leakage current ($A/cm^2$) measurement of SBT coat films formed by use of the solution prepared in Synthesis Example 3.

DETAILED DESCRIPTION

Figure 1:
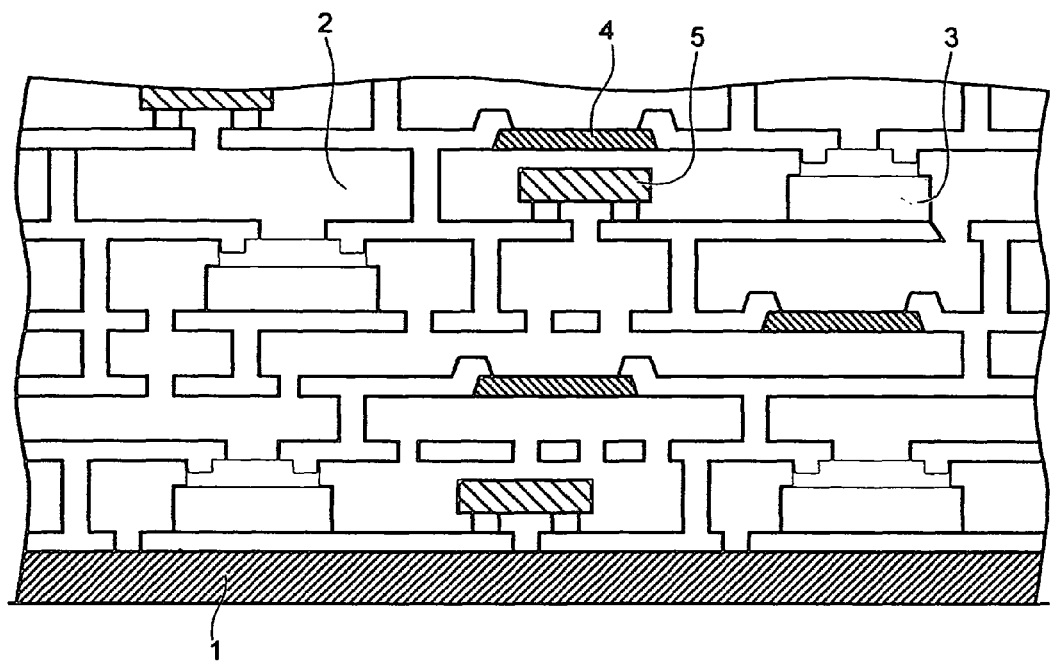
FIG. 1 is a cross-sectional block diagram of a high-density packaging substrate provided on the supposition that thin-film capacitors are incorporated therein as passive components.
Figure 2:
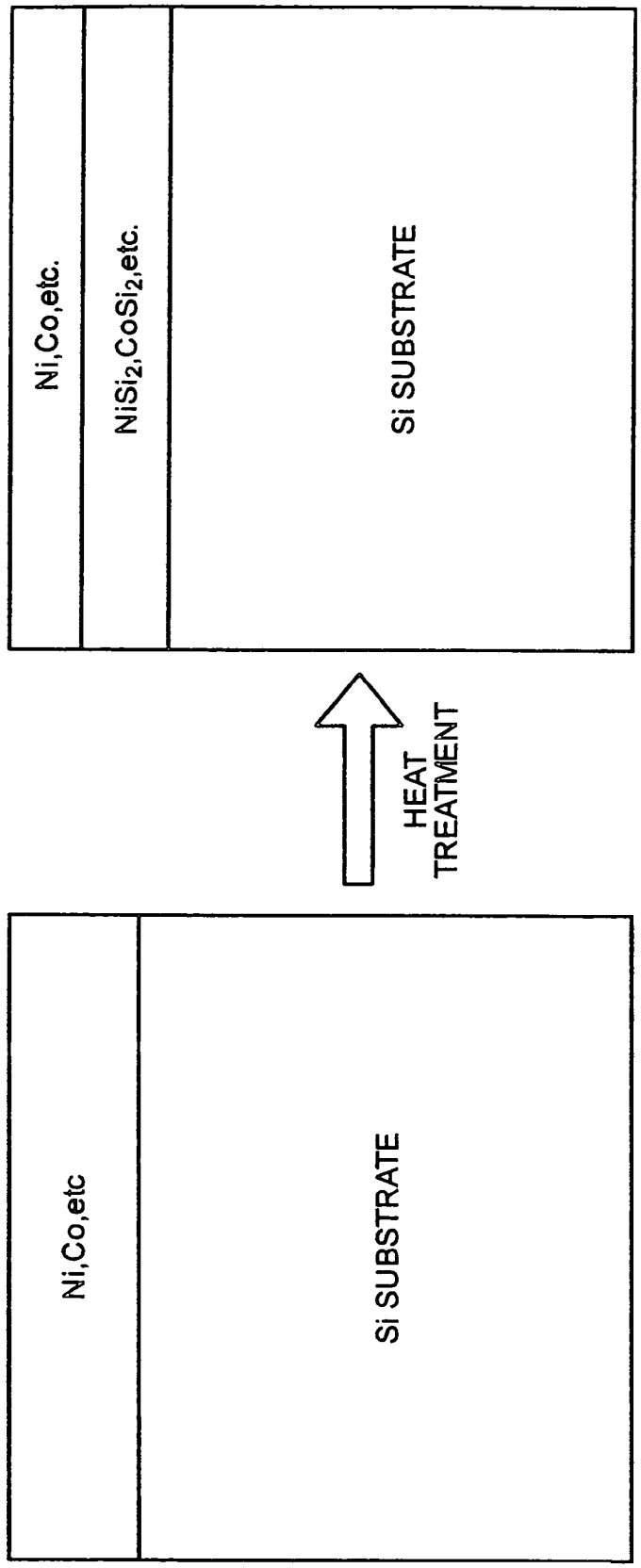
FIG. 2 is a cross sectional view of a laminate for explaining a step of providing a suicide layer on a silicon substrate.
Figure 3:
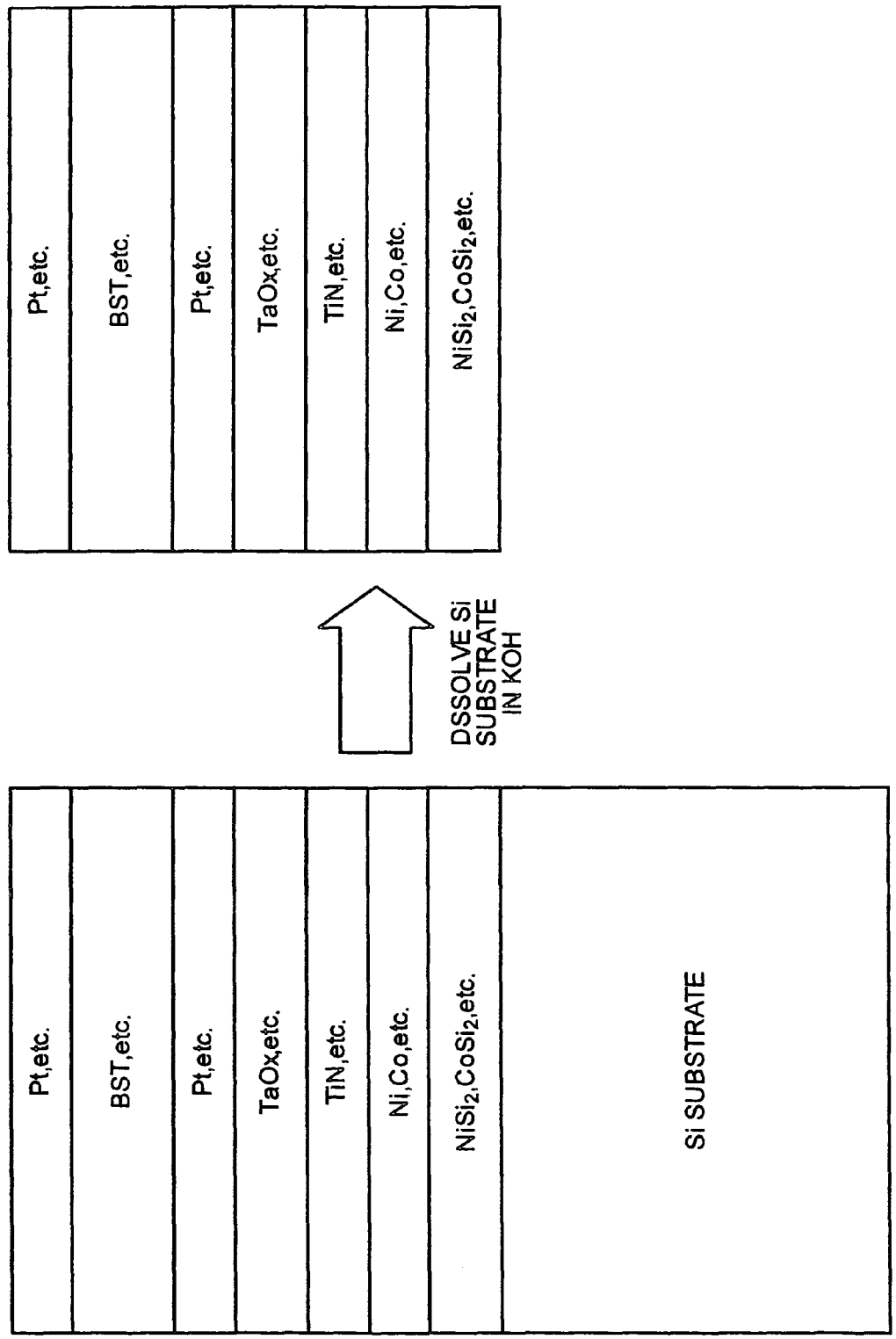
FIG. 3 is a cross sectional view of a laminate consecutive to that of FIG. 2 for explaining a step of providing a silicide layer on a silicon substrate.

The present invention will be described in more detail with reference to Examples. However, the following Examples are merely for explaining preferable examples of the present invention, and the present invention is not limited thereto.

EXAMPLES

In the following Examples, a thin-film capacitor (thin-film condenser) employing a silicon wafer (silicon substrate) as a support substrate, was manufactured.

Synthesis Example 1

A composition example of a sol-gel coating solution for forming $Ba_xSr_{1-x}TiO_3$ (x=0.6) will be described.

A solution of barium isopropoxide was diluted in advance to a concentration of 0.5 mol/kg with propylene glycol monomethyl ether, and a titanium isopropoxide solution was also diluted in advance to a concentration of 0.5 mol/kg with propylene glycol monomethyl ether. The solutions each of which in an amount corresponding to 1 mol were mixed and stirred for 30 minutes to be uniform.

Subsequently, a solution of pure water diluted with 20 times weight ratio of propylene glycol monomethyl ether was added dropwise to the mixture solution of barium and titanium under stirring, and stirred for one hour. The added amount of $H_2O$ was 3.5 times molar ratio of the total molar amount of the barium and titanium. By adjusting the amount of propylene glycol monomethyl ether added at the beginning, the concentration in terms of $BaTiO_3$ was adjusted to 0.15 mol/kg. Accordingly, a $BaTiO_3$ solution (hereinbelow referred to as BTO solution) was obtained.

An $SrTiO_3$ solution (hereinbelow referred to as STO solution) having a concentration in terms of $SrTiO_3$ of 0.15 mol/kg was obtained in the same way in obtaining the aforementioned BTO solution except that a solution of strontium isopropoxide having a concentration of 0.5 mol/kg was employed in place of the barium isopropoxide solution having a concentration of 0.5 mol/kg.

Subsequently, the BTO solution and the STO solution were mixed in a weight ratio of 6:4 and stirred for one hour. As a result, a sol-gel coating solution for forming $Ba_xSr_{1-x}TiO_3$ (x=0.6) including 3.2 wt. % of solid oxides was obtained.

Synthesis Example 2

An $SrTiO_3$ solution (STO solution) having a concentration of 0.15 mol/kg in terms of $SrTiO_3$ was obtained in the same manner described in Synthesis Example 1.

Synthesis Example 3

An $SrBi_2Ta_2O_9$ solution (hereinbelow referred to as SBT solution) was obtained in accordance with the method described below. Tantalum ethoxide in an amount corresponding to 2 mol, bismuth butoxide in an amount corresponding to 2.1 mol, and strontium isopropoxide in an amount corresponding to 0.9 mol were mixed with propylene glycol monomethyl ether. The solution was stirred for two hours at room temperature for uniform mixing. Subsequently, 3 mol of ethyl acetoacetate was added and the solution was subjected to heat stirring at 80° C. for two hours. Then, 1 mol of propylene glycol was added thereto and the solution was stirred for one hour at room temperature. Then, 2 mol of water was added dropwise to the solution while stirring, and after finishing the addition, the solution was stirred at room temperature for two hours, to prepare an SBT solution containing 6.5 wt. % of solid metal oxides.

(Evaluation of XRD Measurement)

Each of the solutions prepared in Synthesis Examples 1 and 2 was applied onto a silicon wafer by carrying out spin coating for one second at 500 rpm, and subsequently for 30 seconds at 2000 rpm, by use of a spin coater, followed by pre-baking at 600° C. for 30 minutes. The operations from the coating to the pre-baking were repeated three times. Subsequently, a heat treatment was carried out at 700° C. for 60 minutes in the atmosphere of oxygen for improving crystallinity of the coated film. As a result, a crystallized film having a film thickness of about 100 nm was formed. An XRD measurement was performed with the crystallized film. The obtained graphs (XRD curve) are shown in FIG. 4 and FIG. 5.

The XRD measurement was performed with a measurement apparatus, RINT-2500HF (product name; manufactured by Rigaku Corporation), under the following measurement conditions: X-ray: $CuK_{\alpha 1}$, tube voltage: 30 kV, tube current: 50 mA, scan speed: 20°/min, and scan step: 0.020°.

Figure 4:
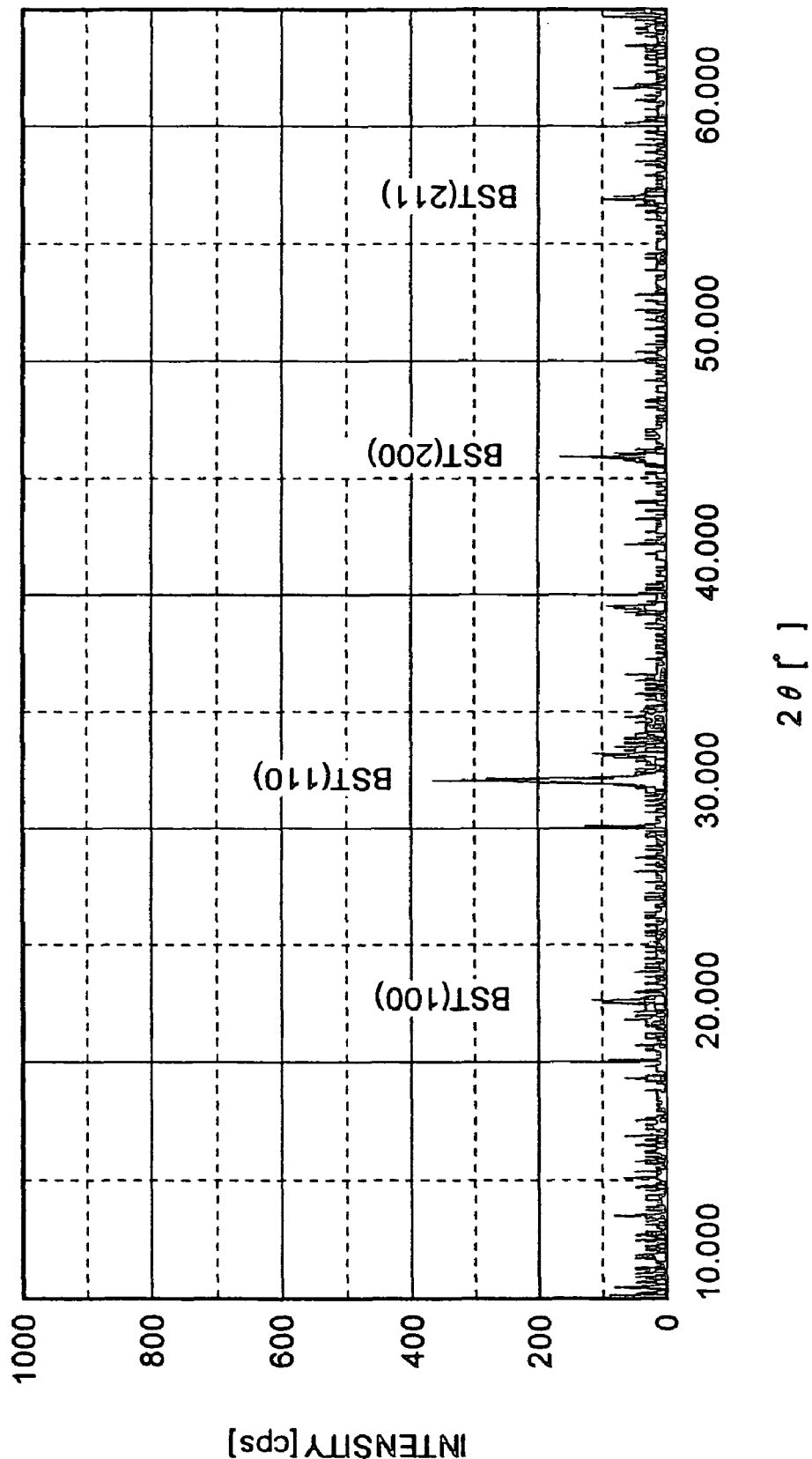
FIG. 4 is a graph of the results of XRD measurement of a BST crystallized film formed by use of the solution prepared in Synthesis Example 1.
Figure 5:
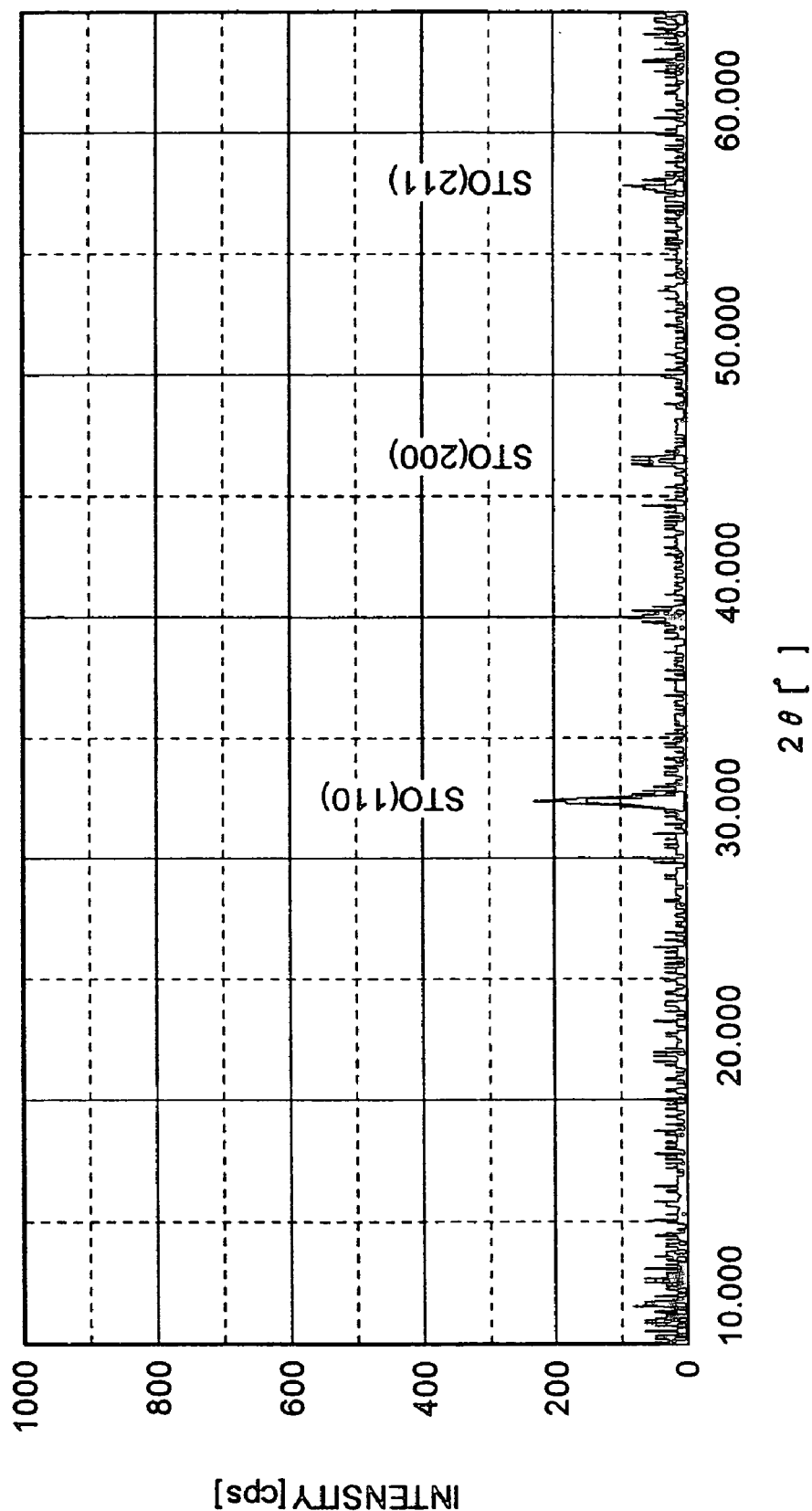
FIG. 5 is a graph of the results of XRD measurement of an STO crystallized film formed by use of the solution prepared in Synthesis Example 2.

FIG. 4 is a graph of measurement employing the solution prepared in Synthesis Example 1, and FIG. 5 is a graph of measurement employing the solution prepared in Synthesis Example 2.

As is obvious from the results of FIG. 4 and FIG. 5, both of the coat films formed by use of the solutions prepared in Synthesis Examples 1 and 2 had an excellent crystallinity.

(Evaluation of Relative Dielectric Constant Measurement)

A Pt electrode (lower electrode) of 60 nm was formed by sputtering on a six-inch silicon wafer on which a thermally oxidized film $SiO_2$ had been formed. The solution prepared in Synthesis Example 1 was applied onto the wafer on which the lower electrode had been formed, by carrying out spin coating for one second at 500 rpm, subsequently for 30 seconds at 2000 rpm. Subsequently, pre-baking was performed for 30 minutes at 600° C.

The operations from the coating to the pre-baking were repeated three times. Subsequently, a heat treatment at 700° C. was performed for 60 minutes in the atmosphere of oxygen for improving the crystallinity of the coated film. As a result, a crystallized film having a film thickness of about 100 nm was formed. A Pt upper electrode was formed by sputtering on the crystallized film via a metal mask, with a thickness of 60 nm in an area of 0.2 mm$\phi$, and then, recovery annealing was carried out at 700° C. for 30 minutes in the atmosphere of oxygen.

The relative dielectric constant of the capacitor thus formed was measured by use of HP4284A Precision LCR Meter (product name; manufactured by Hewlett Packard), at a measurement frequency of 100 kHz. The obtained results are shown in FIG. 6.

A capacitor which had been obtained by performing the heat treatment and the recovery annealing not at 700° C. but at 650° C. for enhancing crystallinity was subjected to the same measurement as the above. The results are shown in FIG. 6.

Figure 6:
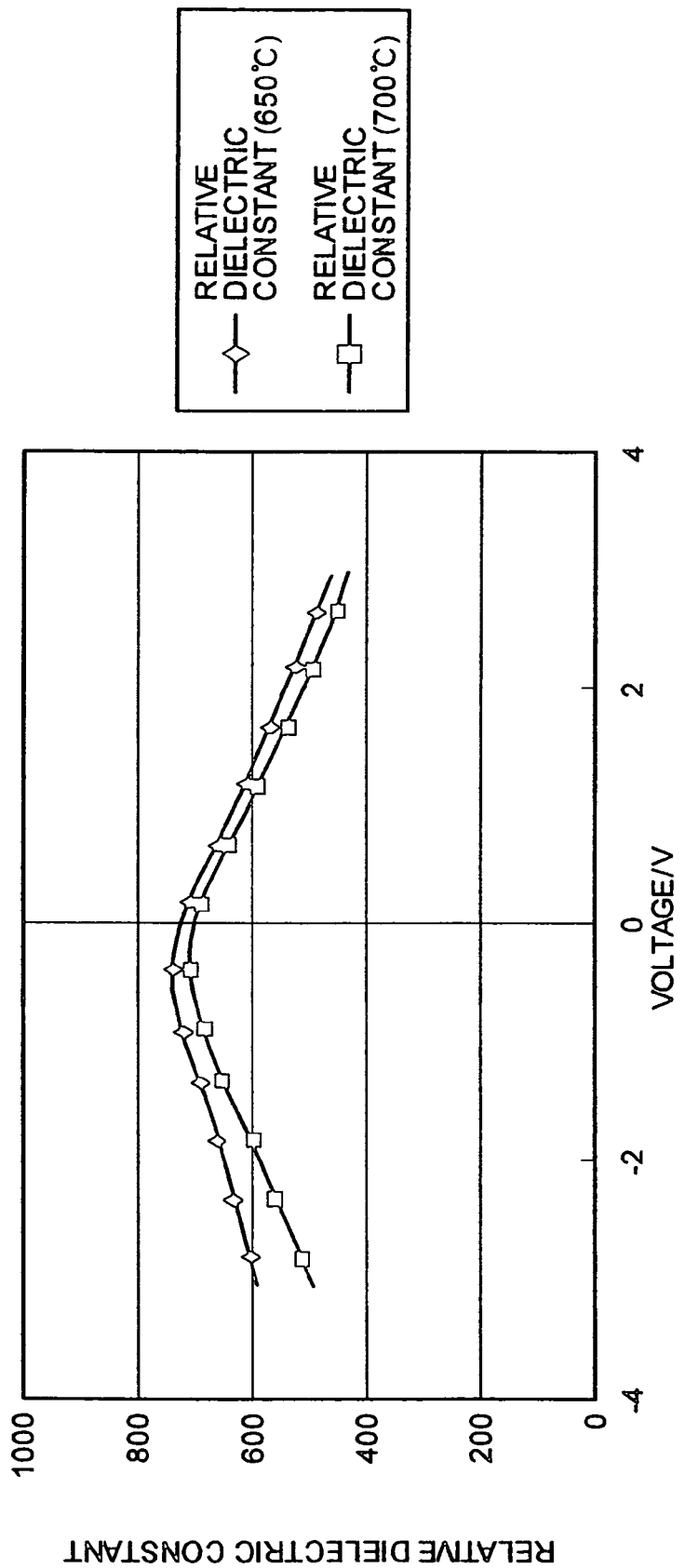
FIG. 6 is a graph of the results of relative dielectric constant measurement of BST crystallized films formed by use of the solution prepared in Synthesis Example 1.

As is obvious from FIG. 6, both of the high-dielectric-constant layers (crystallized films) obtained when the heat treatment was performed at 650° C. or 700° C., had a high relative dielectric constant of about 700 at around zero V (voltage).

Figure 38:
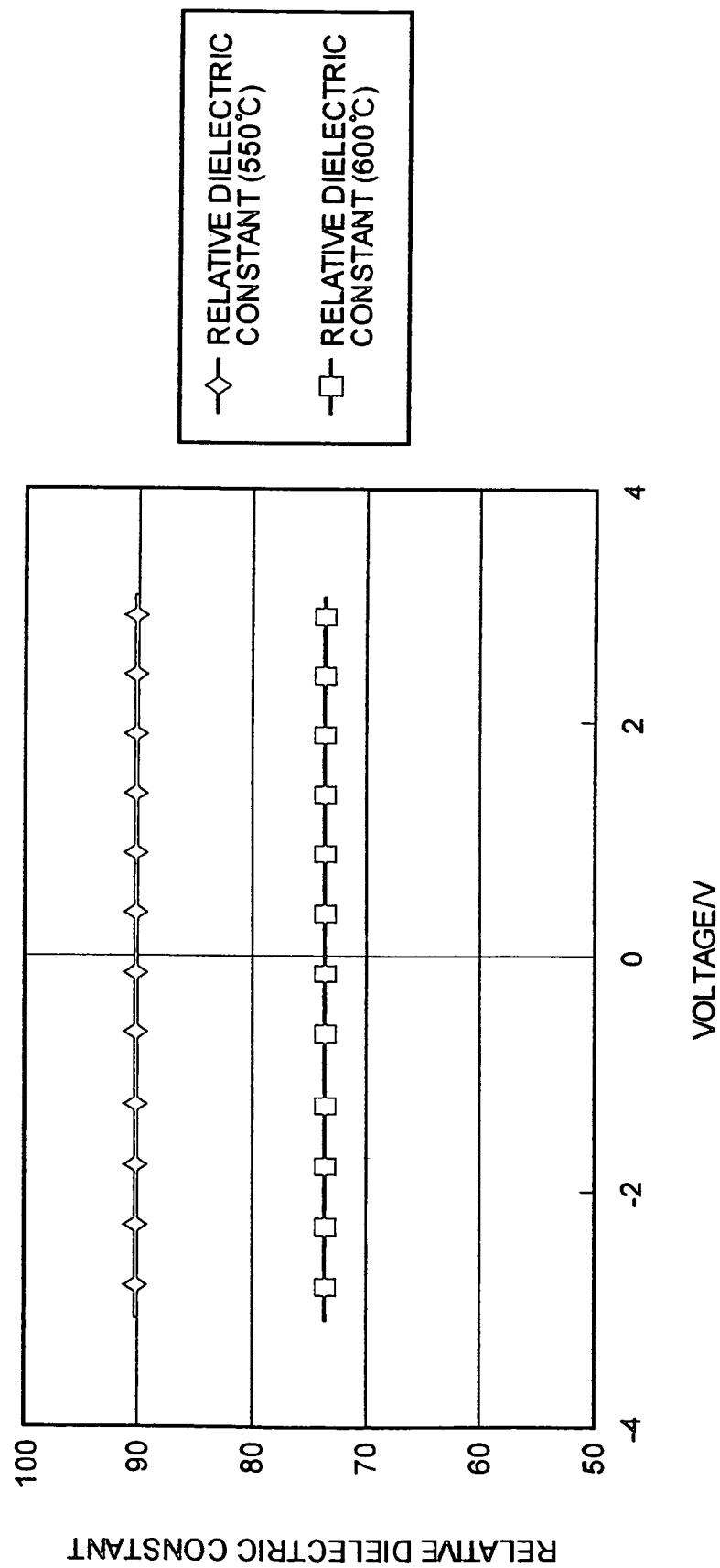
FIG. 38 is a graph of the results of relative dielectric constant measurement of SBT coat films formed by use of the solution prepared in Synthesis Example 3.

With the solution prepared in Synthesis Example 3, a layer was formed as described below, and relative dielectric constant measurement was performed in the same manner. The obtained results are shown in FIG. 38.

A Pt electrode (lower electrode) of 60 nm was formed by sputtering on a six-inch silicon wafer on which a thermally oxidized film $SiO_2$ had been formed. The solution prepared in Synthesis Example 3 was applied onto the wafer on which the lower electrode had been formed by carrying out spin coating for one second at 500 rpm, subsequently for 30 seconds at 2000 rpm by use of a spin coater. Subsequently, pre-baking was performed on a HP (hot plate) at 600° C. for three minutes.

The operations from the coating to the pre-baking were repeated four times. Subsequently, a heat treatment was performed at 600° C. for 60 minutes in the atmosphere of oxygen for improving the crystallinity of the coat film. As a result, a crystallized film having a thickness of about 150 nm was formed. A Pt upper electrode was formed on the crystallized film via a metal mask, by sputtering, with a thickness of 60 nm and in an area of 0.2 mm$\phi$, and then, a recovery annealing was performed at 600° C. for 30 minutes in the atmosphere of oxygen.

A capacitor which had been obtained by performing the heat treatment and the recovery annealing not at 600° C. but at 550° C. for enhancing crystallinity was subjected to the same measurement as the above. The results are shown in FIG. 38.

As is obvious from FIG. 38, it was found out that the high-dielectric-constant layer thus obtained exhibited a high relative dielectric constant of about 70 to 100.

Also, there confirmed that no voltage dependency is exhibited.

An SBT having Bi-layer structure has a relative dielectric constant of about 180. Comparing with this value, the aforementioned results are in low values. The conceivable reason for this is that the SBT of the present Example had a fluorite structure. In this experiment, the SBT coat film having a fluorite structure was able to be formed by baking SBT at a comparatively low temperature of 550° C. or 600° C.

(Evaluation of Loss Measurement)

The measurement of loss (tan $\delta$) was performed with the capacitor which was formed with the solution prepared in Synthesis Example 1 in the evaluation of relative dielectric constant measurement, by use of HP4284A Precision LCR Meter (product name; manufactured by Hewlett Packard), at a measurement frequency of 100 kHz. The obtained results are shown in FIG. 7.

The measurement was performed in the same manner with another capacitor which was obtained by performing the heat treatment and the recovery annealing not at 700° C. but at 650° C. for improving the crystallinity. The results are shown in FIG. 7.

Figure 7:
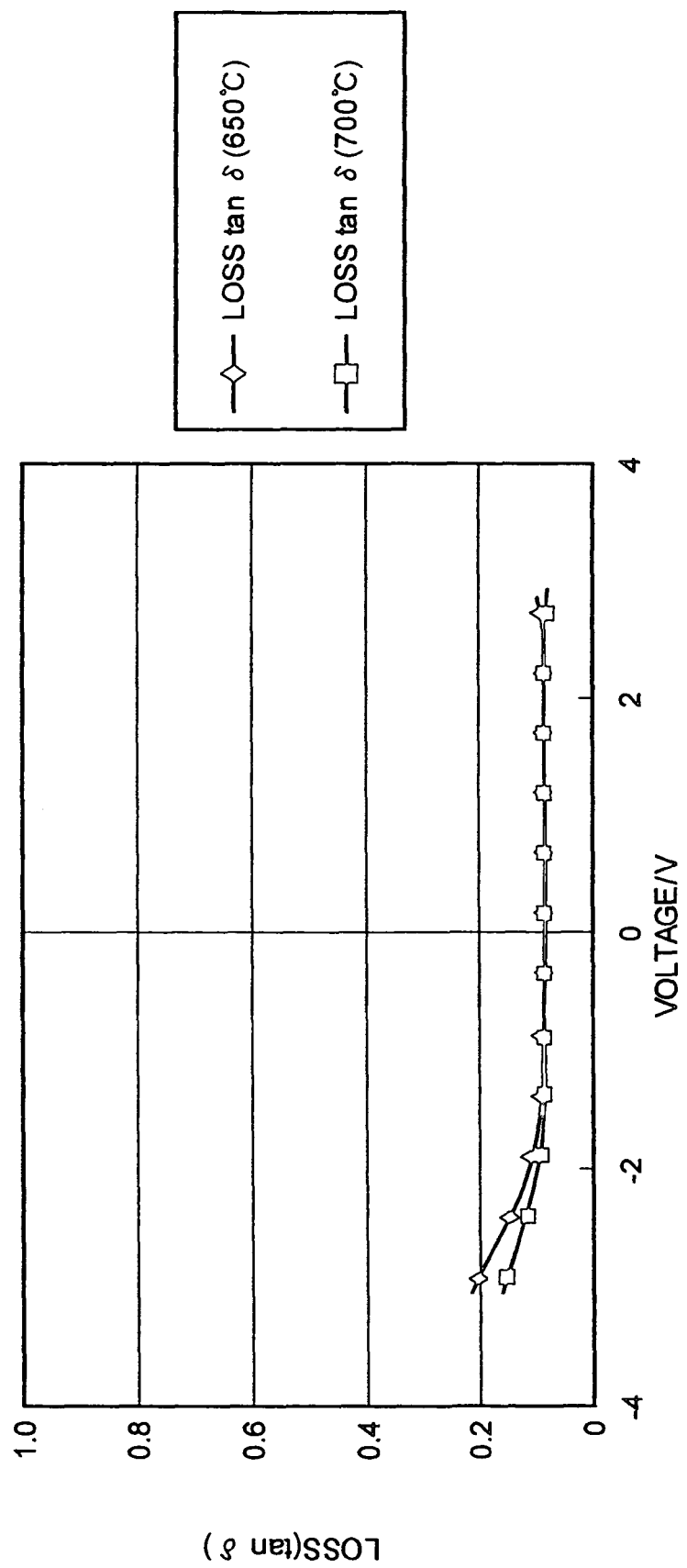
FIG. 7 is a graph of the results of loss (tan δ) measurement of BST crystallized films formed by use of the solution prepared in Synthesis Example 1.

As is obvious from FIG. 7, both of the high-dielectric-constant layers (crystallized films) obtained when the heat treatment and the recovery annealing were performed at 650° C. or 700° C., exhibited the loss as low as about 0.1 at around −2V to 2V.

The measurement of the loss (tan δ) was performed in the same manner with the capacitor formed in the evaluation of relative dielectric constant by employing the solution prepared in Synthesis Example 3. The obtained results are shown in FIG. 39.

The measurement was performed in the same manner with the capacitor obtained by performing the heat treatment and the recovery annealing not at 600° C. but at 550° C. for improving the crystallinity. The results are shown in FIG. 39.

Figure 39:
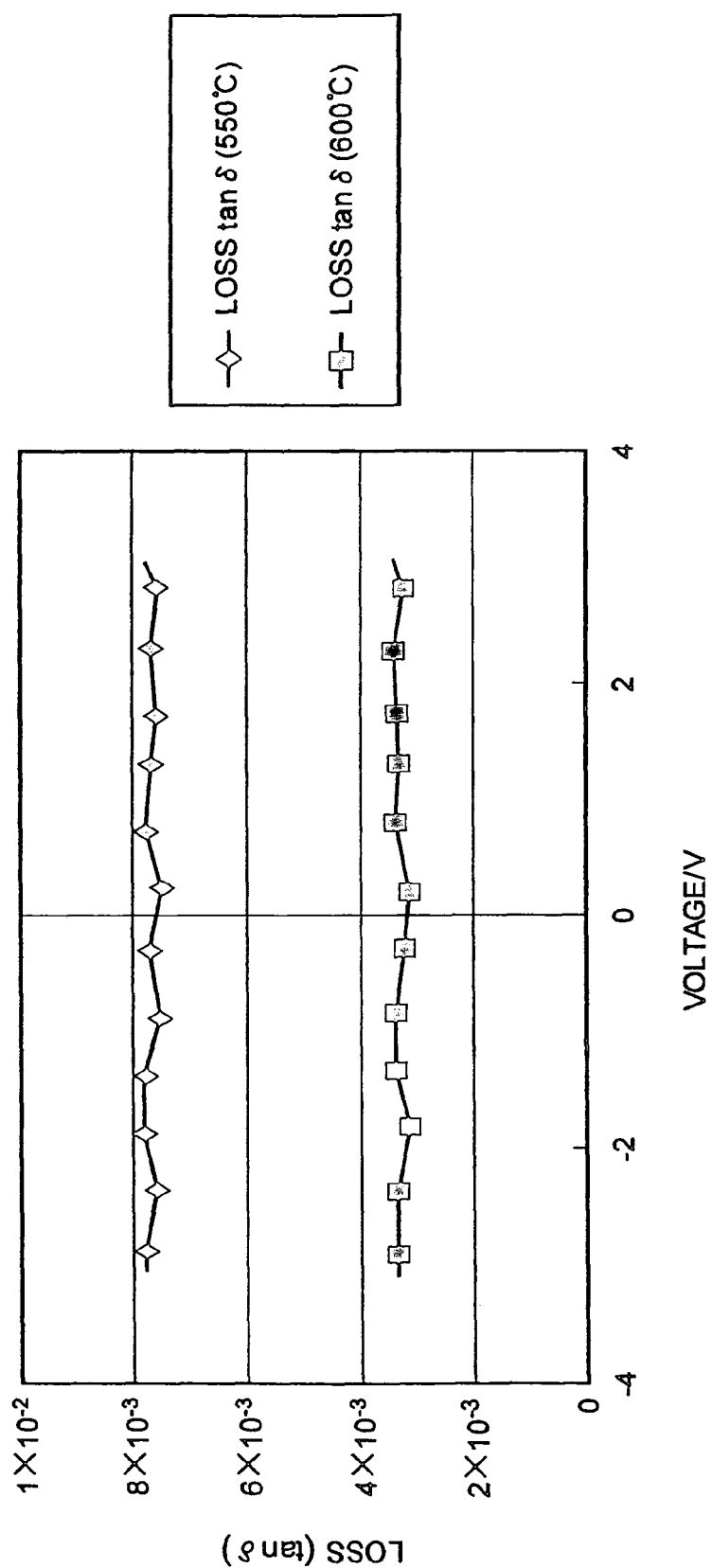
FIG. 39 is a graph of the results of loss (tan δ) measurement of SBT coat films formed by use of the solution prepared in Synthesis Example 3.

As is obvious from FIG. 39, each of the high-dielectric-constant layers thus obtained exhibited the loss in the place of $10^{-3}$ at around −4 V to 4V, that is, the loss was extremely small.

(Evaluation of Leakage Current Measurement)

The leakage current measurement ($A/cm^2$) was performed with the capacitor formed in the evaluation of relative dielectric constant measurement employing the solution prepared in Synthesis Example 3, by use of HP4284A Precision LCR Meter (product name; manufactured by Hewlett Packard). The obtained results are shown in FIG. 40.

As is obvious from FIG. 40, both of the high-dielectric-constant layers obtained with the heat treatment performed at 600° C., or at 550° C. exhibited the leakage current in the order of $10^{-8}$ per 1 $cm^2$, which is a low level of leakage.

The conceivable reason for this is that SBT has a fluorite structure.

In this experiment, SBT coat films having the fluorite structure were formed by baking SBT at comparatively low temperature of 550° C. or 600° C.

The low leakage level is the conceivable reason of the small loss. Based on the results of FIG. 38 to FIG. 40, conceivably, the coat film formed by performing baking at comparatively low temperatures while employing the SBT solution prepared in Synthesis Example 3 is suitable for manufacturing a capacitor for RF, which is particularly required to have low loss level.

Example 1

Figure 8:
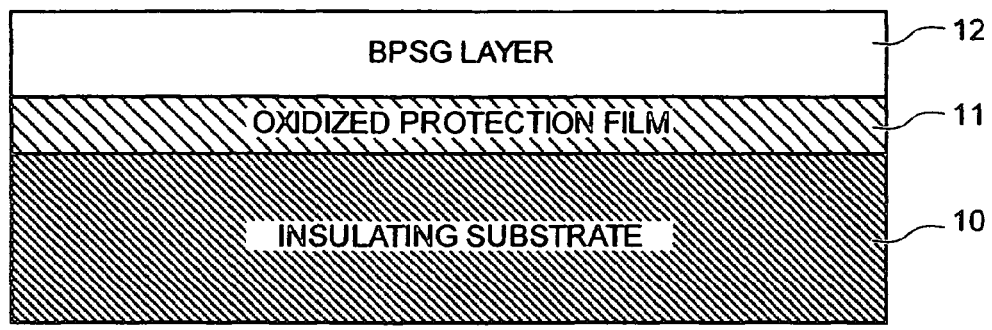
FIG. 8 is a cross sectional view of a laminate for explaining a manufacturing step of a thin-film capacitor according to Example 1 of the present invention.

As shown in FIG. 8, after marking on a silicon wafer (insulating substrate) 10, wet oxidation treatment was performed at 950° C., to form an oxidized protection film 11 of 100 nm on the insulating substrate 10. Subsequently, the substrate 10 was subjected to pre-washing, and then a BPSG layer 12 having a thickness of 120 nm was formed by ozone-TEOS. Then, the BPSG layer 12 was subjected to pre-washing in a flow chamber, and subsequently, subjected to flow at 850° C. for 20 minutes in nitrogen.

Figure 9:
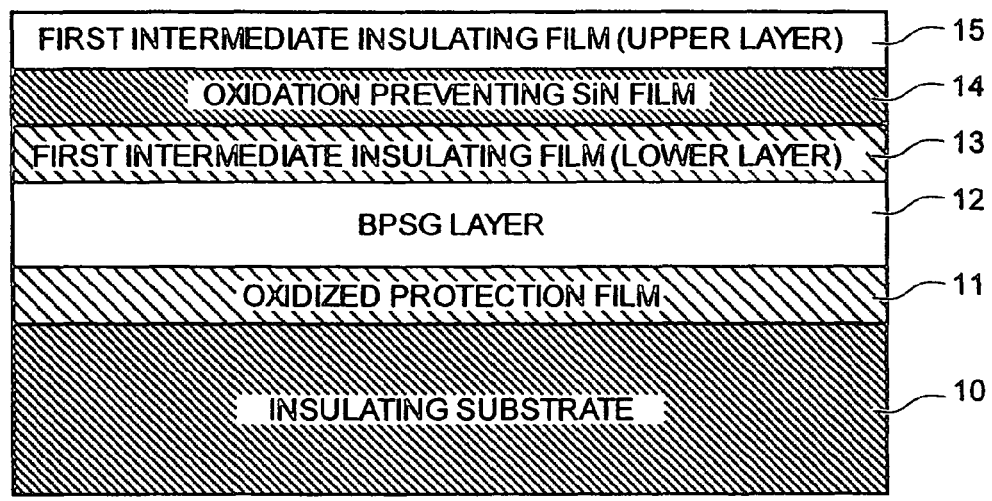
FIG. 9 is a cross sectional view of a laminate consecutive to that of FIG. 8 for explaining the manufacturing step of the thin-film capacitor according to Example 1 of the present invention.

Subsequently, after cleaning was performed, as shown in FIG. 9, a first intermediate insulating film (lower layer) 13 was formed by employing plasma TEOS (p-TEOS), by CVD (Chemical Vapor Deposition) to have film thickness of 100 nm. Then, post annealing was performed for 60 minutes at 750° C. in nitrogen. Then, nitrogen film (SiN) 14 of 100 nm was formed by CVD to prevent oxidation of the insulating film which may be caused by the influence of the high-dielectric-constant layer (oxidized film). Subsequently, a first intermediate insulating film (upper layer) 15 of 150 nm was formed by employing ozone-TEOS.

Figure 10:
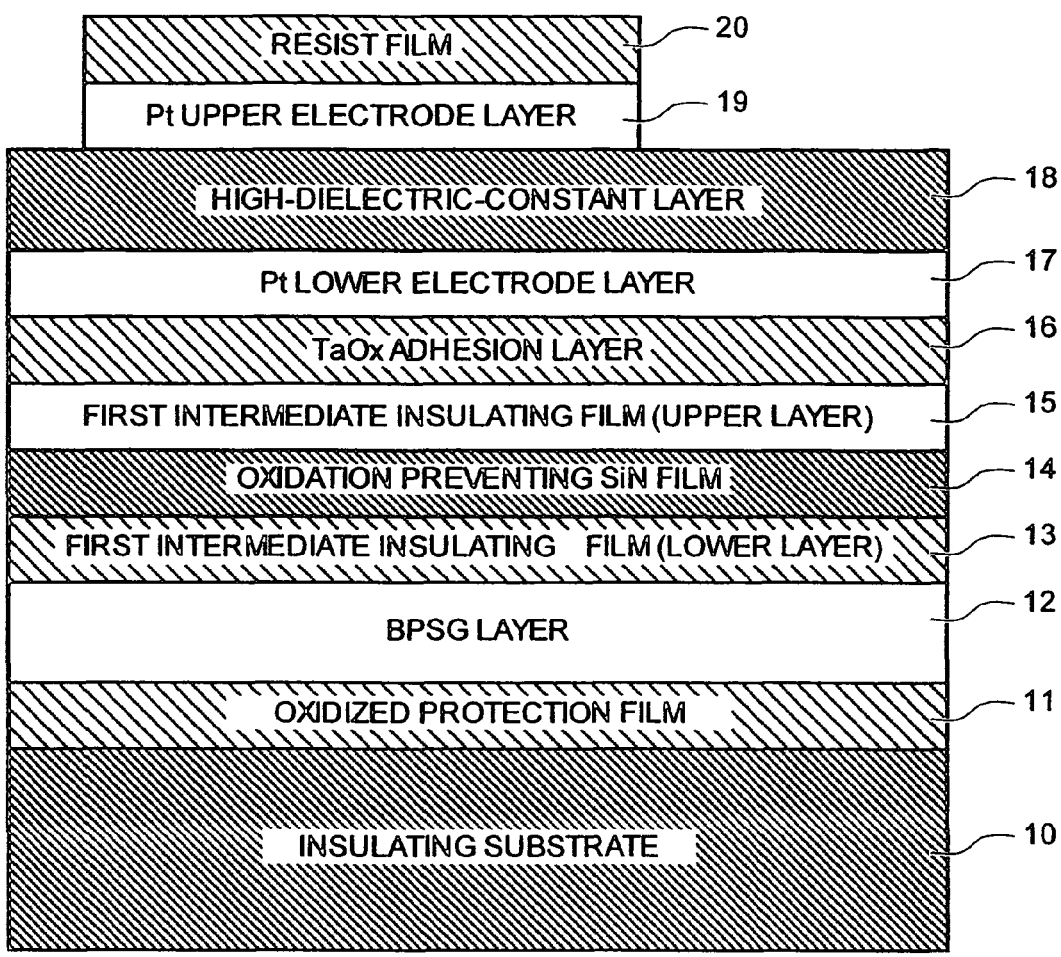
FIG. 10 is a cross sectional view of a laminate consecutive to that of FIG. 9 for explaining the manufacturing step of the thin-film capacitor according to Example 1 of the present invention.

Subsequently, an adhesion layer, a lower electrode, a high-dielectric-constant film, an upper electrode, and a resist were formed, and then the upper electrode was processed. The steps thereof will be explained with reference to FIG. 10.

An adhesion layer 16 having a thickness of 50 nm was formed on the first intermediate insulating film 15, by reactive sputtering employing tantalum oxide. A lower platinum electrode layer 17 of 150 nm was formed on the adhesion layer 16 by sputtering. Since platinum has a low reactivity, the platinum layer may be exfoliated in the following steps unless a layer which enhances adhesion such as of tantalum oxide or titanium oxide was formed therebeneath, and the platinum was laminated on such a lower layer (adhesion layer) which enhances contact. The sol-gel coating solution prepared in Synthesis Example 1 for forming $Ba_xSr_{1-x}TiO_3$ (x=0.6) was applied onto the lower platinum electrode layer 17 by spin coating for one second at 500 rpm, and subsequently for 30 seconds at 2000 rpm by use of a spin coater, and pre-baking was performed for 30 minutes at 600° C. The operations from the coating to the pre-baking were repeated three times, and then, heat treatment was performed for 60 minutes at 700° C., in the atmosphere of oxygen, to enhance the crystallinity of the BST film. As a result, a BST crystallized film (high-dielectric-constant layer 18) of about 100 nm was obtained. Subsequently, an upper platinum electrode layer 19 was formed by sputtering to have a thickness of 200 nm. A first resist film 20 was formed on the upper platinum electrode layer 19. After a photolithography step, the upper platinum electrode layer 19 was patterned by an etching treatment (by use of an etcher manufactured by Tegal Corporation, product name: ferroelectric/electrode etcher 6540HRe) employing an etching gas which includes Ar (argon) or Cl (chlorine) as a primary component (HBr and $CHF_3$ may also be contained), and a part of the lower layer which was the high-dielectric-constant layer 18 was exposed. That is, the product was formed in a stepped shape in which the upper electrode was narrower than the lower electrode.

Figure 11:
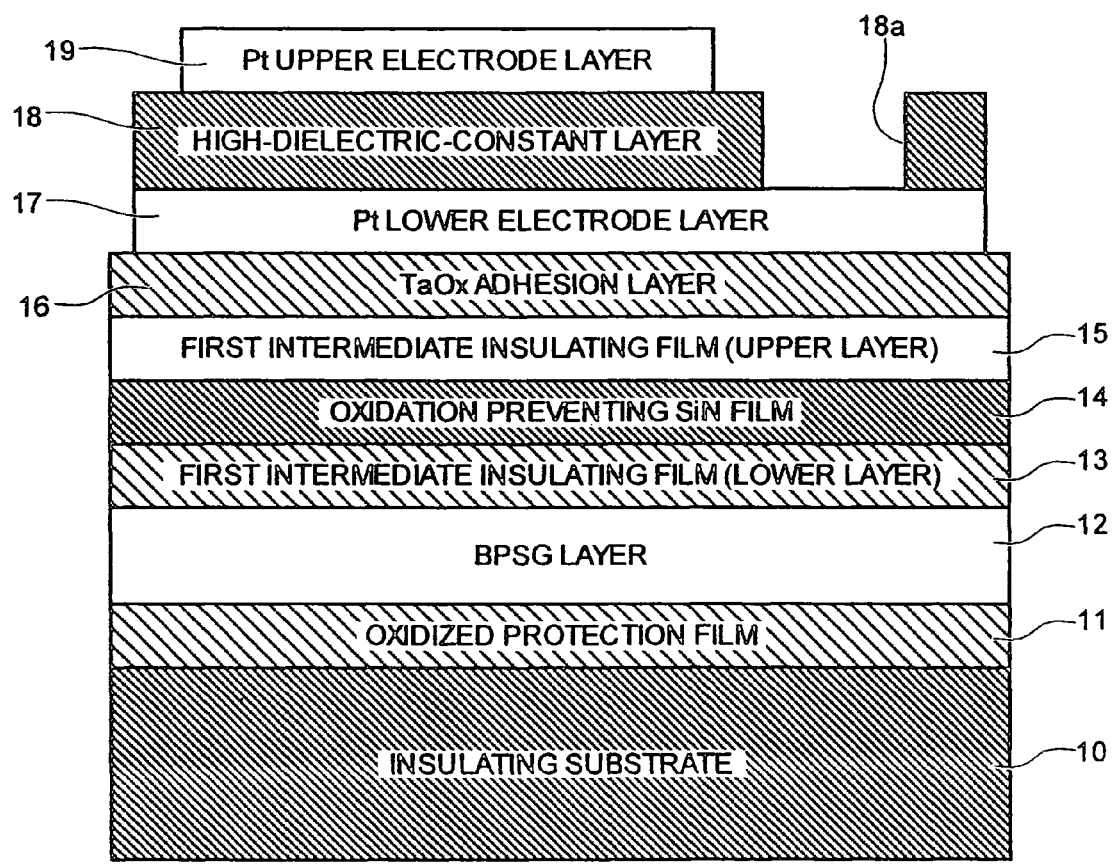
FIG. 11 is a cross sectional view of a laminate consecutive to that of FIG. 10 for explaining the manufacturing step of the thin-film capacitor according to Example 1 of the present invention.

Subsequently, the residue of the resist film 20 was removed by ashing. Then, a second resist film (not shown) was formed and patterned. With the resist film as a mask, the high-dielectric-constant layer 18 and the lower platinum electrode layer 17 were etched at one time by use of the etcher of Tegal, to obtain a desired size and a shape. Then, the residual resist was removed by ashing, and a third resist film (not shown) was formed and patterned. With the third resist film as a mask, etching was performed by the etcher of Tegal, and as shown in FIG. 11, an opening 18a, which reached the lower platinum electrode 17, was formed at the exposed portion of the high-dielectric-constant layer 18. Then, the residual resist was removed by ashing. In order to recover the damage imparted in the successive etching, annealing was performed for 30 minutes at 750° C. in the atmosphere of oxygen.

As described above, a stepped shape in which the upper electrode is narrower than the lower electrode has been exemplified. There are two reasons therefor. One reason therefor is, as described later, to draw the connector of the lower electrode lead to above as well as the connector of upper electrode. Another reason therefor is to enhance the reliability of the capacitor by making the upper platinum electrode layer 19 narrower than the lower platinum electrode layer 17 so as to avoid to use as a capacitor the surface of the high-dielectric-constant layer 18 which has etched and received damage.

Figure 12:
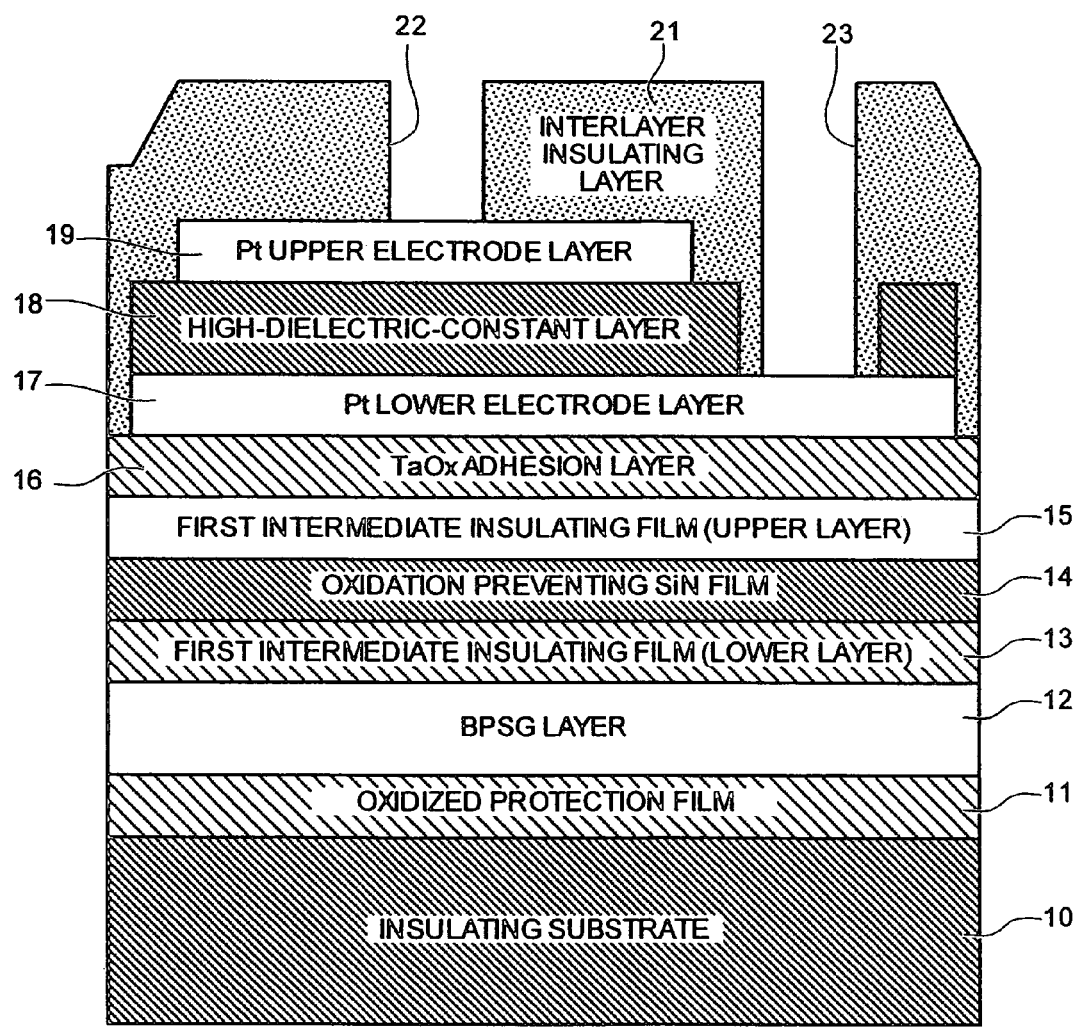
FIG. 12 is a cross sectional view of a laminate consecutive to that of FIG. 11 for explaining the manufacturing step of the thin-film capacitor according to Example 1 of the present invention.

Subsequently, as shown in FIG. 12, an interlayer insulating layer 21 was formed in a thickness of 300 nm by p-CVD employing TEOS. A fourth resist film (not shown) was formed on the insulating layer and patterned by photolithography to have a predetermined pattern. With the fourth resist film as a mask, the interlayer insulating layer 21 was etched to form a first contact hole 22 at the upper side of the upper platinum electrode layer 19, and form a second contact hole 23 situated at the opening 18a of the lower platinum electrode layer 17. Then, recovery annealing was performed for 30 minutes at 750° C. in the atmosphere of oxygen.

Figure 13:
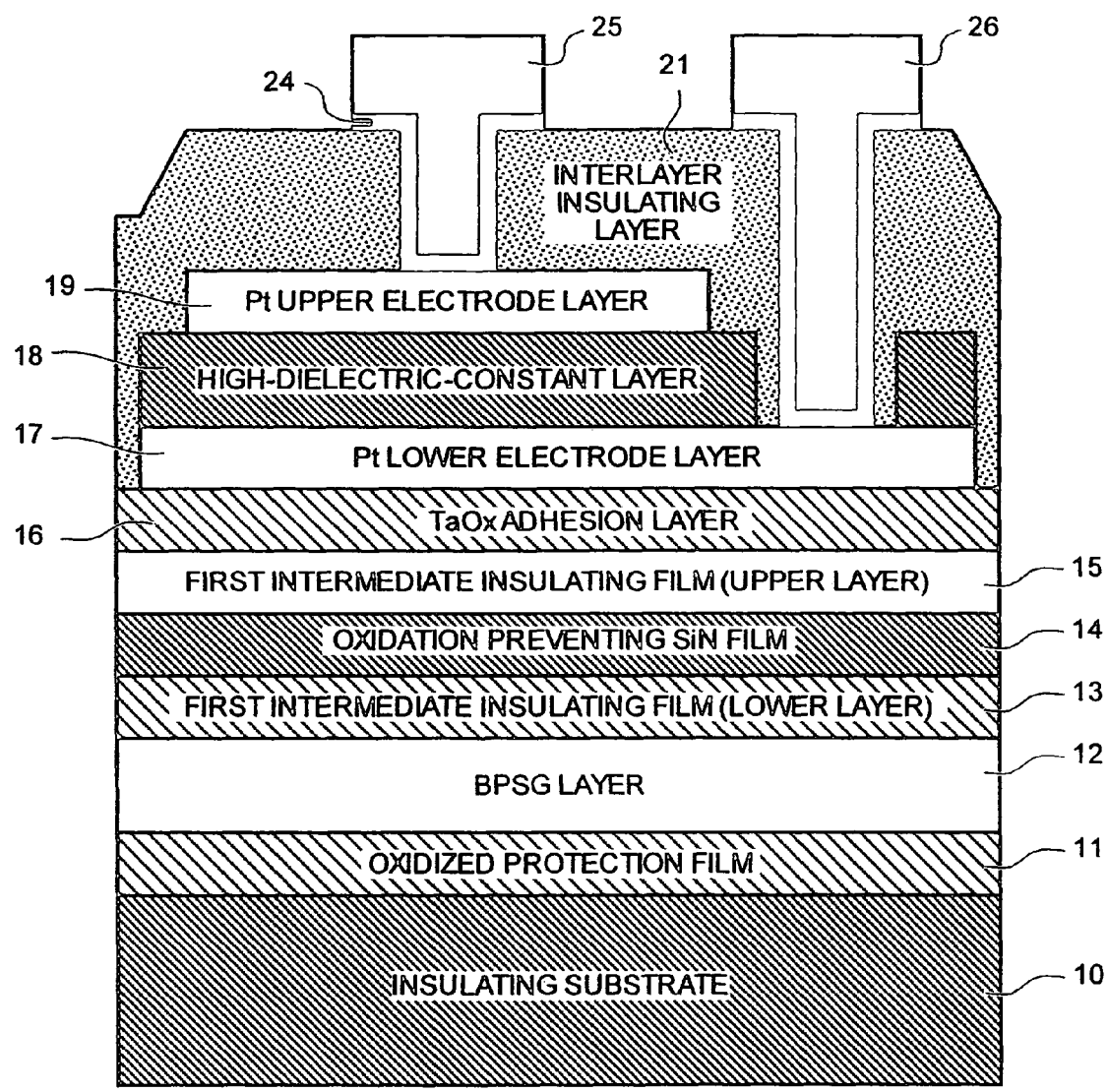
FIG. 13 is a cross sectional view of a laminate consecutive to that of FIG. 12 for explaining the manufacturing step of the thin-film capacitor according to Example 1 of the present invention.
Figure 14:
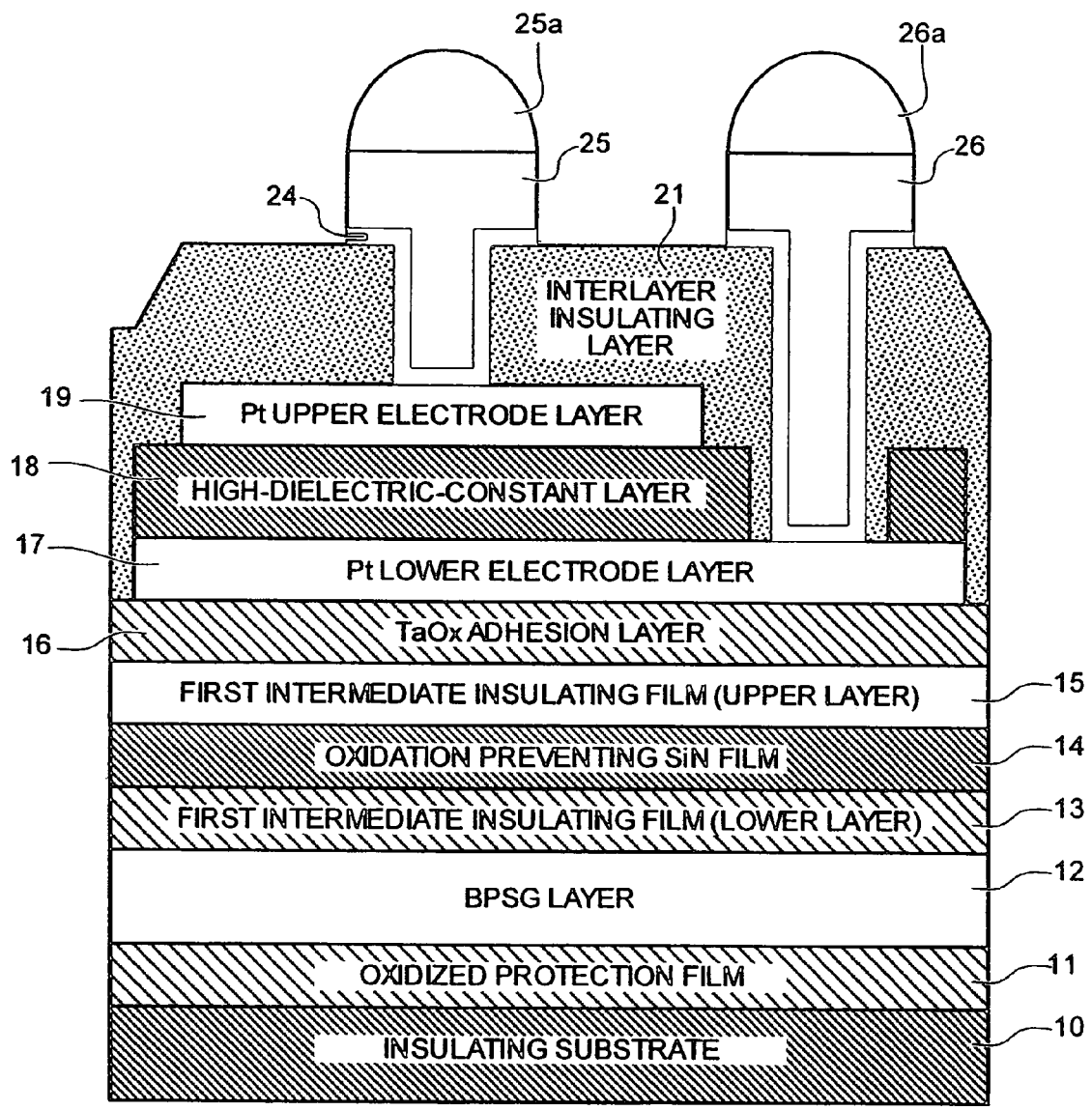
FIG. 14 is a cross sectional view of a laminate of a thin-film capacitor after formation, according to Example 1 of the present invention.

Then, as shown in FIG. 13, a TiN film was formed on each of the inner surface of the first contact hole 22 and the second contact hole 23. Subsequently, a barrier film 24 which had been patterned by photolithography employing a photoresist was formed. Two barrier layers 24 were stacked by sputtering to have a thickness of 75 nm. The barrier films 24 were for preventing the platinum electrode from reacting, in the subsequent heat treatment, with aluminum which was then filled in the contact hole. Subsequently, aluminum of 500 nm was formed by sputtering to fill each of the contact holes 22 and 23. The aluminum was etched after photolithography to form an upper electrode connector 25 and a lower electrode connector 26. As shown in FIG. 14, bumps 25a and 26a were formed on the connectors 25 and 26 respectively.

The back surface of the silicon substrate in which the laminate was formed as described above was subjected to back-grind and back-etching to be thinned to about 30 μm, and the substrate was further subjected to dicing to obtain a thin-film capacitor.

The thin-film capacitor was embedded into a packaging substrate as a flip chip, to obtain a high-density packaging substrate.

Example 2

Figure 15:
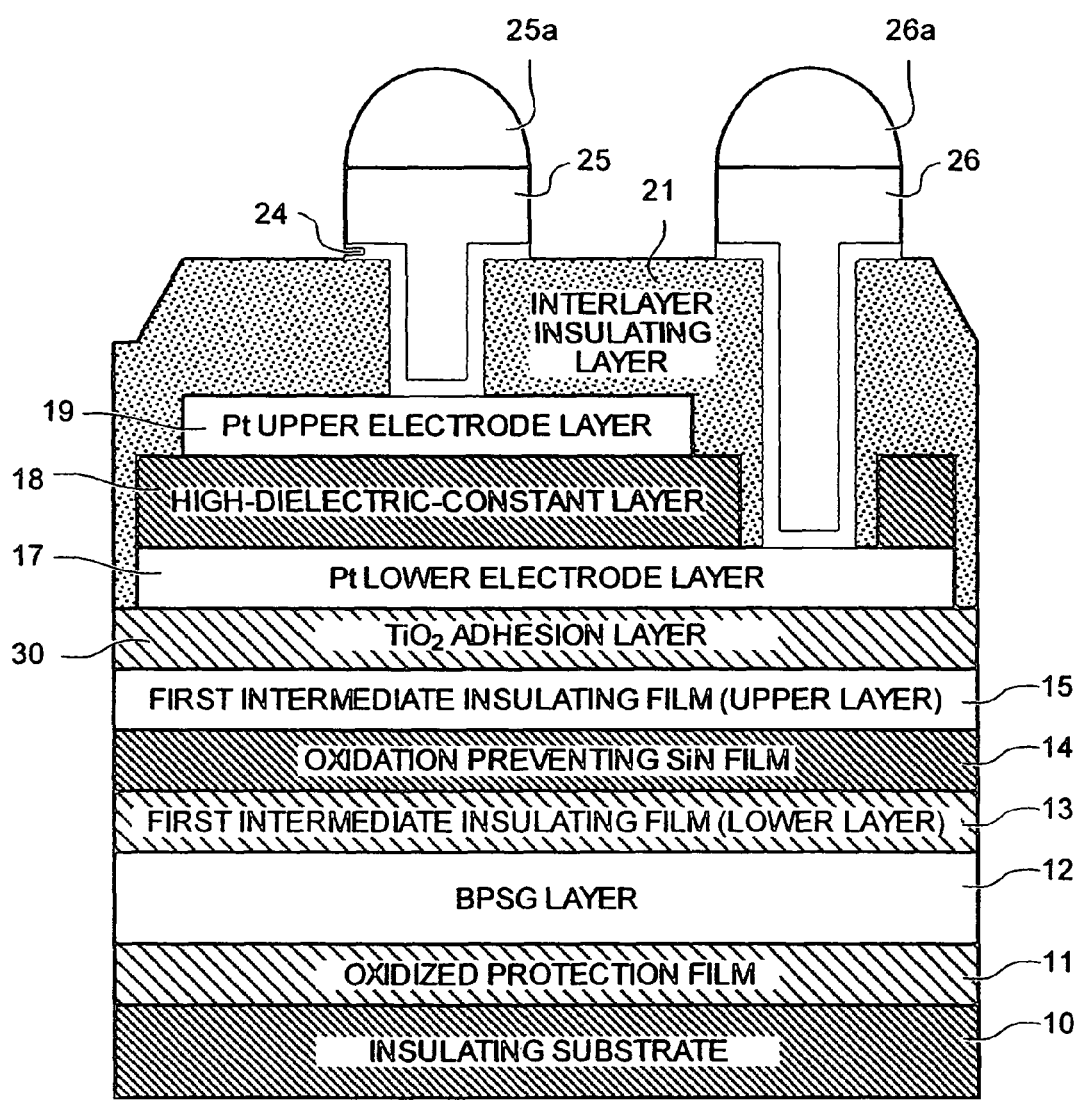
FIG. 15 is a cross sectional view of a laminate of a thin-film capacitor after formation, according to Example 2 of the present invention.

The second of the present invention will be explained with reference to FIG. 15. The characteristic feature of Example 2 resides in, as shown in FIG. 15, that the adhesion layer 16 comprising $TaO_x$ in Example 1 is replaced by a adhesion layer 30 comprising $TiO_2$. By sputtering, 40 nm of Ti was formed on the first intermediate insulating film 15, which was then annealed for 60 minutes at 750° C. in the atmosphere of oxygen to oxidize Ti, to obtain the adhesion layer 30. Except that the adhesion layer was replaced as described above, a thin-film capacitor was obtained in the same manner as in Example 1. The thin-film capacitor thus obtained was embedded into a packaging substrate as a flip chip in the same manner as in Example 1, and a high-density packaging substrate was obtained.

Example 3

Figure 16:
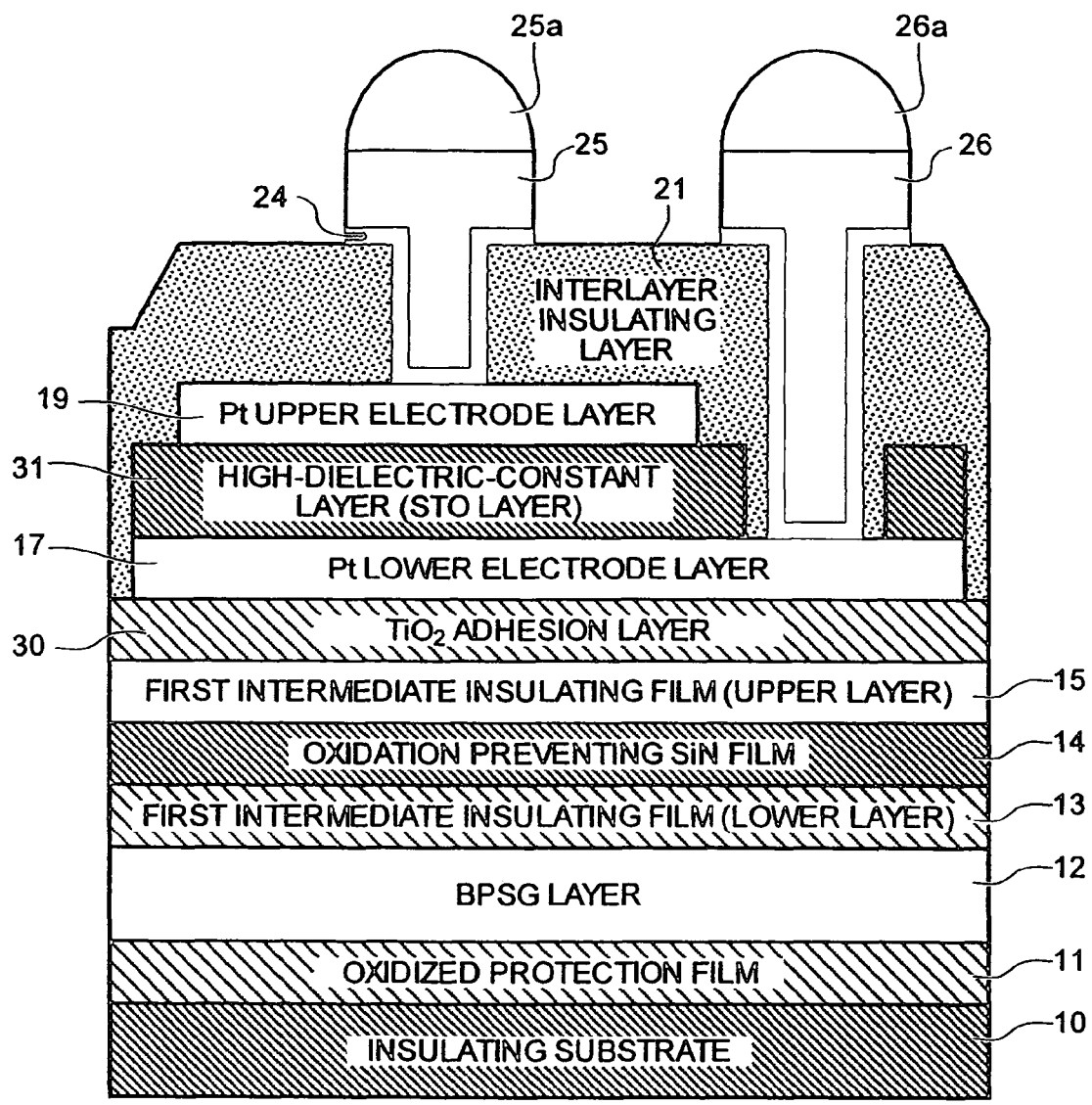
FIG. 16 is a cross sectional view of a laminate of a thin-film capacitor after formation, according to Example 3 of the present invention.

The third example of the present invention will be explained with reference to FIG. 16. The characteristic feature of Example 3 resides in that the high-dielectric-constant layer 18 of Example 2 comprising BST crystallized film which is shown in FIG. 15, is replaced by a high-dielectric-constant layer 31 comprising "an STO crystallized film represented by a rational formula $SrTiO_3$" formed by a sol-gel coating solution, which had been prepared in Synthesis Example 2, for forming SrTiO3. Except that the high-dielectric-constant layer was thus replaced, a thin-film capacitor was obtained in the same manner as in Example 2. The thin-film capacitor thus obtained was embedded into a packaging substrate as a flip chip in the same manner as in Example 2, and a high-density packaging substrate was obtained.

Example 4

The fourth example of the present invention will be explained with reference to FIG. 17 and FIG. 18. The characteristic feature of Example 4 resides in that copper is employed as a conductive material for forming the connectors.

The manufacturing steps of a thin-film capacitor according to Example 4 are the exactly same as that of Example 1 up to the contact hole formation step which is shown in FIG. 12.

Therefore, in the explanation of the manufacturing method Example 4, merely the subsequent steps will be explained for avoiding redundant explanations and for helping understanding of the present example.

Figure 17:
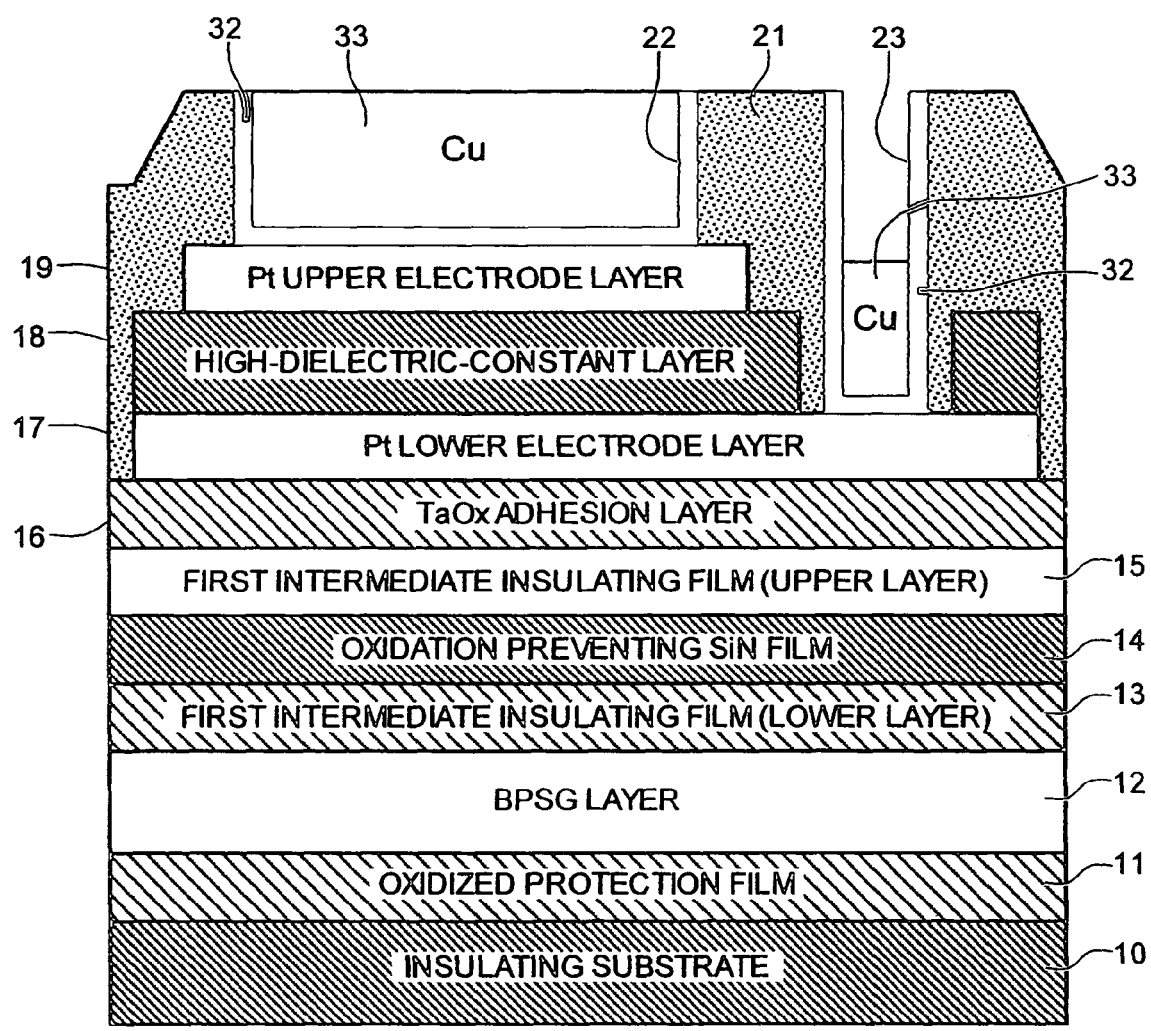
FIG. 17 is a cross sectional view of a laminate for explaining a method for manufacturing a thin-film capacitor according to Example 4 of the present invention.

After the formation step of contact holes 22 and 23 of Example 1 shown in FIG. 12, as shown in FIG. 17, a TaN film was formed on the each inner surface of the first contact hole 22 and the second contact hole 23. Subsequently, a barrier film 32 which had been patterned by photolithography employing a photoresist was formed on the each surface. The film 32 was formed by sputtering to have a thickness of 50 nm. The barrier film 32 was provided to prevent deterioration of insulating property of the insulating layer 21 which may be caused when the copper to be filled in the contact hole was diffused to the intermediate insulating layer 21. Subsequently, anti-plate resist pattern was formed. Then, 300 nm of copper was formed by plating so as to fill in each of the contact holes 22 and 23. As a result, an upper electrode connector 33 and a lower electrode connector 34 were formed.

The plating for filling the copper may be an electrolysis plating or an electroless plating both of which are publicly known.

After the copper connectors 33 and 34 were formed in the manner as described above, the resist was removed, the silicon substrate on the back surface of the laminate thus formed was subjected to back-grind and back-etching to be thinned to about 30 μm, which was then followed by dicing, to obtain a thin-film capacitor.

Figure 18:
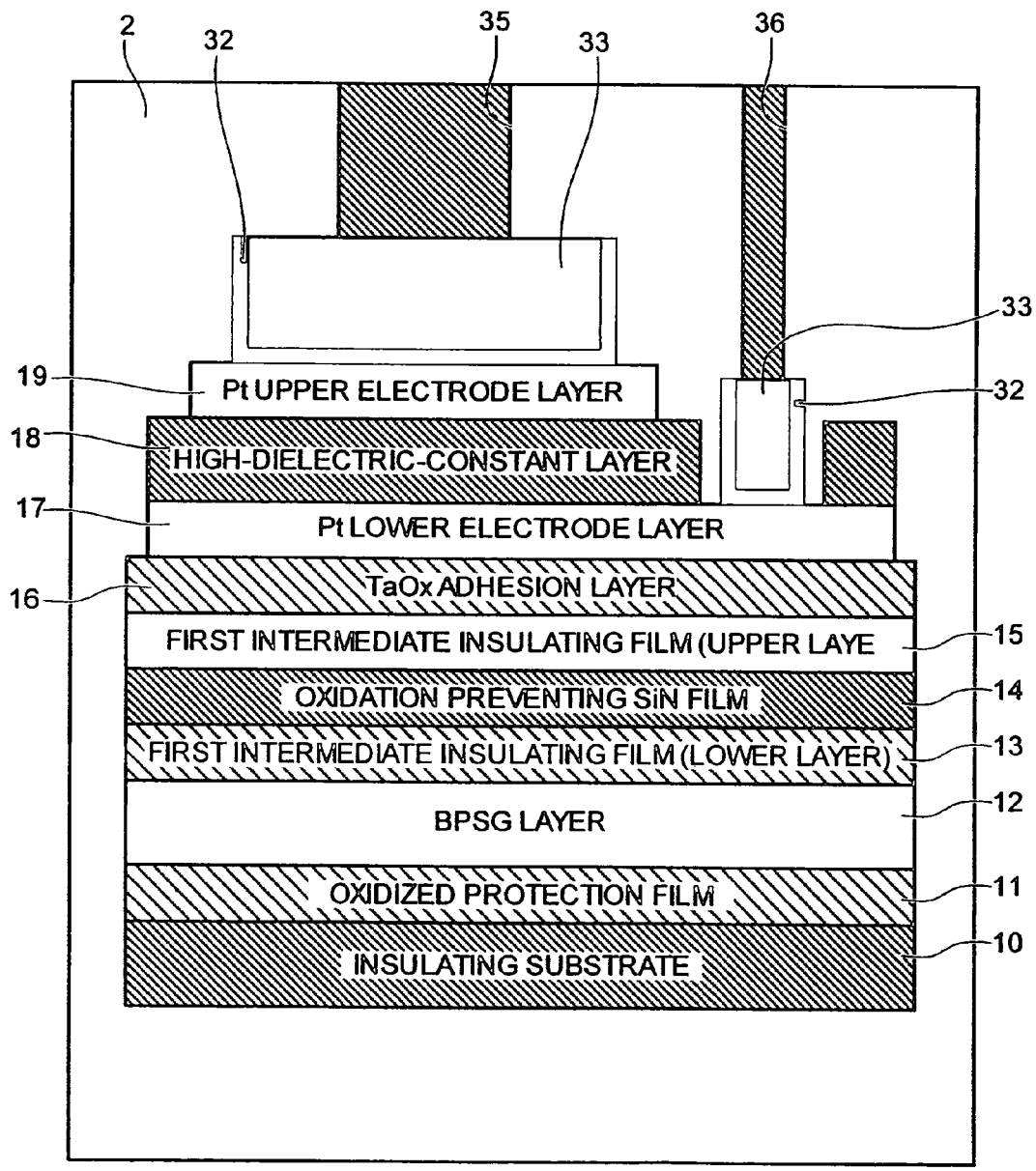
FIG. 18 is a cross sectional view of a laminate for explaining configuration of contacting of the thin-film capacitor according to Example 4 of the present invention incorporated into a high-density packaging substrate.

When the thin-film capacitor of the present example is to be embedded into an interlayer insulating layer 2 (FIG. 1) of a packaging substrate, as shown in FIG. 18, vias 35 and 36 are vertically provided in the interlayer insulating layer 2 of respective copper connectors 33 and 34. After vias 35 and 36 were vertically provided as described above, a high-density packaging substrate was obtained by performing necessary wiring operations. According to the thin-film capacitor of the present example, as shown in FIG. 18, copper layers (copper connectors 33 and 34) are provided at the position where the via 35 and 36 serving as upper and lower electrodes were perforated. Therefore, formation of bumps was not required, and the packaging can be performed at low cost.

Example 5

Figure 19:
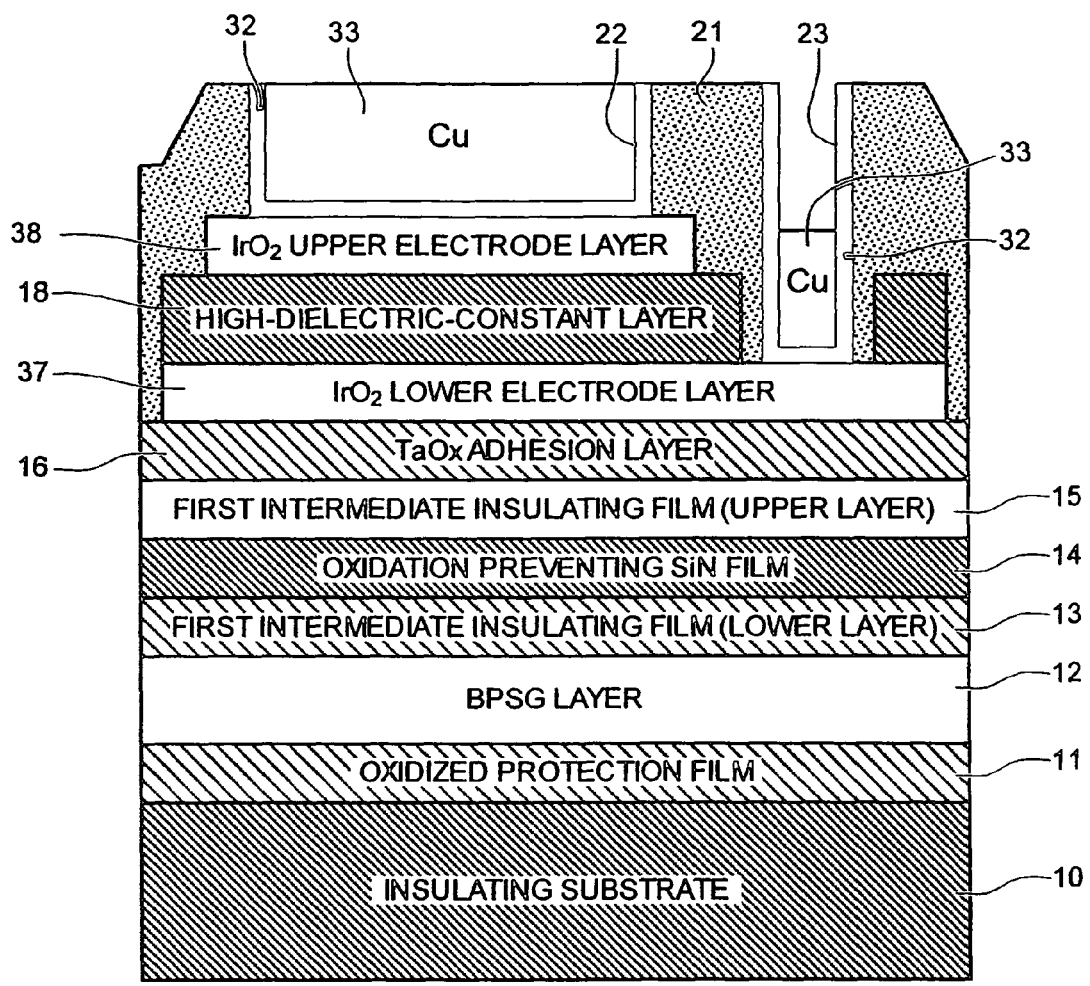
FIG. 19 is a cross sectional view of a laminate for explaining a method for manufacturing a thin-film capacitor according to Example 5 of the present invention.

The fifth Example of the present invention will be explained with reference to FIG. 19. The characteristic feature of Example 5 resides in that $IrO_2$ is employed as the conductive material for forming the upper and the lower electrode layers.

In the formation of the electrode layers, in the same manner as in the previous Example 1, an adhesion layer 16 was firstly formed to have a thickness of 50 nm by reactive sputtering employing tantalum oxide, on the first intermediate insulating layer 15. On the adhesion layer 16, $IrO_2$ was deposited by sputtering to form a lower $IrO_2$ electrode layer 37 of 150 nm. Since $IrO_2$ has low reactivity as platinum, the layer may be exfoliated in the subsequent steps unless a layer which enhances the adhesion such as that of tantalum oxide and titanium oxide is formed as its lower layer (adhesion layer) which enhances adhesion, on which the $IrO_2$ layer is then laminated. The sol-gel coating solution, which had been prepared in Synthesis Example 1, for forming $Ba_xSr_{1-x}TiO_3$ (x=0.6), was applied onto the lower $IrO_2$ electrode layer 37 by carrying out spin coating for one second at 500 rpm, and subsequently for 30 seconds at 2000 rpm by employing a spin coater, and pre-baking was then performed for 30 minutes at 600° C. After the operations from the coating to the pre-baking were repeated three times, a heat treatment was performed for 60 minutes at 700° C. in the atmosphere of oxygen, for improving the crystallinity of the BST film. As a result, about 100 nm of a BST crystallized film (high-dielectric-constant layer 18) was obtained. Subsequently, similarly to the formation of the lower IrO$_2$ electrode layer 37, an upper IrO$_2$ electrode layer 38 was formed by sputtering to have a thickness of 200 nm. A first resist film was formed on the upper IrO$_2$ electrode layer 38. After performing a photolithography step, the upper IrO$_2$ electrode layer 38 was patterned by use of the etcher of Tegal, such that a part of the lower high-dielectric-constant layer 18 was exposed. That is, a stepped shape, in which the upper electrode was narrower than the lower electrode, was obtained. The subsequent steps were performed in the same manner as in Example 1.

Example 6

The sixth example of the present invention will be explained with reference to FIG. 13. The characteristic feature of Example 6 resides in that a thin-film capacitor is attached to the surface of a packaging substrate by wire bonding instead of incorporating the same into the high-density packaging substrate.

The present example was carried out in the same manner as in Example 1, except that bumps 25a and 26a were not formed in the capacitor shown in FIG. 13 in which an upper electrode connector 25 and a lower electrode connector 26 were formed. The back surface of the silicon substrate was subjected to back-grind and back-etching to be thinned to about 30 μm, which was then followed by dicing, to obtain a thin-film capacitor. Subsequently, the thin-film capacitor was connected with other components by wire bonding on the surface of a packaging substrate. As a result, a packaging substrate on which the thin-film capacitor was packaged on the surface was obtained.

Example 7

Figure 20:
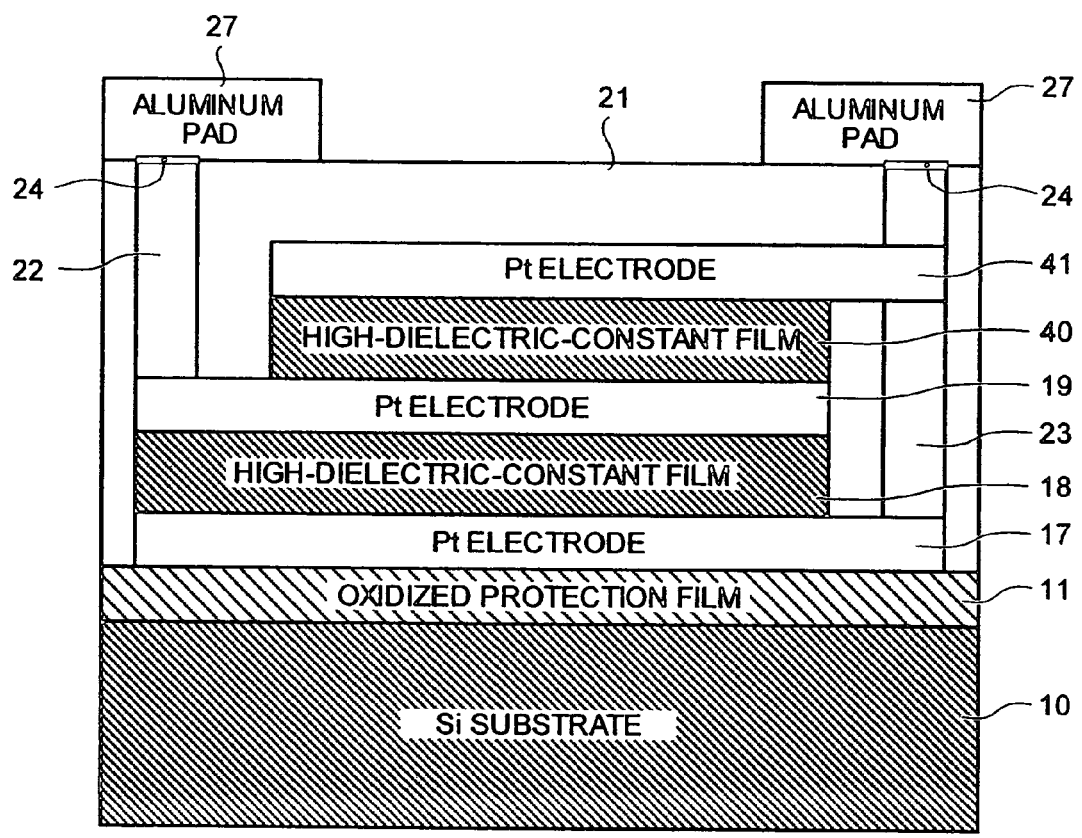
FIG. 20 is a cross sectional view of a laminate for explaining a method for manufacturing a thin-film capacitor according to Example 7 of the present invention.

As shown in FIG. 20, after a silicon wafer (insulating substrate) 10 was subjected to marking, wet oxidation treatment was performed at 950° C., and 100 nm of an oxidized protection film 11 was formed on the insulating substrate 10. Subsequently, a lower electrode, a high-dielectric-constant film, an upper electrode, and a resist will be formed, and subsequently the upper electrode will be processed. The steps thereof will be explained with reference to FIG. 20.

A lower platinum electrode 17 of 60 nm was formed on the oxidized protection film 11 by sputtering. A sol-gel coating solution, which had been prepared in Synthesis Example 1, for forming Ba$_x$Sr$_{1-x}$TiO$_3$ (x=0.6), was applied onto the lower platinum electrode layer 17 by carrying out spin coating for one second at 500 rpm, subsequently for 30 seconds at 2000 rpm by employing a spin coater, and pre-baking was then performed for 30 minutes at 600° C. After the operations from the coating to the pre-baking were repeated three times, a heat treatment was performed for 60 minutes at 700° C. in the atmosphere of oxygen, for improving the crystallinity of the BST film. As a result, about 100 nm of a BST crystallized film (high-dielectric-constant layer 18) was obtained. Subsequently, an upper platinum electrode layer 19 was formed to have a thickness of 100 nm by sputtering. A first resist film 20 was formed on the upper platinum electrode layer 19. After performing a photolithography, the upper platinum electrode layer 19 was patterned by an etching treatment (by use of an etcher manufactured by Tegal, product name: ferroelectric/electrode etcher 6540HRe) employing an etching gas which contained Ar (argon) or Cl(chlorine) as a primary component (HBr and CHF$_3$ may also be contained), and a part of the lower layer which was the high-dielectric-constant layer 18 was exposed. That is, a stepped shape, in which the upper electrode was narrower than the lower electrode, was obtained.

Subsequently, the residue of the resist film 20 was removed by ashing. Then, a second resist film (not shown) was formed, and the resist film was patterned. With the film as a mask, the high-dielectric-constant layer 18 and the lower platinum electrode 17 were etched at one time by use of the etcher of Tegal, to obtain a desired size and a shape. Then the residual resist was removed by ashing, and a third resist film (not shown) was formed and patterned. With the third resist film as a mask, etching was performed by the etcher of Tegal, and as shown in FIG. 20, an opening, which reached the lower platinum electrode 17, was formed. Then, the residual resist was removed by ashing. A second high-dielectric-constant layer 40 was subjected to spin coating in the same manner as the first layer, subjected to baking in the same manner, and subjected to etching treatment by employing photolithography. In this procedure, as shown in FIG. 20, one end (left side in the drawing) was narrower than the first layer.

Subsequently, an interlayer insulating layer 21 was formed to have a film thickness of 300 nm by CVD employing p-TEOS. Then, etch-back was performed such that the surface of the second high-dielectric-constant layer 40 was exposed. As a result of the etch-back, side walls were formed from the second high-dielectric-constant layer, which reduces the possibility of the occurrence of a short circuit between the first layer and the second layer.

When the planarization by p-TEOS is not sufficient, an oxidized film of 2000 nm may be formed by CVD, which is then planarized by CMP and etched back, to expose the surface of the dielectric layer.

Subsequently, a platinum electrode 41 is formed by sputtering, and the electrode is patterned by photolithography and etched. Then, after performing recovery annealing for 30 minutes at 650° C. in the atmosphere of oxygen, an interlayer insulating layer 21 of 300 nm is formed by CVD employing p-TEOS. Vias are perforated at two positions from above the oxidized film to form vias 35 and 36. Platinum electrodes are deposited into the holes, and TiN barrier film 24 is formed on the uppermost surface by sputtering. Aluminum is deposited on the barrier film by sputtering, which is followed by photoresist coating, exposure, development, and etching, to form an aluminum pads 27 on the upper most surface. The above described steps are the capacitor forming steps shown in FIG. 20.

In practice, it is desirable to further form a passivation film for improving environment resistance.

Formation of the passivation film may be carried out by a method in which, for example, a Ta oxidized film, which serves as an adhesion layer of the PV (passivation) film, of 150 nm is formed on the structure shown in FIG. 20 by sputtering, 850 nm of an SiN film serving as the PV film is formed on the oxidized film by CVD, and then the PV film is etched to expose the pads.

In Example 7, the capacitor is made of a combination of two layers as described above. Therefore the capacitance of about two times that of a single layer may be obtained.

Example 8

In Example 8, the second laminate of Example 7 comprising a high-dielectric-constant layer and an electrode layer is made in two layers, that is, three high-dielectric-constant layers are formed.

The procedure of Example 7 was followed until the platinum electrode 41 was formed and recovery annealing treatment was performed. Then, a high-dielectric-constant layer 42 was formed in the same manner as the high-dielectric-constant layer 40, subsequently an interlayer insulating layer 21 of 300 nm was formed by CVD employing p-TEOS. Then, etch-back was performed such that the surface of the third high-dielectric-constant layer 42 was exposed. As a result of the etch-back, side walls were formed from the third high-dielectric-constant layer 42, and the possibility of short circuit between the second layer and the third layer was reduced. When the planarization by p-TEOS is not sufficient, an oxidized film of 2000 nm may be formed by CVD, which is then planarized by CMP and etched back, to expose the surface of the dielectric layer.

Subsequently, a platinum electrode 43 is formed by sputtering, and the electrode is patterned by photolithography and etched. Then, after performing recovery annealing for 30 minutes at 650° C. in the atmosphere of oxygen, an interlayer insulating layer 21 of 300 nm was formed by CVD employing p-TEOS. Vias were perforated at two positions from the upper side of the interlayer insulating layer 21 to form vias 35 and 36. Platinum electrodes were deposited into the holes, and TiN barrier film 24 was formed on the uppermost surface by sputtering. Aluminum is deposited on the barrier film by sputtering, and aluminum pads 27 are formed on the uppermost surface by carrying out photoresist coating, exposure, development, and etching. The above described steps are the capacitor forming steps shown in FIG. 21.

In practice, it is desirable to further form a passivation film for improving environment resistance.

Figure 21:
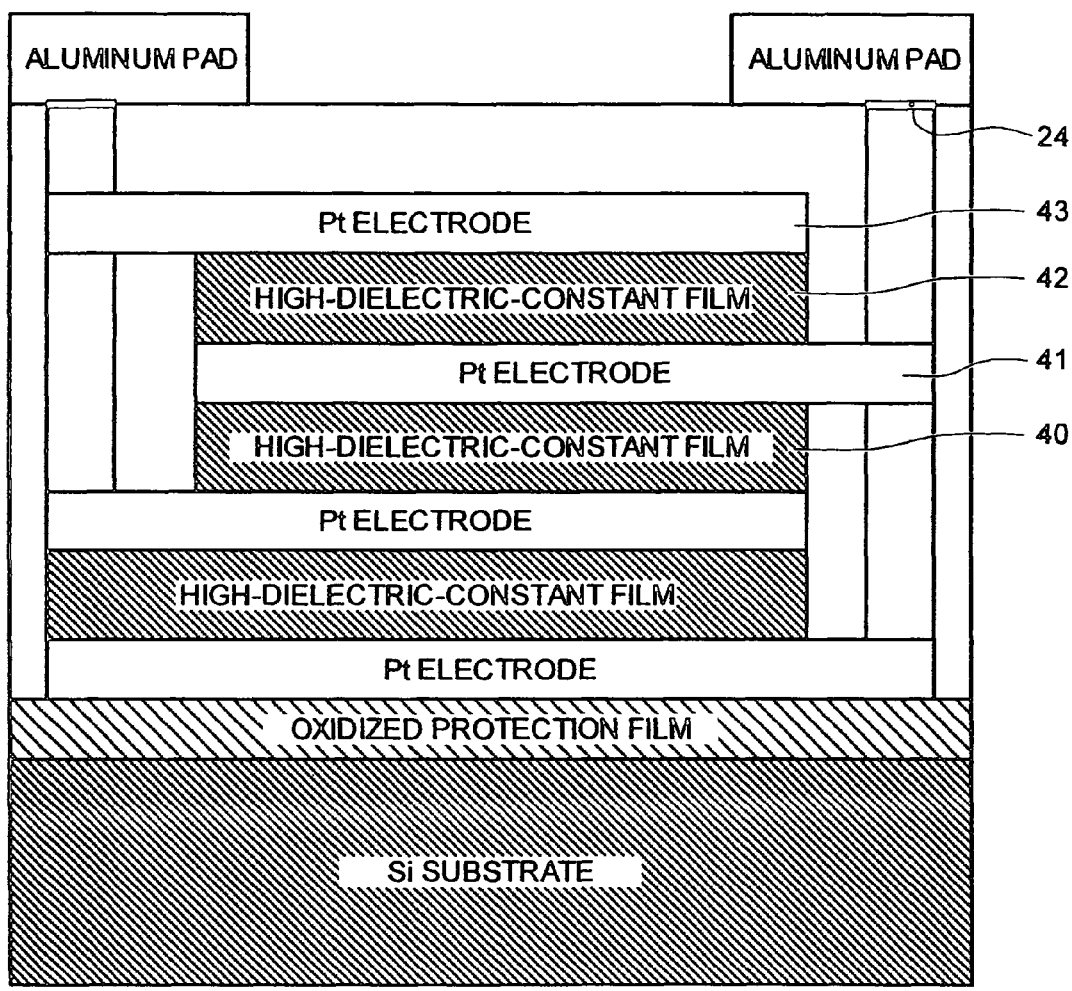
FIG. 21 is a cross sectional view of a laminate for explaining a method for manufacturing a thin-film capacitor according to Example 8 of the present invention.

Formation of the passivation film may be carried out by a method in which, for example, a Ta oxidized film as an adhesion layer of the PV (passivation) film, of 150 nm is formed on the structure shown in FIG. 21 by sputtering, 850 nm of an SiN film serving as the PV film is formed on the oxidized film by CVD, and then the PV film is etched to expose the pads.

In Example 8, the capacitor is made of a combination of three layers as described above. Therefore the capacitance of about three times that of a single layer may be obtained.

Example 9

In Example 9, the second laminate of Example 8 comprising high-dielectric-constant layers and an electrode layer was made in three layers, that is, four high-dielectric-constant layers were formed.

The procedure of Example 8 was followed until the platinum electrode 43 was formed and recovery annealing treatment was performed. Then, a high-dielectric-constant layer 44 was formed in the same manner as the high-dielectric-constant layer 42, subsequently an interlayer insulating layer 21 of 300 nm was formed by CVD employing p-TEOS. Then, etch-back was performed such that the surface of the fourth high-dielectric-constant layer 44 was exposed. As a result of the etch-back, side walls were formed from the fourth high-dielectric-constant layer 44, and the possibility of short circuit between the third layer and the fourth layer is lowered thereby. When the planarization by p-TEOS is not sufficient, about 2000 nm of an oxidized film may be formed by CVD, which is then planarized by CMP and etched back to expose the surface of the dielectric layer.

Subsequently, a platinum electrode 45 is formed by sputtering, and the electrode is patterned by photolithography and etched. Then, after performing recovery annealing for 30 minutes at 650° C. in the atmosphere of oxygen, an interlayer insulating layer 21 of 300 nm was formed by CVD employing p-TEOS. Vias were perforated at two positions from the upper side of the interlayer insulating layer 21 to form vias 35 and 36. Platinum electrodes were deposited into the holes, and TiN barrier films 24 were formed on the uppermost surface by sputtering. Aluminum was deposited on the barrier film by sputtering, and aluminum pads 27 were formed on the uppermost surface by carrying out photoresist coating, exposure, development, and etching. The above described steps are the capacitor forming steps shown in FIG. 22.

In practice, it is desirable to further form a passivation film for improving environment resistance.

Figure 22:
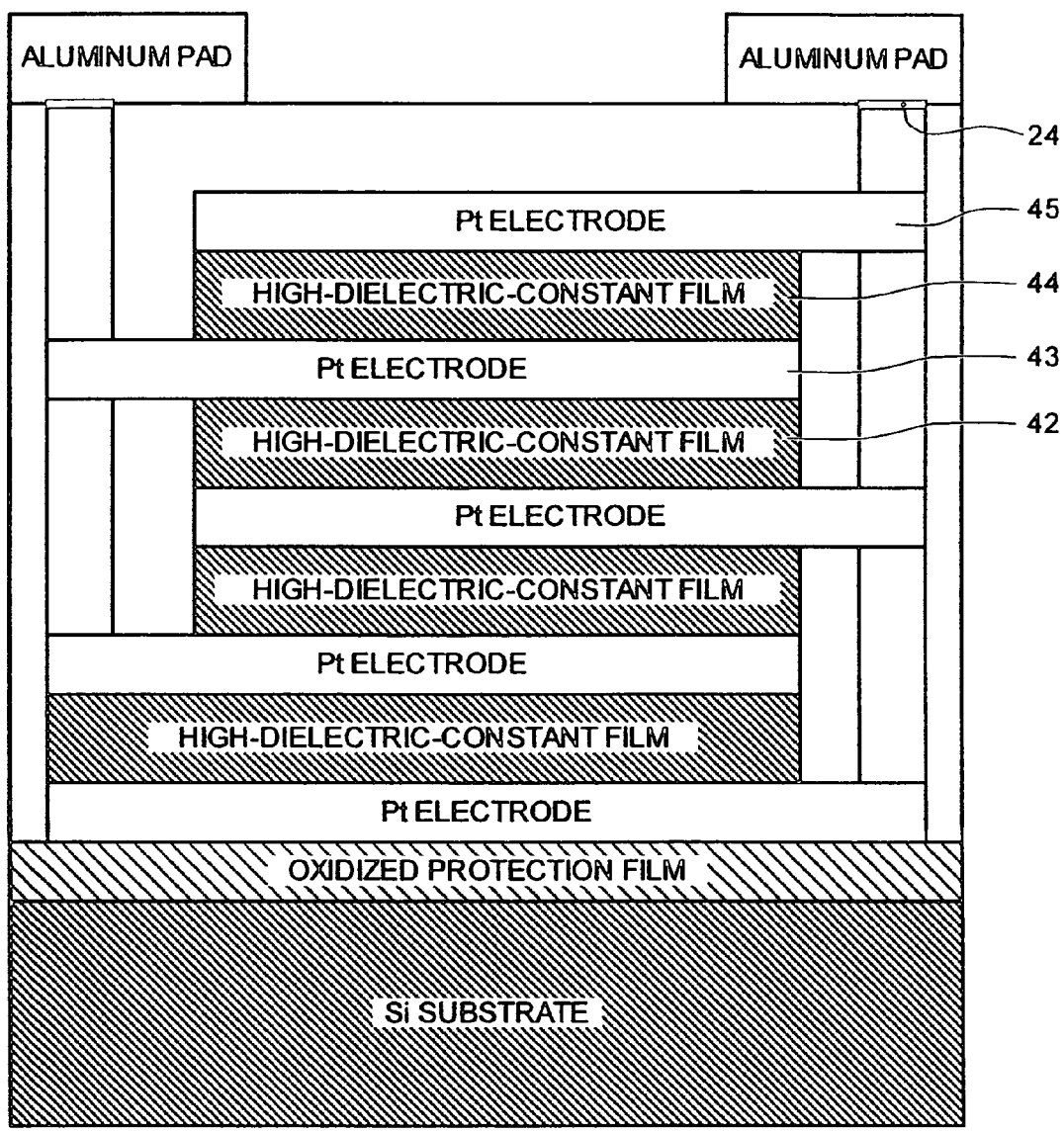
FIG. 22 is a cross sectional view of a laminate for explaining a method for manufacturing a thin-film capacitor according to Example 9 of the present invention.

Formation of the passivation film may be carried out by a method in which, for example, a Ta oxidized film, which serves as an adhesion layer of the PV (passivation) film, of 150 nm is formed on the structure shown in FIG. 22 by sputtering, 850 nm of a SiN film serving as the PV film is then formed on the oxidized film by CVD, and then the PV film is etched to expose the pads.

In Example 9, the capacitor is made of a combination of four layers as described above. Therefore the capacitance of about four times that of a single layer may be obtained.

Example 10

In Example 10, the second laminate of Example 9 comprising high-dielectric-constant layers and electrode layers is made in four layers, that is, five high-dielectric-constant layers are formed.

The procedure of Example 9 was followed until the platinum electrode 45 was formed and recovery annealing treatment was performed. Then, a high-dielectric-constant layer 46 was formed in the same manner as the high-dielectric-constant layer 44, subsequently an interlayer insulating layer 21 of 300 nm was formed by CVD employing p-TEOS. Then, etch-back was performed such that the surface of the fifth high-dielectric-constant layer 46 was exposed. As a result of the etch-back, side walls were formed from the fifth high-dielectric-constant layer 46, and the possibility of short circuit between the fourth layer and the fifth layer was reduced. When the planarization by p-TEOS is not sufficient, it is preferable that 2000 nm of an oxidized film may be formed by CVD, which is then planarized by CMP and etched back to expose the surface of the dielectric layer.

Subsequently, a platinum electrode 47 is formed by sputtering, and the electrode is patterned by photolithography and etched. Then, after performing recovery annealing for 30 minutes at 650° C. in the atmosphere of oxygen, an interlayer insulating layer 21 of 300 nm was formed by CVD employing p-TEOS. Vias were perforated at two positions from the upper side of the interlayer insulating layer 21 to form vias 35 and 36. Platinum electrodes were deposited into the holes, and TiN barrier films 25 were formed on the uppermost surface by sputtering. Aluminum are deposited on the barrier film by sputtering, and aluminum pads 27 are formed on the upper most surface by carrying out photoresist coating, exposure, development, and etching. The above described steps are the capacitor forming step shown in FIG. 23.

In practice, it is desirable to further form a passivation film for improving environment resistance.

Figure 23:
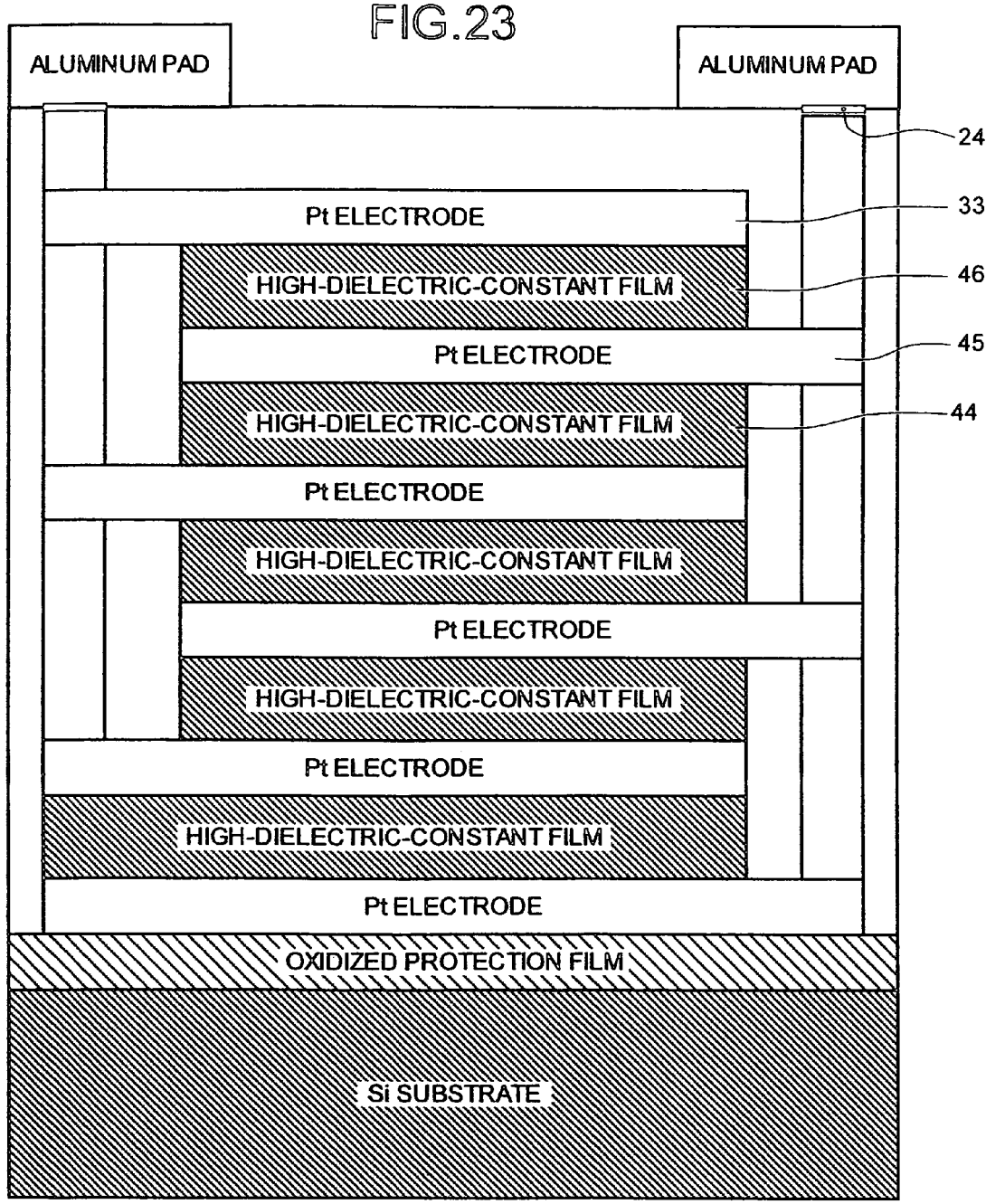
FIG. 23 is a cross sectional view of a laminate for explaining a method for manufacturing a thin-film capacitor according to Example 10 of the present invention.

Formation of the passivation film may be carried out by a method in which, for example, a Ta oxidized film, which serves as an adhesion layer of the PV (passivation) film, of 150 nm is formed on the structure shown in FIG. 23 by sputtering, 850 nm of an SiN film serving as the PV film is formed on the oxidized film by CVD, and then the PV film is etched to expose the pads.

In Example 10, the capacitor is made of a combination of five layers as described above. Therefore the capacitance of about five times that of a single layer may be obtained.

Example 11

In Example 11, the second laminate of Example 10 comprising high-dielectric-constant layers and electrode layers is made in five layers, that is, six high-dielectric-constant layers are formed.

The procedure of Example 10 was followed until the platinum electrode 47 was formed and recovery annealing treatment was performed. Then, a high-dielectric-constant layer 48 was formed in the same manner as the high-dielectric-constant layer 46, subsequently an interlayer insulating layer 21 of 300 nm was formed by CVD employing p-TEOS. Then, etch-back was performed such that the surface of the sixth high-dielectric-constant layer 48 was exposed. As a result of the etch-back, side walls were formed from the sixth high-dielectric-constant layer 48, and the possibility of short circuit between the fifth layer and the sixth layer was reduced. When the planarization by p-TEOS is not sufficient, it is preferable that 2000 nm of an oxidized film may be formed by CVD, which is then planarized by CMP and etched back to expose the surface of the dielectric layer.

Subsequently, a platinum electrode 49 is formed by sputtering, and the electrode is patterned by photolithography and etched. Then, after performing recovery annealing for 30 minutes at 650° C. in the atmosphere of oxygen, an interlayer insulating layer 22 of 300 nm was formed by CVD employing p-TEOS. Vias were perforated at two positions from the upper side of the interlayer insulating layer 21 to form vias 35 and 36. Platinum electrodes were deposited into the holes, and TiN barrier films 24 were formed on the uppermost surface by sputtering. Aluminum is deposited on the barrier film by sputtering, and aluminum pads 26 are formed on the uppermost surface by carrying out photoresist coating, exposure, development, and etching. The above described steps are the capacitor forming steps shown in FIG. 24.

In practice, it is desirable to further form a passivation film for improving environment resistance.

Figure 24:
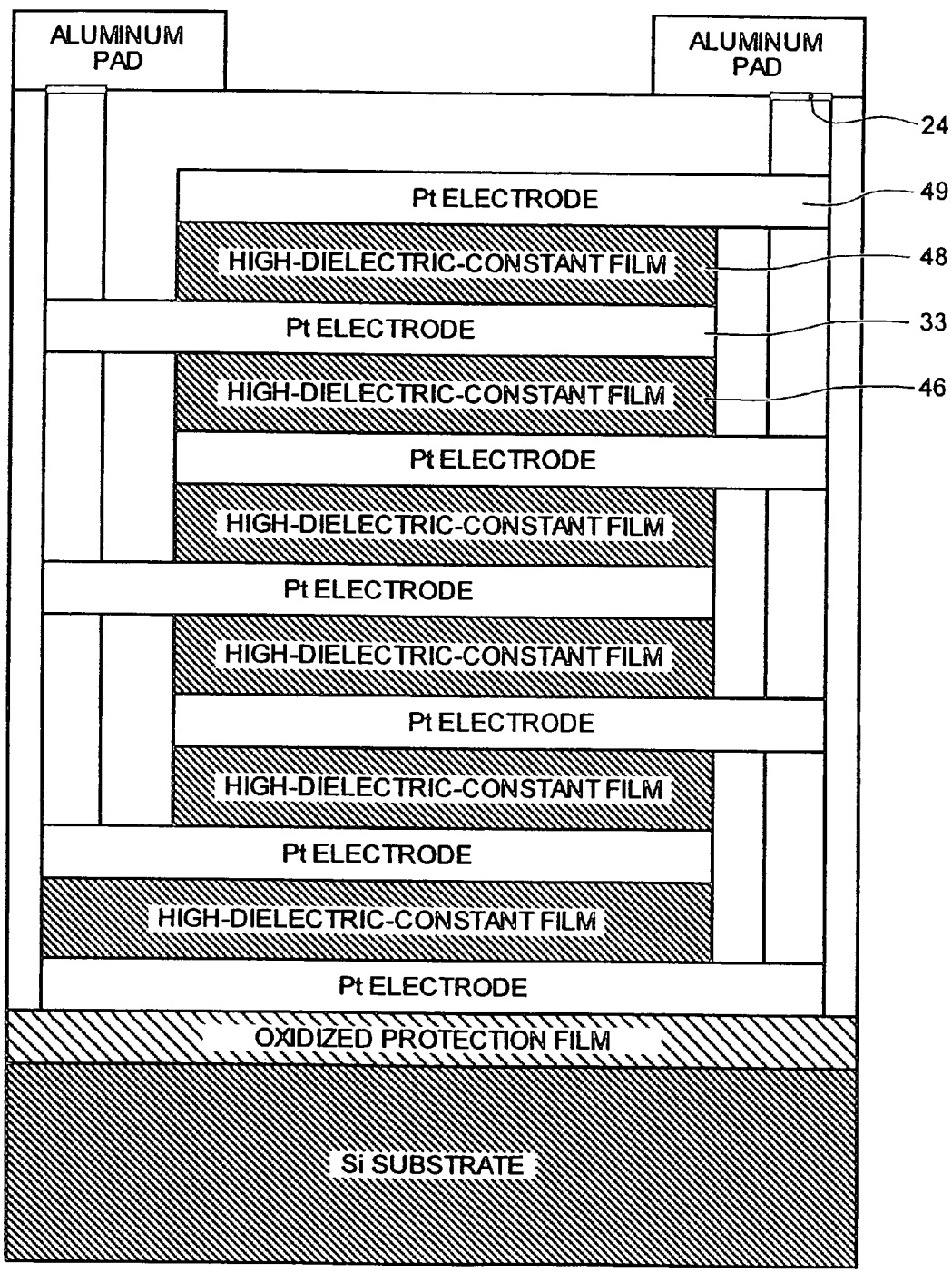
FIG. 24 is a cross sectional view of a laminate for explaining a method for manufacturing a thin-film capacitor according to Example 11 of the present invention.

Formation of the passivation film may be carried out by a method in which, for example, a Ta oxidized film, which serves as an adhesion layer of the PV (passivation) film, of 150 nm is formed on the structure shown in FIG. 24 by sputtering, 850 nm of an SiN film serving as the PV film is formed on the oxidized film by CVD, and then the PV film is etched to expose the pads.

In Example 11, the capacitor is made of a combination of six layers as described above. Therefore the capacitance of about six times that of a single layer may be obtained.

Example 12

In Example 12, the aluminum pads on the surface in Example 7 are replaced by copper pads.

Figure 25:
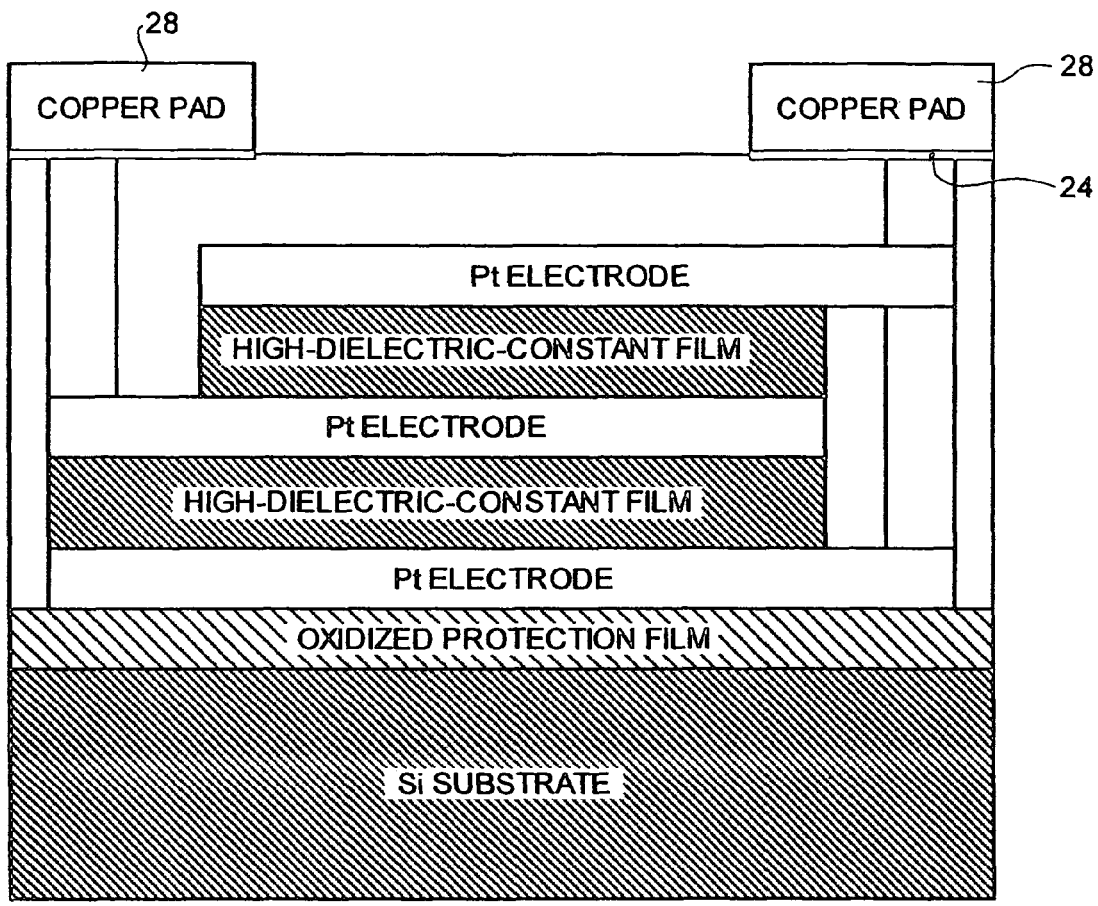
FIG. 25 is a cross sectional view of a laminate for explaining a method for manufacturing a thin-film capacitor according to Example 12 of the present invention.

As shown in FIG. 25, after vias 35 and 36 for Pt-electrodes are formed, TaN barrier films 32 are formed by sputtering, and 2 μm of copper is formed on each barrier film by sputtering. After the copper is coated by a resist and patterning is performed, the copper is etched at a temperature of 250° C. by use of a chlorine-based gas to form copper pads 28.

In practice, it is desirable to further form a passivation film for improving environment resistance.

Formation of the passivation film may be carried out by a method in which, for example, a Ta oxidized film, which serves as an adhesion layer of the PV (passivation) film, of 150 nm is formed on the structure shown in FIG. 25 by sputtering, 850 nm of an SiN film serving as the PV film is formed on the oxidized film by CVD, and then the PV film is etched to expose the pads.

In Example 12, the pads are made by copper as described above, therefore problems in junctions upon wiring after embedding into a substrate are reduced.

Example 13

Figure 26:
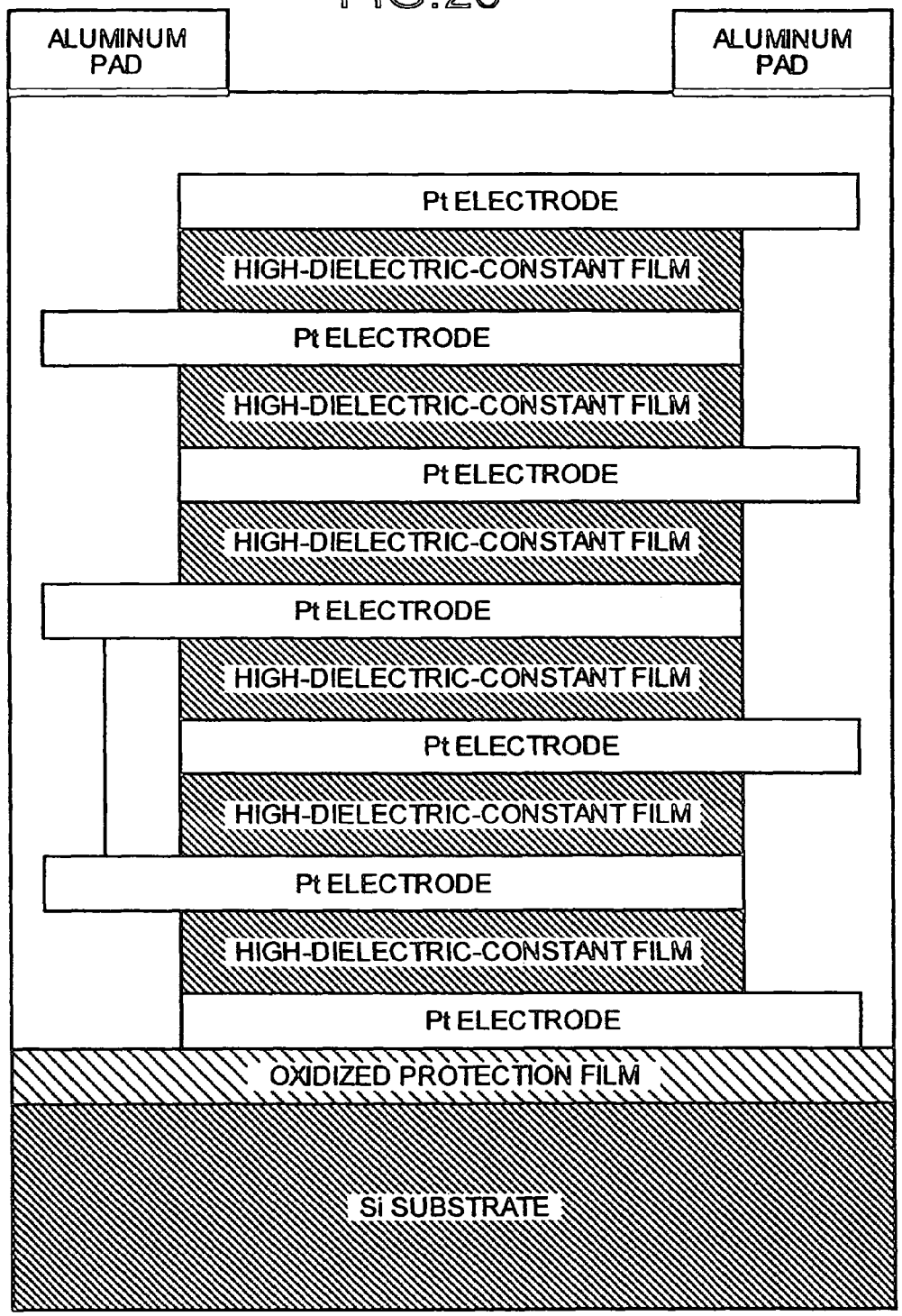
FIG. 26 is a cross sectional view of a laminate for explaining a method for manufacturing a thin-film capacitor according to Example 13 of the present invention.

As shown in FIG. 26, after marking was performed onto a silicon wafer (insulating substrate) 10, wet oxidation treatment was performed at 950° C., and an oxidized protection film 11 of 100 nm was formed on the insulating substrate 10. Subsequently, lower electrodes, high-dielectric-constant films, upper electrodes, and resists are formed, and then the upper electrodes are processed. The steps thereof will be explained with reference to FIG. 26.

On the oxidized protection film 11, a lower platinum electrode layer 17 of 60 nm was formed by sputtering. A sol-gel coating solution, which had been prepared in Synthesis Example 1 for forming $Ba_xSr_{1-x}TiO_3$ (x=0.6), was applied onto the lower platinum electrode layer 17 by carrying out spin coating for one second at 500 rpm, and subsequently for 30 seconds at 2000 rpm by use of a spin coater, and pre-baking is then performed for 30 minutes at 600° C. After the operations from the coating to the pre-baking were repeated three times, a heat treatment was performed for 60 minutes at 700° C. in the atmosphere of oxygen, for improving the crystallinity of the BST film. As a result, about 100 nm of a BST crystallized film (high-dielectric-constant layer 18) was obtained. Subsequently, in a photolithography step employing a photoresist material, shaping was performed such that one end (in the drawing, right side) of the lower electrode layer 17 protruded over the high-dielectric-constant layer 18.

Subsequently, an oxidized film having a film thickness of 300 nm was formed by CVD employing p-TEOS, and the film was subjected to etch-back treatment such that the surface of the first high-dielectric-constant layer 18 was exposed.

Subsequently, a platinum electrode layer 19 having a thickness of 100 nm was formed by sputtering, then a second high-dielectric-constant layer 40 was formed by spin coating and baking in the same manner as the first layer.

Subsequently, a resist film was formed on the high-dielectric-constant layer 40, and a photolithography step was performed. Then, in an etching treatment, the high-dielectric-constant layer 40 and the platinum electrode layer 19 were patterned and shaped such that one end (left side in the drawing) of the platinum electrode 19 that was opposite to the end of the lower electrode layer 17, protruded over the lower high-dielectric-constant layer 18.

Subsequently, an oxidized film having a film thickness of 300 nm was formed by CVD employing p-TEOS, and the oxidized film was subjected to etch-back treatment such that the surface of the second high-dielectric-constant layer 40 was exposed.

Subsequently, a platinum electrode layer 41 having a thickness of 100 nm was formed by sputtering, then a third high-dielectric-constant layer 42 was formed by spin coating and baking in the same manner as the first layer.

Subsequently, a resist film was formed on the high-dielectric-constant layer 42, and a photolithography step was performed. Then, in an etching treatment, the high-dielectric-constant layer 42 and the platinum electrode layer 41 were patterned and shaped such that one end (right side in the drawing) of the platinum electrode 41, that was opposite to the end of the platinum electrode layer 19, protruded over the lower high-dielectric-constant layer 18.

Subsequently, an oxidized film having a film thickness of 300 nm was formed by CVD employing p-TEOS, and the oxidized film was subjected to etch-back treatment such that the surface of the third high-dielectric-constant layer 42 was exposed.

Subsequently, a platinum electrode layer 43 having a thickness of 100 nm was formed by sputtering, then a fourth high-dielectric-constant layer 44 was formed by spin coating and baking in the same manner as the first layer.

Subsequently, a resist film was formed on the high-dielectric-constant layer 44, and a photolithography step was performed. Then, in an etching treatment, the high-dielectric-constant layer 44 and the platinum electrode layer 43 were patterned and shaped such that one end (left side in the drawing) of the platinum electrode 43, that was opposite to the end of the platinum electrode layer 41, protruded over the lower high-dielectric-constant layer 18.

Subsequently, an oxidized film having a film thickness of 300 nm was formed by CVD employing p-TEOS, and the oxidized film was subjected to etch-back treatment such that the surface of the fourth high-dielectric-constant layer 44 was exposed.

Subsequently, a platinum electrode layer 45 having a thickness of 100 nm was formed by sputtering, then a fifth high-dielectric-constant layer 46 was formed by spin coating and baking in the same manner as the first layer.

Subsequently, a resist film was formed on the high-dielectric-constant layer 46, and a photolithography step was performed. Then, in an etching treatment, the high-dielectric-constant layer 46 and the platinum electrode layer 45 were patterned and shaped such that one end (right side in the drawing) of the platinum electrode 45, that was opposite to the end of the platinum electrode layer 43, protruded over the lower high-dielectric-constant layer 18.

Subsequently, an oxidized film having a film thickness of 300 nm was formed by CVD employing p-TEOS, and the oxidized film was subjected to etch-back treatment such that the surface of the fifth high-dielectric-constant layer 46 was exposed.

Subsequently, a platinum electrode layer 47 having a thickness of 100 nm was formed by sputtering, then a sixth high-dielectric-constant layer 48 was formed by spin coating and baking in the same manner as the first layer.

Subsequently, a resist film was formed on the high-dielectric-constant layer 48, and a photolithography step was performed. Then, in an etching treatment, the high-dielectric-constant layer 48 and the platinum electrode layer 47 were patterned and shaped such that one end (left side in the drawing) of the platinum electrode 48, that was opposite to the end of the platinum electrode layer 45, protruded over the lower high-dielectric-constant layer 18.

Subsequently, an oxidized film having a film thickness of 300 nm was formed by CVD employing p-TEOS, and the oxidized film was subjected to etch-back treatment such that the surface of the sixth high-dielectric-constant layer 48 was exposed.

Subsequently, an upper platinum electrode 49 is formed by sputtering, and the electrode is patterned by photolithography and etched. Then, after performing recovery annealing for 30 minutes at 650° C. in the atmosphere of oxygen, an oxidized film 22 of 300 nm is formed by CVD employing p-TEOS. TiN barrier films 24 are formed on the oxidized film by sputtering. Aluminum is deposited on the barrier films by sputtering, and aluminum pads 27 are formed on the uppermost surface by carrying out photoresist coating, exposure, development, and etching. The above described steps are the capacitor forming step shown in FIG. 26.

Figure 27:
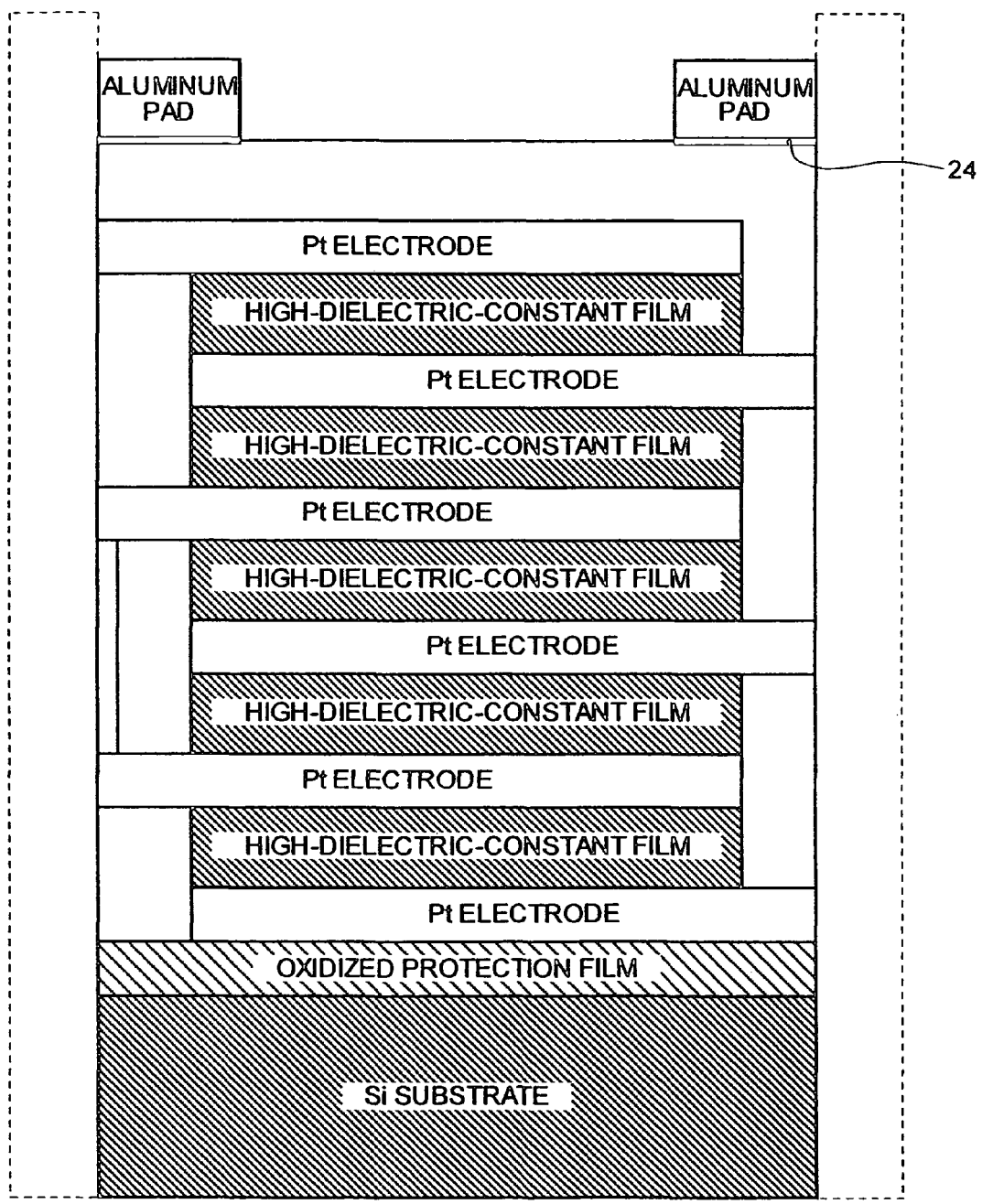
FIG. 27 is a cross sectional view of a laminate for explaining the method for manufacturing a thin-film capacitor according to Example 13 of the present invention.

Subsequently, both side surfaces of the obtained capacitor are subjected to dicing such that one end of each electrode layer is exposed. The configuration after dicing is shown in FIG. 27.

Figure 28:
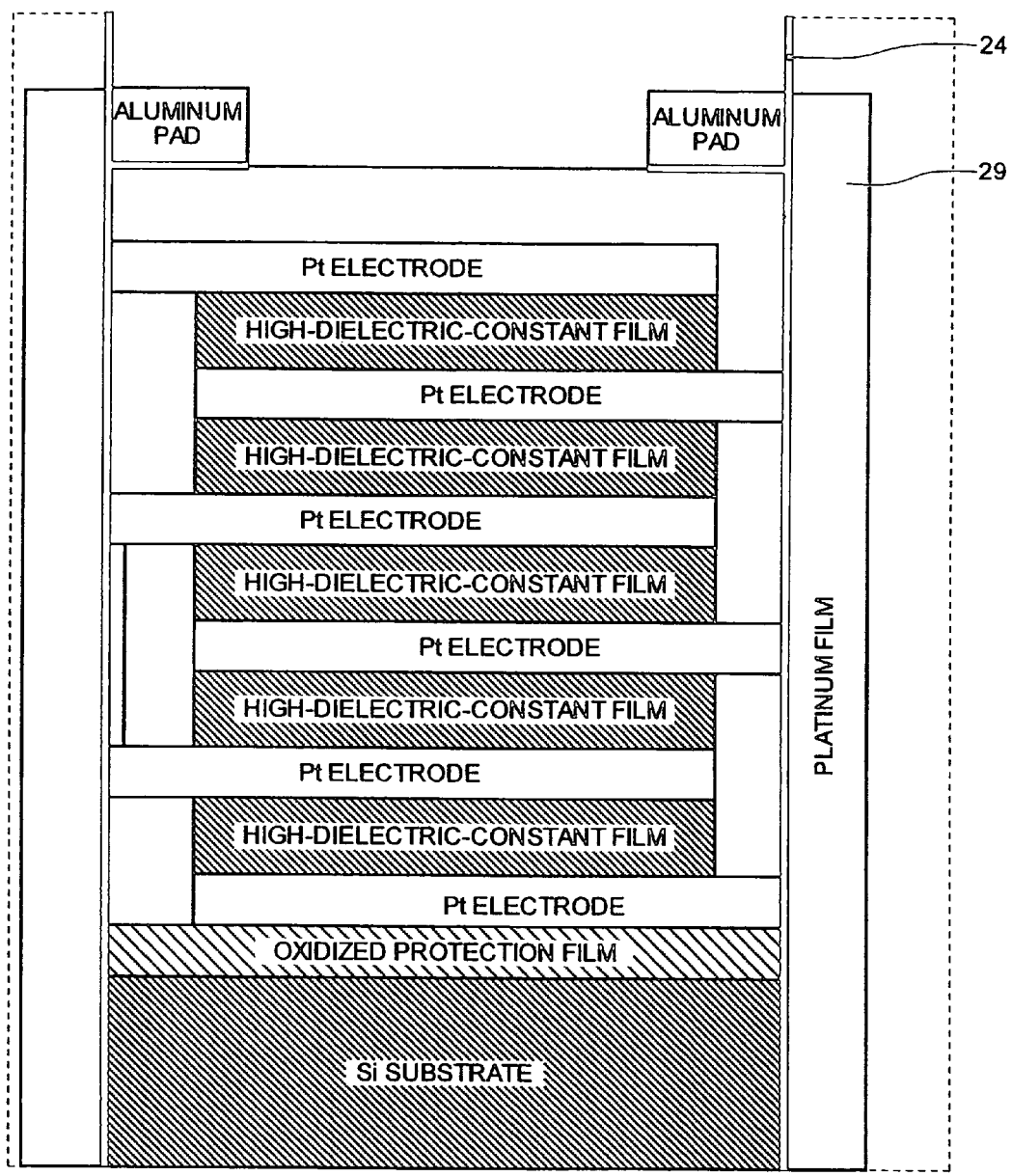
FIG. 28 is a cross sectional view of a laminate for explaining the method for manufacturing a thin-film capacitor according to Example 13 of the present invention.

When the diced surface has low smoothness or flatness as a result of the dicing, a polishing step may be additionally performed. After the dicing, the capacitor was turned such that one side surface was faced up, and a TiN barrier film 24 was formed by sputtering. Then, a platinum film 29 was formed. The other side surface was treated in the same manner, and a TiN barrier film 24 and a platinum film 29 were formed by sputtering. The formation of the barrier films and the platinum electrode films is shown in FIG. 28.

In Example 13, as described above, laminated electrode layers may be made conductive without forming via holes. Therefore, a thin-film capacitor may easily be formed even when the laminate has a large number of layers.

Instead of the TiN barrier films 24 and platinum film 29, Ni paste (ESL 2554, manufactured by ESL Electro-Science) may be dubbed and baked for 30 minutes at 580° C., thereby making the electrode layers of both sides conductive. Alternatively, copper may be employed as a material for the pads at the uppermost layer and the conductive material at the side surfaces, instead of aluminum and platinum.

In a method for employing copper as the conductive material for the side surfaces, for example, a catalyst solution containing palladium is applied to the both side surfaces to activate the side surfaces. Subsequently, the surfaces are immersed in an electroless NiB plating solution, whereby NiB barrier films are formed. Subsequent immersion into an electroless copper solution may give copper electrodes (conductive material) formed on the side surfaces.

Example 14

Figure 29:
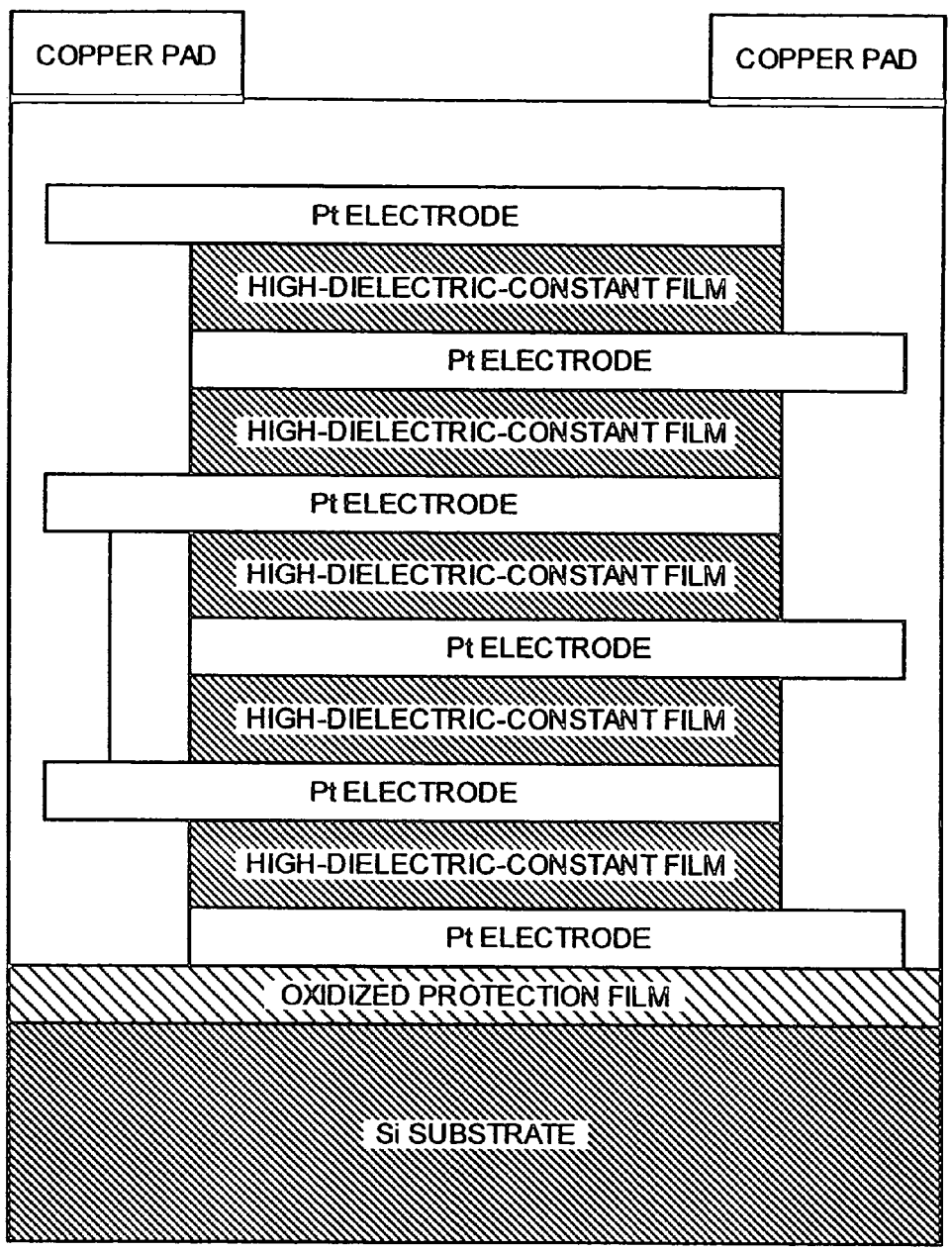
FIG. 29 is a cross sectional view of a laminate for explaining a method for manufacturing a thin-film capacitor according to Example 14 of the present invention.

As shown in FIG. 29, after marking was performed onto a silicon wafer (insulating substrate) 10, wet oxidation treatment was performed at 950° C., and an oxidized protection film 11 of 100 nm was formed on the insulating substrate 10. Subsequently, lower electrodes, high-dielectric-constant films, upper electrodes, and resists are formed, and then the upper electrodes are processed. The steps thereof will be explained with reference to FIG. 29.

On the oxidized protection film 11, a lower platinum electrode layer 17 of 60 nm was formed by sputtering. A sol-gel coating solution, which had been prepared in Synthesis Example 1 for forming $Ba_xSr_{1-x}TiO_3$ (x=0.6), was applied onto the lower platinum electrode layer 17 by carrying out spin coating for one second at 500 rpm, and subsequently for 30 seconds at 2000 rpm by use of a spin coater, and pre-baking was then performed for 30 minutes at 600° C. After the operations from the coating to the pre-baking were repeated three times, a heat treatment was performed for 60 minutes at 700° C. in the atmosphere of oxygen for improving the crystallinity of the BST film. As a result, about 100 nm of a BST crystallized film (high-dielectric-constant layer 18) was obtained. Subsequently, in a photolithography step employing a photoresist material, shaping was performed such that one end (in the drawing, right side) of the lower electrode layer 17 protruded over the high-dielectric-constant layer 18.

Subsequently, an oxidized film having a film thickness of 300 nm was formed by CVD employing p-TEOS, and the film was subjected to etch-back treatment such that the surface of the first high-dielectric-constant layer 18 was exposed.

Subsequently, a platinum electrode layer 19 having a thickness of 100 nm was formed by sputtering. Then a second high-dielectric-constant layer 40 was formed by spin coating and baking in the same manner as the first layer.

Subsequently, a resist film was formed on the high-dielectric-constant layer 40, and a photolithography step was performed. Then, in an etching treatment, the high-dielectric-constant layer 40 and the platinum electrode layer 19 were patterned and shaped such that one end (left side in the drawing) of the platinum electrode 19, that was opposite to the end of the lower electrode layer 17, protruded over the lower high-dielectric-constant layer 18.

Subsequently, an oxidized film having a film thickness of 300 nm was formed by CVD employing p-TEOS, and the oxidized film was subjected to etch-back treatment such that the surface of the second high-dielectric-constant layer 40 was exposed.

Subsequently, a platinum electrode layer 41 having a thickness of 100 nm was formed by sputtering, then a third high-dielectric-constant layer 42 was formed by spin coating and baking in the same manner as the first layer.

Subsequently, a resist film was formed on the high-dielectric-constant layer 42, and a photolithography step was performed. Then, in an etching treatment, the high-dielectric-constant layer 42 and the platinum electrode layer 41 were patterned and shaped such that one end (right side in the drawing) of the platinum electrode 41, that was opposite to the end of the platinum electrode layer 19, protruded over the lower high-dielectric-constant layer 18.

Subsequently, an oxidized film having a film thickness of 300 nm was formed by CVD employing p-TEOS, and the oxidized film was subjected to etch-back treatment such that the surface of the third high-dielectric-constant layer 42 was exposed.

Subsequently, a platinum electrode layer 43 having a thickness of 100 nm was formed by sputtering, then a fourth high-dielectric-constant layer 44 was formed by spin coating and baking in the same manner as the first layer.

Subsequently, a resist film was formed on the high-dielectric-constant layer 44, and a photolithography step was performed. Then, in an etching treatment, the high-dielectric-constant layer 44 and the platinum electrode layer 43 were patterned and shaped such that one end (left side in the drawing) of the platinum electrode 43, that was opposite to the end of the platinum electrode layer 41, protruded over the lower high-dielectric-constant layer 18.

Subsequently, an oxidized film having a film thickness of 300 nm was formed by CVD employing p-TEOS, and the oxidized film was subjected to etch-back treatment such that the surface of the fourth high-dielectric-constant layer 44 was exposed.

Subsequently, a platinum electrode layer 45 having a thickness of 100 nm was formed by sputtering, then a fifth high-dielectric-constant layer 46 was formed by spin coating and baking in the same manner as the first layer.

Subsequently, a resist film was formed on the high-dielectric-constant layer 46, and a photolithography step was performed. Then, in an etching treatment, the high-dielectric-constant layer 46 and the platinum electrode layer 45 were patterned and shaped such that one end (right side in the drawing) of the platinum electrode 45, that was opposite to the end of the platinum electrode layer 43, protruded over the lower high-dielectric-constant layer 18.

Subsequently, an oxidized film having a film thickness of 300 nm was formed by CVD employing p-TEOS, and the oxidized film was subjected to etch-back treatment such that the surface of the fifth high-dielectric-constant layer 46 was exposed.

Subsequently, an upper platinum electrode 47 is formed by sputtering, and the electrode is patterned by photolithography and etched. Then, after performing recovery annealing for 30 minutes at 650° C. in the atmosphere of oxygen, an oxidized film 22 of 300 nm is formed by CVD employing p-TEOS. TiN barrier films 24 are formed on the oxidized film by sputtering. Copper is deposited on the barrier films by sputtering, and copper pads 28 are formed on the uppermost surface by carrying out photoresist coating, exposure, development, and etching. The above described steps are the capacitor forming step shown in FIG. 29.

Figure 30:
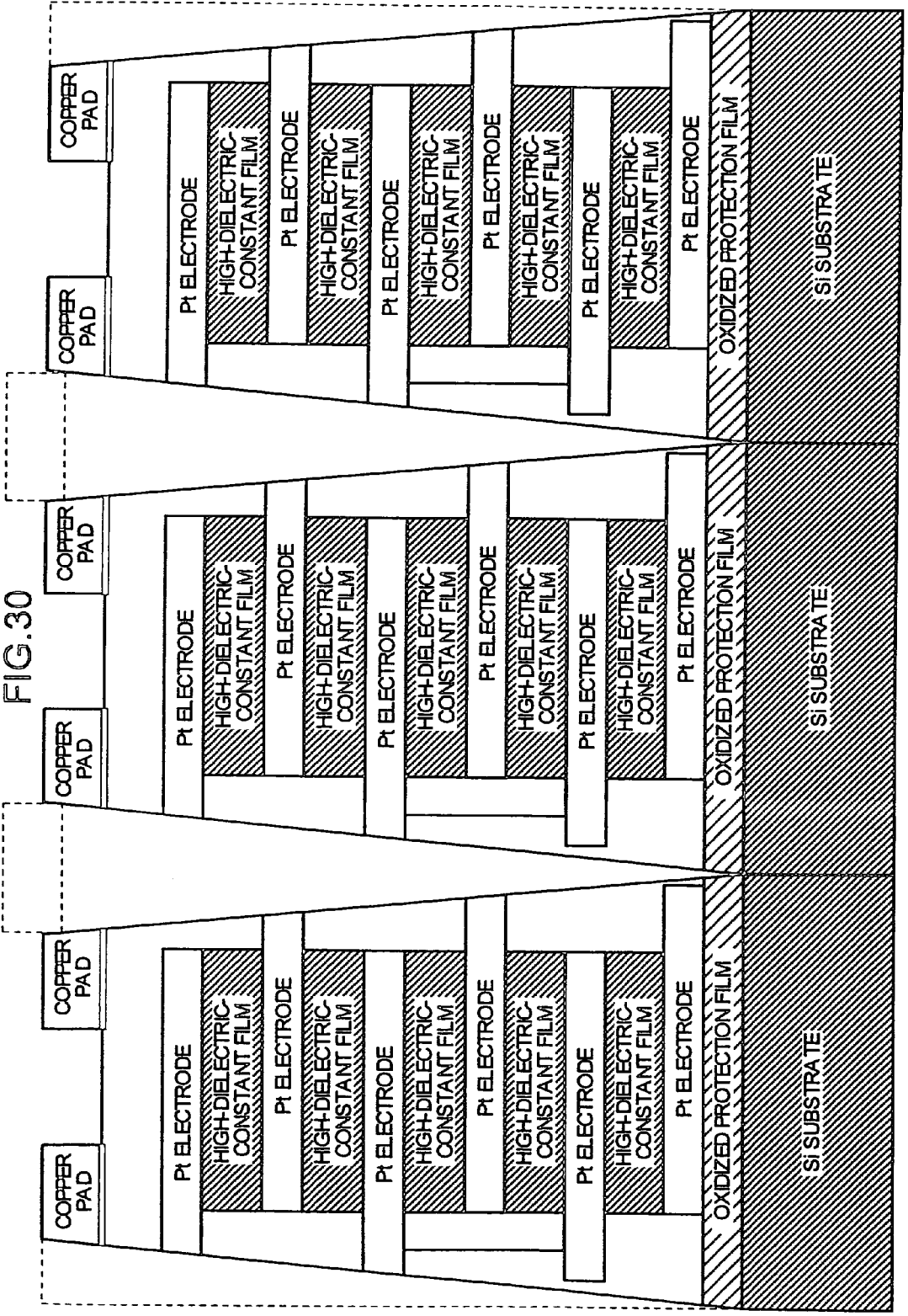
FIG. 30 is a cross sectional view of a laminate for explaining the method for manufacturing a thin-film capacitor according to Example 14 of the present invention.

Subsequently, both side surfaces of the obtained capacitor are subjected to taper etching such that one end of each electrode layer is exposed. The configuration after taper etching is shown in FIG. 30.

Figure 31:
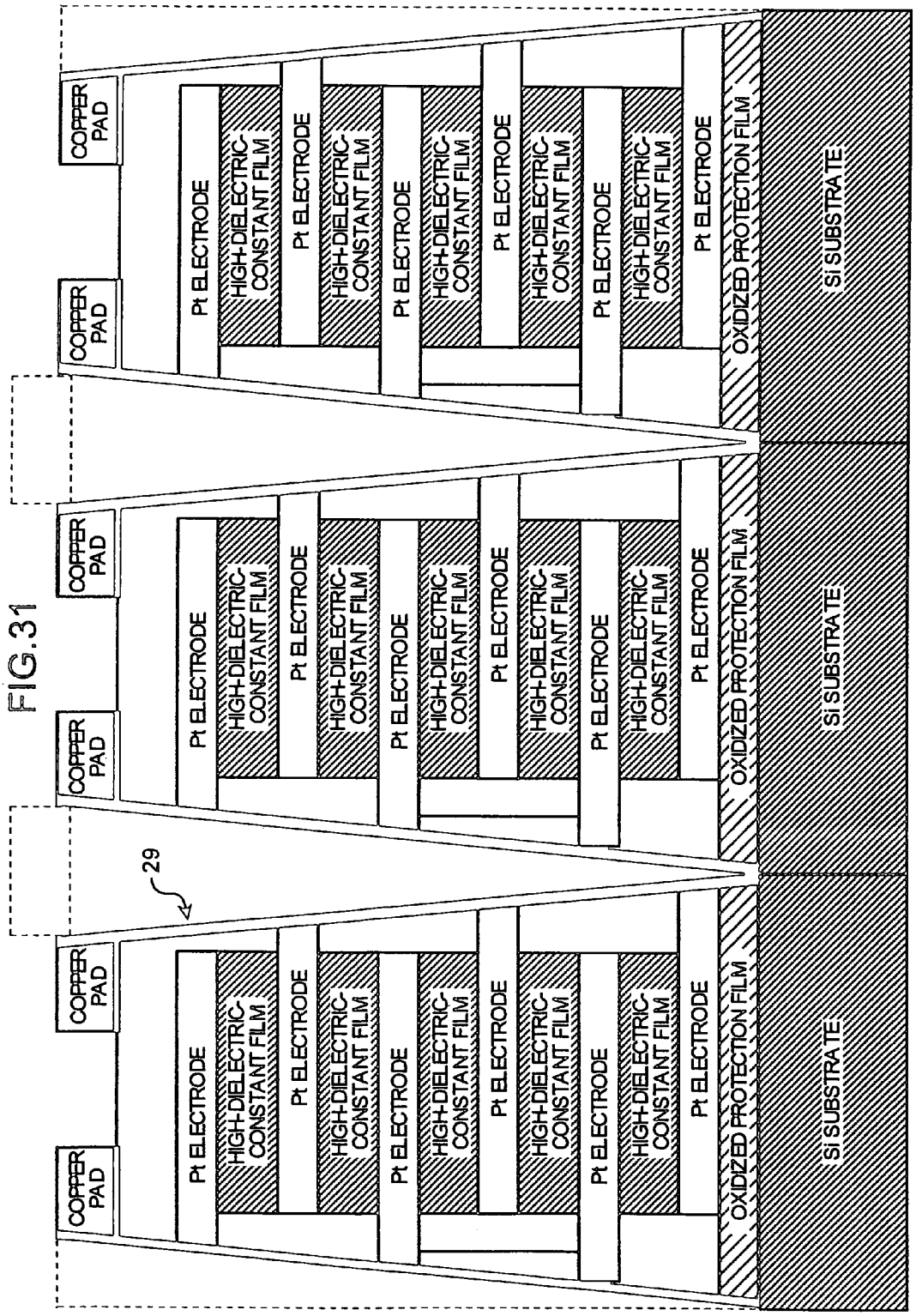
FIG. 31 is a cross sectional view of a laminate for explaining the method for manufacturing a thin-film capacitor according to Example 14 of the present invention.

After taper etching, platinum films 29 are formed on the tapered parts (side surfaces) by sputtering. The platinum films formed on the side surfaces is shown in FIG. 31.

Figure 32:
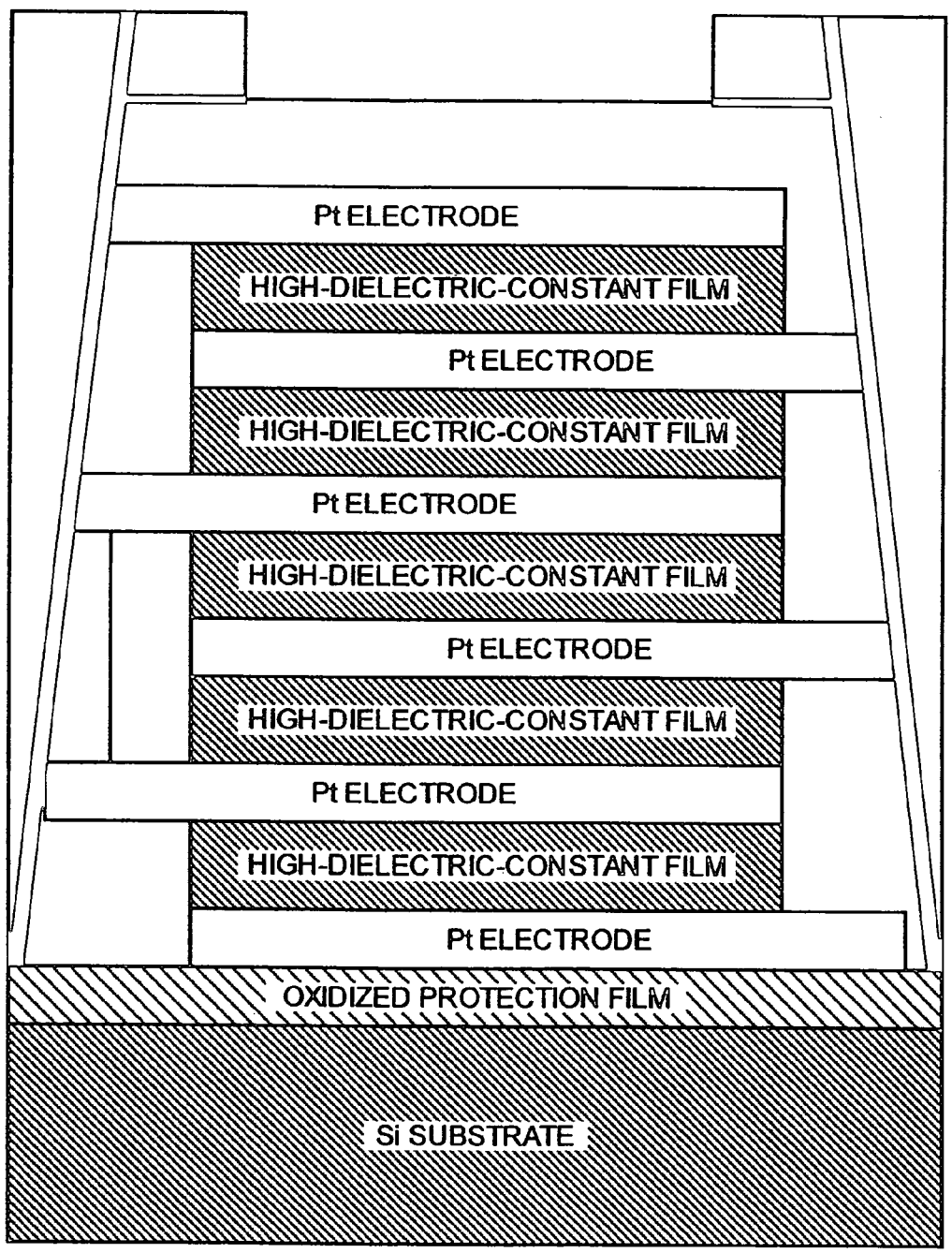
FIG. 32 is a cross sectional view of a laminate for explaining the method for manufacturing a thin-film capacitor according to Example 14 of the present invention.
Figure 33:
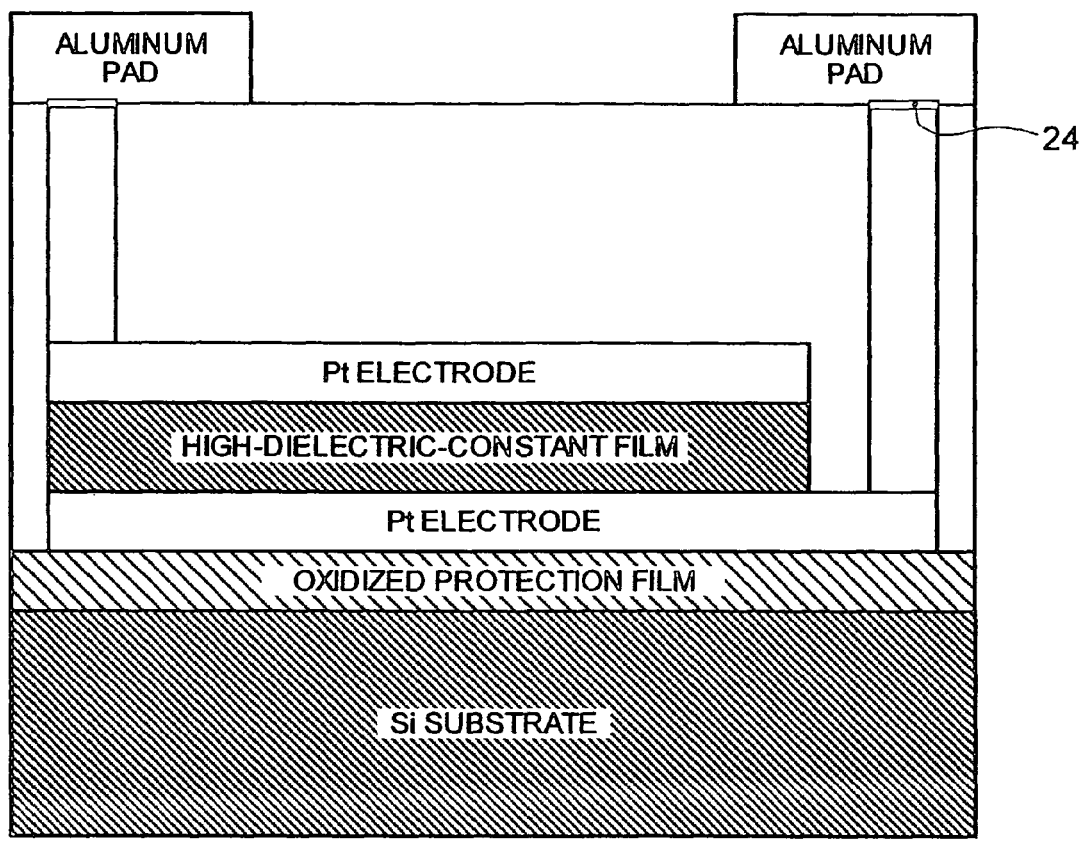
FIG. 33 is a cross sectional view of a capacitor in an ordinary state.
Figure 34:
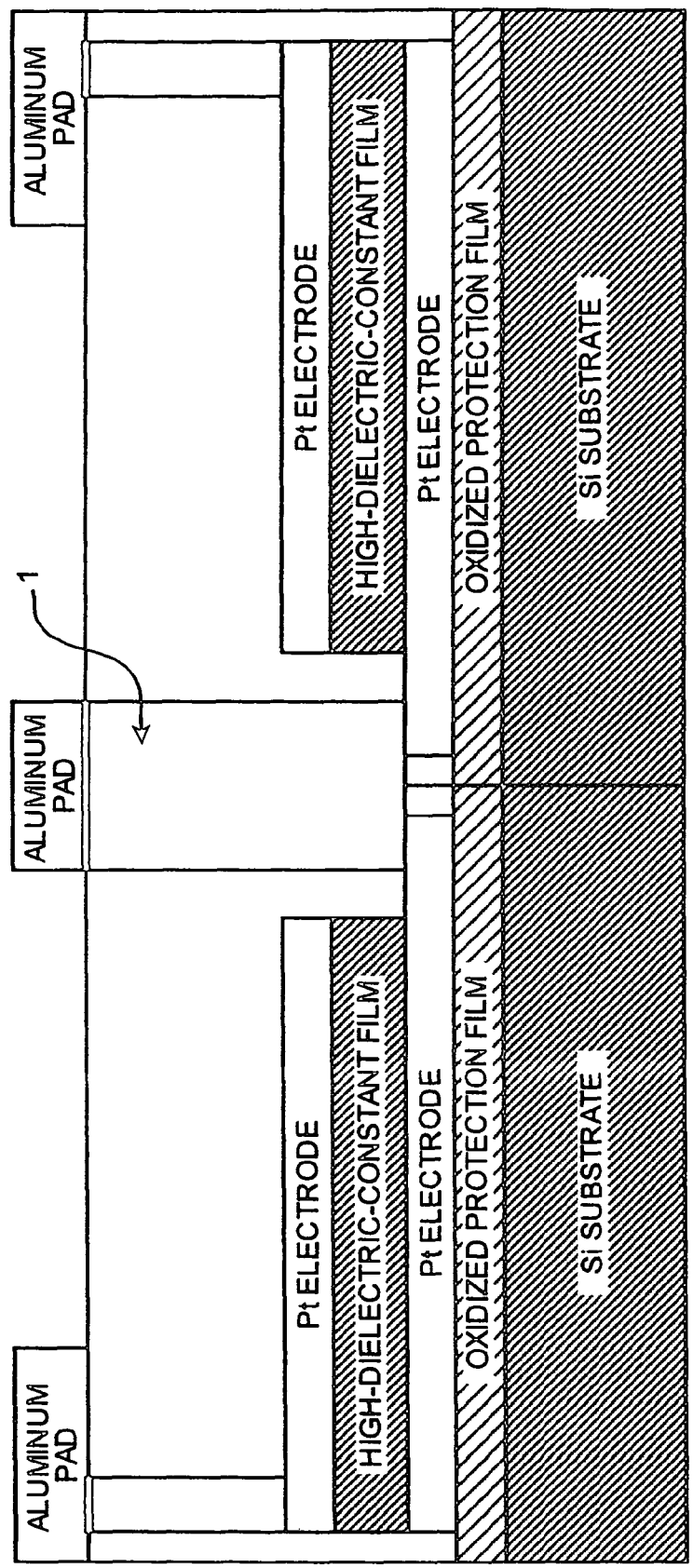
FIG. 34 is a cross sectional view of a capacitor divided into two parts.
Figure 35:
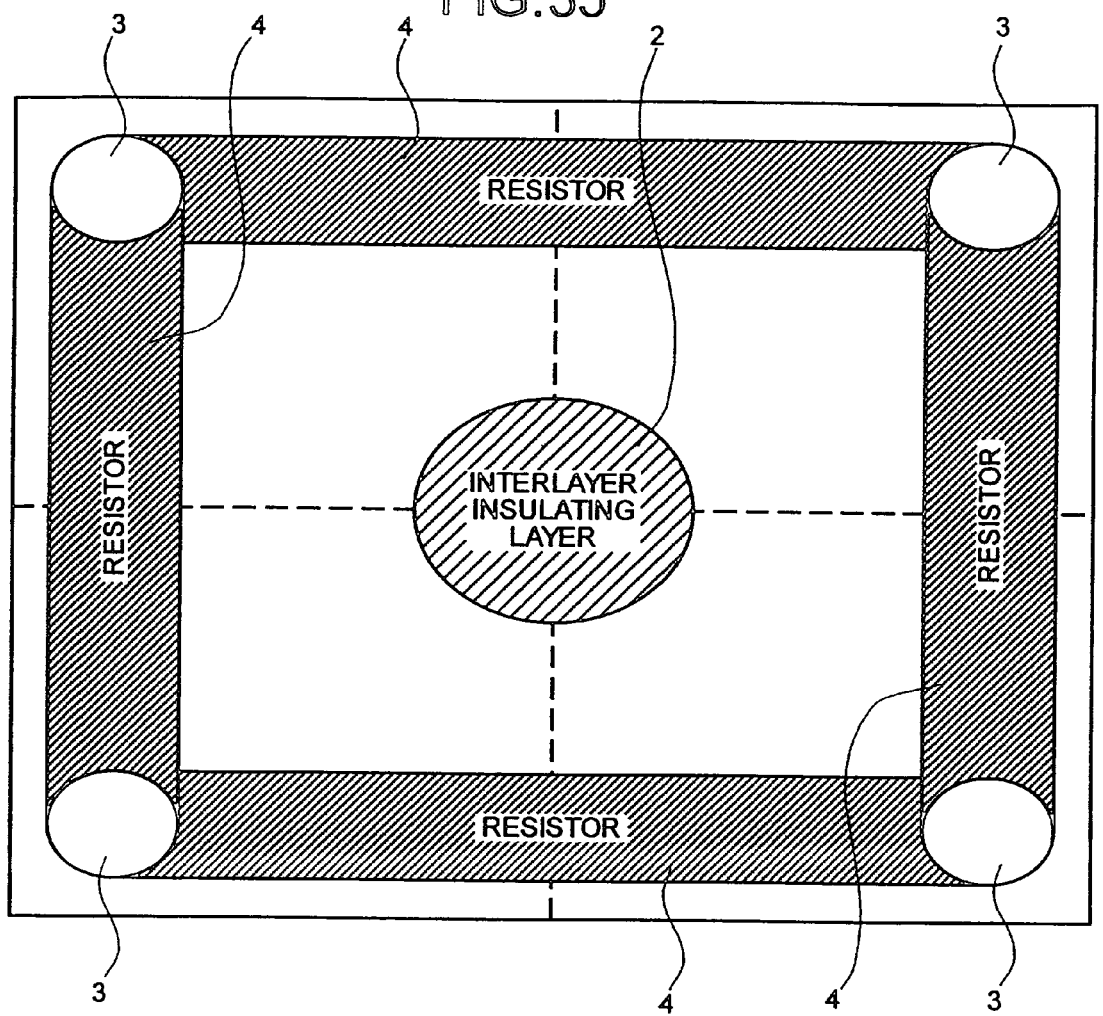
FIG. 35 is a top plan view of a capacitor divided into four parts.
Figure 36:
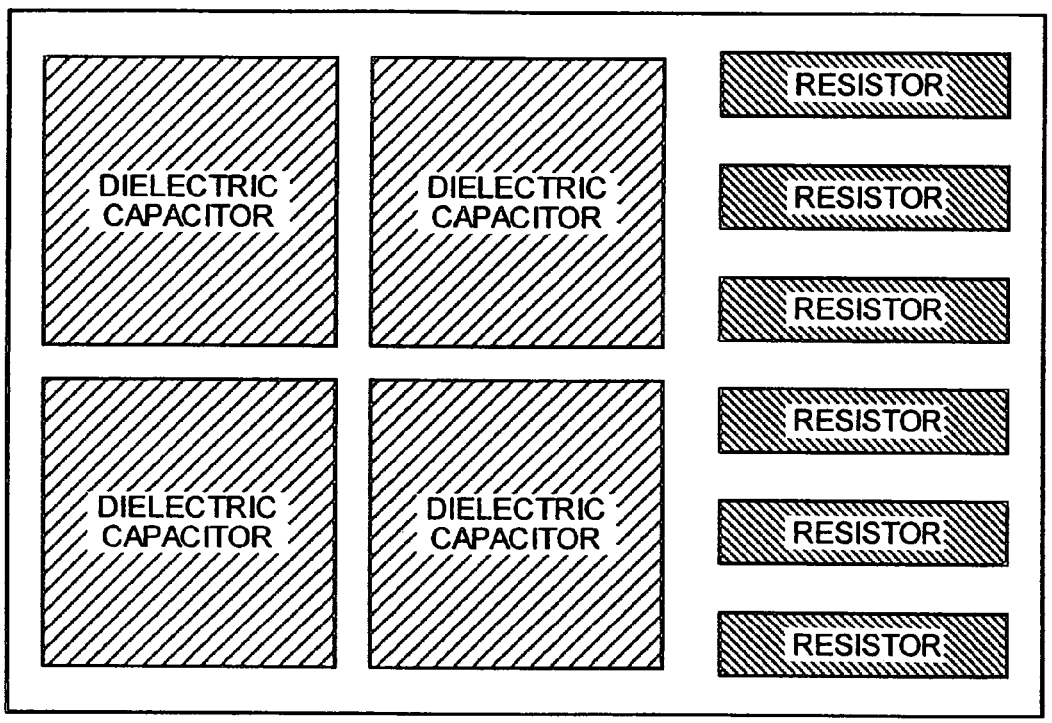
FIG. 36 is a top plan view of a substrate on which capacitors and resistors are mounted together.
Figure 37:
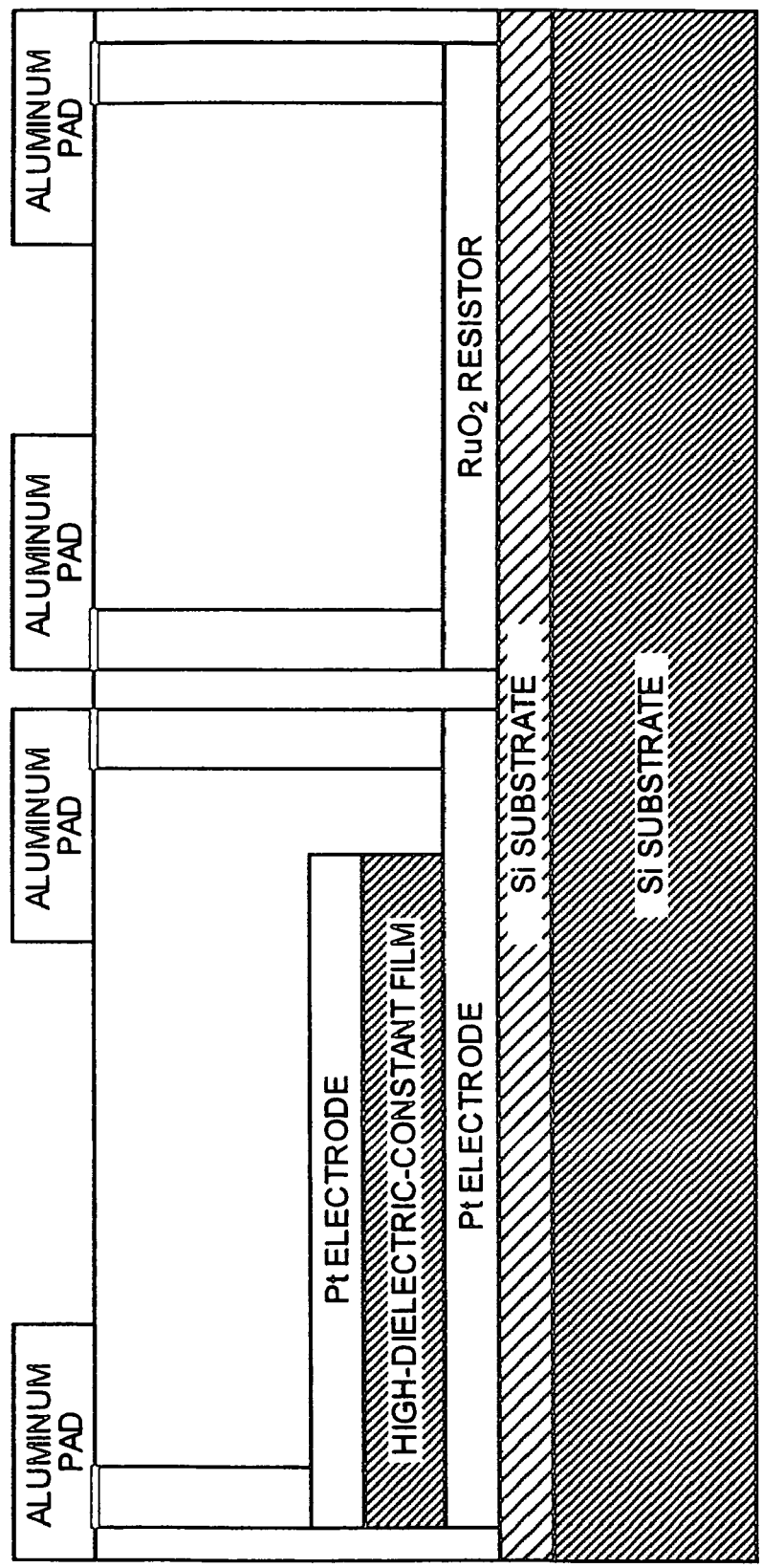
FIG. 37 is a cross sectional view of a substrate on which capacitors and resistors are mounted together.

Then, chips are separated by dicing. The cross section of the chips after the dicing is shown in FIG. 32.

In Example 14, as described above, laminated electrode layers are made conductive without forming via holes. Therefore, a thin-film capacitor may easily be formed even when the laminate has further multiplied layers.

Copper may be employed as the conductive material of the side surfaces instead of platinum. In a method for employing copper as the conductive material for the side surfaces, for example, only the tapered part is activated by immersing the part in an activating solution containing palladium. Subsequently, after washing with water, the surface is immersed in an electroless NiB solution to form an NiB barrier film. After washing with water, the surface is immersed in an electroless Cu plating solution to form a Cu electrode.

Specifically, after the substrate is washed, the surface is immersed in a toluene solution containing N-(2-aminoethyl)-3-aminopropyltrimethoxysilane that is shown in Table 1, and excess organic silane molecules are removed by ultrasonic cleaning. Subsequently, the surface is immersed in a solution containing $PdCl_2$ that is shown in Table 2 for 10 to 30 minutes at room temperature such that the surface serves as a catalyst. The substrate pulled out from the solution is cleaned in ultra pure water and maintained.

Subsequently, the surface is immersed in a NiB plating solution shown in Table 3. The plating solution contains DMAB (dimethylamine-borane) as a reducing agent, citric acid as a complexing agent, and nickel sulfate as a metal salt; and pH thereof is buffered to 9 by tetramethyl ammonium hydride (TMAH). Since TMAH is employed, NaOH is omitted and the plating bath is therefore suitable for a semiconductor.

Then, electroplating with Cu is performed in a plating bath comprising the components shown in Table 4. The plating bath contains bis-(3-sulfopropyl)disulfide (hereinbelow abbreviated as SPS), polyethylene glycol (molecular weight: 2000, hereinbelow abbreviated as PEG), and Janus Green B (hereinbelow abbreviated as JGB) as additive agents.

As the area of the wafer is being larger, direct electroplating results in longer wiring, which may lead to too high resistance of NiB. Such excessively high resistance may cause unevenness in electric current density, whereby the portions near the electric power supply are made thicker, and the portions near the ends are made thinner.

In such occasion, electroless copper plating may be performed to form a copper seed layer on NiB in an electroless copper plating bath containing the components shown in Table 5, which is followed by electrolysis copper plating. As a result, such problems may be prevented.

A catalyst solution is applied such that only the tapered parts of the both side surfaces are immersed to activate the side surfaces, then, the surfaces are immersed in an electroless NiB plating solution and NiB barrier films are formed. Then, by immersion in an electroless copper plating solution, copper electrodes (conductive material) are formed on side surfaces.

TABLE 1

|  | Content (ml/100 ml) |
|---|---|
| N-(2-aminoethyl)-3-aminopropyl trimethoxysilane | 1.0 |
| Toluene | 99.0 |

TABLE 2

|  | Component Concentration |
|---|---|
| $PdCl_2$ | 0.1[g/L] |
| HCl | 1.0[ml/L] |

TABLE 3

|  | Component Concentration (mol/L) |
|---|---|
| Citric Acid | 0.2 |
| $NiSO_4$ | 0.1 |
| DMAB | 0.05 |
| PH(TMAH) | 9.0 |
| Bath Temperature | 70° C. |

TABLE 4

|  | Component Concentration |
|---|---|
| $CuSO_4 \cdot 5H_2O$ | 0.24[mol/L] |
| $H_2SO_4$ | 1.8[mol/L] |
| $Cl^-$ | 50[mg/L] |
| polyethylene glycol | 300[mg/L] |
| bis-(3-sulfopropyl)disulfide | 1.0[mg/L] |
| Janus Green B | 1.0[mg/L] |

TABLE 5

|  | Component Concentration |
|---|---|
| $CuSO_4 \cdot 5H_2O$ | 2[g/L] |
| EDTA | 6[g/L] |
| DMAB | 4[g/L] |

According to the present invention, a thin-film capacitor which can be incorporated into a substrate and has a sufficient capacitance without deteriorating the electrical properties and size feature of the packaging substrate, a high-density packaging substrate incorporating such a thin film capacitor, and a method for manufacturing such a thin-film capacitor are provided.

Although the present invention has been described with reference to the preferred examples, it should be understood that various modifications and variations can be easily made by those skilled in the art without departing from the spirit of the invention. Accordingly, the foregoing disclosure should be interpreted as illustrative only and is not to be interpreted in a limiting sense. The present invention is limited only by the scope of the following claims along with their full scope of equivalents.

What is claimed is:

1. A method for manufacturing a thin-film capacitor which is capable of being incorporated into a high-density packaging substrate, the method comprising:

forming a high-dielectric-constant capacitor on an upper side of a support substrate; and thinning a back surface of the support substrate by mechanical and/or chemical polishing, wherein the high-dielectric-constant capacitor comprises a lower electrode layer, a high-dielectric-constant-layer, and an upper electrode layer which are sequentially laminated in this order; and the method further comprising:

a patterning step of the upper electrode layer, wherein a first resist film is formed on the upper electrode layer, the first resist film is patterned by photolithography, and a part of the upper electrode layer is removed by etching with the patterned resist film as a mask, to expose a part of the high-dielectric-constant layer;

a patterning step of the high-dielectric-constant film, wherein, after removing the residue of the first resist film, a second resist film is formed, the second resist film is patterned by photolithography, and a part of the high-dielectric-constant layer is removed by etching with the patterned resist film as a mask, to expose a part of the lower electrode layer;

an insulating layer laminating step, wherein an insulating layer is laminated to cover the patterned three layers;

a step of forming contact holes, wherein a third resist film is formed on the insulating layer, the third resist film is patterned by photolithography, a part of the insulating layer on the upper electrode layer and a part of the insulating layer on the lower electrode layer are removed with the patterned resist film as a mask by etching, to form a first contact hole at the upper side of the upper electrode layer and a second contact hole at the upper side of the lower electrode layer; and a step of forming connectors, wherein a conductive material is embedded into the first contact hole and the second contact hole to form an upper electrode connector and a lower electrode connector.

2. The method for manufacturing a thin-film capacitor according to claim 1, wherein, after the connector formation step, a bump is formed at the upper part of each of the connectors.

3. The method for manufacturing a thin-film capacitor according to claim 1, wherein the capacitor has a first laminate comprising the lower electrode layer, the high-dielectric-constant layer and the upper electrode layer which are sequentially laminated in this order, and one or more second laminates comprising the high-dielectric-constant layer and an electrode layer, one or more of the second laminates being laminated on the first laminate; the method comprising:

forming the first laminate;

forming the high-dielectric-constant layer of the second laminate on the first laminate;

forming an oxidized film to cover the entirety of the capacitor;

performing an etch-back treatment of the oxidized film until the high-dielectric-constant layer is exposed;

forming the electrode layer of the second laminate on the high-dielectric-constant layer;

if desired, repeating the steps from the formation of the high-dielectric-constant layer to the formation of the electrode layer;

thereby forming the structure in which the one or more second laminate is laminated on the first laminate.

4. The method for manufacturing a thin-film capacitor according to claim 1, wherein the capacitor has a first laminate comprising the lower electrode layer, the high-dielectric-constant layer and the upper electrode layer which are sequentially laminated in this order, and one or more second laminates comprising the high-dielectric-constant layer and an electrode layer, one or more of the second laminates being laminated on the first laminate; the method comprising:
- forming the lower electrode layer and the high-dielectric-constant layer of the first laminate;
- removing by photolithographical etching a part of the high-dielectric-constant layer and the lower electrode layer, to shape one end of the lower electrode layer to protrude over the high-dielectric-constant layer;
- forming an oxidized film to cover the entirety of the capacitor;
- performing an etch-back treatment of the oxidized film until the high-dielectric-constant layer of the first laminate is exposed;
- forming the upper electrode layer of the first laminate on the high-dielectric-constant layer;
- forming the high-dielectric-constant layer of the second laminate;
- removing by photolithographical etching a part of the electrode layer and the high-dielectric-constant layer, to shape an end of the electrode layer, that is opposite to the protruding end of the lower electrode layer of the first laminate, to protrude over the high-dielectric-constant layer of the first laminate;
- if desired, repeating the steps from the formation of the oxidized film though the formation of the electrode layer, whereby forming a structure wherein one or more of the second laminates are laminated on the first laminate, and each end of a plurality of the electrode layers protrude in an alternate manner from the high-dielectric constant layer;
- forming an oxidized film to cover the entirety of the capacitor;
- if necessary, performing a planarization treatment;
- if necessary, forming a barrier film and a pad;
- dicing both side surfaces of the capacitor such that each end of the electrode layers is exposed; and
- forming conductive materials on the both side surfaces where each end of the electrode layers is exposed, to electrically connect the laminated electrode layers with the pads at the upper side.

5. The method for manufacturing a thin-film capacitor according to claim 1, wherein the capacitor has a first laminate comprising the lower electrode layer, the high-dielectric-constant layer and the upper electrode layer which are sequentially laminated in this order, and one or more second laminates comprising the high-dielectric-constant layer and an electrode layer, one or more of the second laminates being laminated on the first laminate; the method comprising:
- forming the lower electrode layer and the high-dielectric-constant layer of the first laminate;
- removing by photolithographical etching a part of the high-dielectric-constant layer and the lower electrode layer, to shape one end of the lower electrode layer to protrude over the high-dielectric-constant layer;
- forming an oxidized film to cover the entirety of the capacitor;
- performing an etch-back treatment of the oxidized film until the high-dielectric-constant layer of the first laminate is exposed;
- forming the upper electrode layer of the first laminate on the high-dielectric-constant layer;
- forming the high-dielectric-constant layer of the second laminate;
- removing by photolithographical etching a part of the electrode layer and the high-dielectric-constant layer, to shape an end of the electrode layer, that is opposite to the protruding end of the lower electrode layer of the first laminate, to protrude over the high-dielectric-constant layer of the first laminate;
- if desired, repeating the steps from the formation of the oxidized film though the formation of the electrode layer, whereby forming a structure wherein one or more of the second laminates are laminated on the first laminate, and each end of a plurality of the electrode layers protrude in an alternate manner from the high-dielectric constant layer;
- forming an oxidized film to cover the entirety of the capacitor;
- if necessary, performing a planarization treatment;
- if necessary, forming a barrier film and a pad;
- performing a taper-etching treatment such that each end of the electrode layers is exposed; and
- forming conductive materials on the both side surfaces where each end of the electrode layers is exposed, to electrically connect the laminated electrode layers to the pads at the upper side.

6. The method for manufacturing a thin-film capacitor according to claim 4, wherein the conductive material comprises at least one selected from Pt, Al, Cu, Ru, and Ir.

7. The method for manufacturing a thin-film capacitor according to claim 3, wherein upon the etch-back treatment step, both of chemical and mechanical polishing is performed.

8. The method for manufacturing a thin-film capacitor according to claim 3, wherein sidewalls are formed by etch-back treatment step.

9. The method for manufacturing a thin-film capacitor according to claim 1, which is capable of being incorporated into a high-density packaging substrate, the method comprising:
- forming a high-dielectric-constant capacitor on an upper side of a support substrate; and
- thinning a back surface of the support substrate by mechanical and/or chemical polishing, wherein after the back surface of the support substrate is polished and film thinning is performed, the substrate is subjected to dicing to cut out separated thin-film capacitors.

10. The method for manufacturing a thin-film capacitor according to claim 5, wherein the conductive material comprises at least one selected from Pt, Al, Cu, Ru, and Ir.

11. The method for manufacturing a thin-film capacitor according to claim 1, wherein the support substrate is a silicon substrate having a thermally oxidized film formed thereon; and the method further comprising:
- a step of providing at least one silica-based insulating film on the upper side of the silicon substrate;
- a step of forming an adhesion layer comprising an oxide of tantalum or titanium on the silica-based insulating film; and
- a step of forming a high-dielectric-constant capacitor on the adhesion layer.

* * * * *